US012795912B2

(12) United States Patent
Yamazaki et al.

(10) Patent No.: US 12,795,912 B2
(45) Date of Patent: Nov. 10, 2026

(54) MEMORY DEVICE AND MANUFACTURING METHOD THEREOF

(71) Applicant: Semiconductor Energy Laboratory Co., Ltd., Atsugi (JP)

(72) Inventors: Shunpei Yamazaki, Setagaya (JP); Tetsuya Kakehata, Isehara (JP); Yasuhiro Jinbo, Isehara (JP); Yuji Egi, Atsugi (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 877 days.

(21) Appl. No.: 17/783,088

(22) PCT Filed: Dec. 15, 2020

(86) PCT No.: PCT/IB2020/061918

§ 371 (c)(1),
(2) Date: Jun. 7, 2022

(87) PCT Pub. No.: WO2021/130598

PCT Pub. Date: Jul. 1, 2021

(65) Prior Publication Data

US 2023/0051739 A1 Feb. 16, 2023

(30) Foreign Application Priority Data

Dec. 27, 2019 (JP) ................................ 2019-239259

(51) Int. Cl.
*H10B 41/35* (2023.01)
*G11C 16/04* (2006.01)
(Continued)

(52) U.S. Cl.
CPC ......... *H10B 41/35* (2023.02); *G11C 16/0483* (2013.01); *H10B 41/10* (2023.02);
(Continued)

(58) Field of Classification Search
None
See application file for complete search history.

(56) References Cited

U.S. PATENT DOCUMENTS

| | | | |
|---|---|---|---|
| 7,307,028 | B2 | 12/2007 | Goto et al. |
| 7,446,060 | B2 | 11/2008 | Goto et al. |

(Continued)

FOREIGN PATENT DOCUMENTS

| | | | |
|---|---|---|---|
| CN | 001570204 A | 1/2005 | |
| CN | 102263065 A | 11/2011 | |

(Continued)

OTHER PUBLICATIONS

International Search Report (Application No. PCT/IB2020/061918) Dated Mar. 16, 2021.

(Continued)

*Primary Examiner* — Sue A Purvis
*Assistant Examiner* — Carnell Hunter, III
(74) *Attorney, Agent, or Firm* — Eric J. Robinson; Robinson Intellectual Property Law Office, P.C.

(57) ABSTRACT

To provide a highly reliable memory device. A first insulator is formed over a substrate; a second insulator is formed over the first insulator; a third insulator is formed over the second insulator; an opening penetrating the first insulator, the second insulator, and the third insulator is formed; a fourth insulator is formed on the inner side of a side surface of the first insulator, a side surface of the second insulator, and a side surface of the third insulator, in the opening; an oxide semiconductor is formed on the inner side of the fourth insulator; the second insulator is removed; and a conductor is formed between the first insulator and the third insulator; and the fourth insulator is formed by performing, a plurality of times, a cycle including a first step of supplying a gas containing silicon and an oxidizing gas into a chamber (Continued)

where the substrate is placed, a second step of stopping the supply of the gas containing silicon into the chamber; and a third step of generating plasma containing the oxidizing gas in the chamber.

19 Claims, 51 Drawing Sheets

(51) Int. Cl.

| | |
|---|---|
| ***H10B 41/10*** | (2023.01) |
| ***H10B 41/27*** | (2023.01) |
| ***H10B 43/10*** | (2023.01) |
| ***H10B 43/27*** | (2023.01) |
| ***H10B 43/35*** | (2023.01) |
| ***H10D 30/67*** | (2025.01) |

(52) U.S. Cl.

CPC ............. *H10B 41/27* (2023.02); *H10B 43/10* (2023.02); *H10B 43/27* (2023.02); *H10B 43/35* (2023.02); *H10D 30/6755* (2025.01)

(56) References Cited

U.S. PATENT DOCUMENTS

| | | | | |
|---|---|---|---|---|
| 8,334,219 | B2 | 12/2012 | Lee et al. | |
| 8,455,940 | B2 | 6/2013 | Lee et al. | |
| 8,877,626 | B2 | 11/2014 | Lee et al. | |
| 9,443,987 | B2 | 9/2016 | Miyanaga et al. | |
| 9,634,097 | B2 | 4/2017 | Rabkin et al. | |
| 9,773,820 | B2 | 9/2017 | Okazaki et al. | |
| 9,911,853 | B2 | 3/2018 | Miyanaga et al. | |
| 9,947,801 | B2 | 4/2018 | Yamazaki et al. | |
| 10,304,864 | B2 | 5/2019 | Okazaki et al. | |
| 10,312,239 | B2 | 6/2019 | Tezuka et al. | |
| 10,355,136 | B2 | 7/2019 | Miyanaga et al. | |
| 10,505,051 | B2 | 12/2019 | Ito et al. | |
| 10,553,601 | B2 | 2/2020 | Tezuka et al. | |
| 10,600,469 | B2 | 3/2020 | Kimura et al. | |
| 10,643,839 | B2 | 5/2020 | Suzuki et al. | |
| 10,644,039 | B2 | 5/2020 | Okazaki et al. | |
| 10,839,883 | B2 | 11/2020 | Kimura et al. | |
| 10,886,412 | B2 | 1/2021 | Yamazaki | |
| 11,133,420 | B2 | 9/2021 | Iida et al. | |
| 11,211,408 | B2 | 12/2021 | Okazaki et al. | |
| 11,616,085 | B2 | 3/2023 | Okazaki et al. | |
| 11,901,372 | B2 | 2/2024 | Okazaki et al. | |
| 12,183,747 | B2 | 12/2024 | Okazaki et al. | |
| 2004/0209005 | A1 | 10/2004 | Goto et al. | |
| 2007/0020953 | A1* | 1/2007 | Tsai | C23C 16/50 257/E21.279 |
| 2007/0105402 | A1 | 5/2007 | Goto et al. | |
| 2011/0065270 | A1 | 3/2011 | Shim et al. | |
| 2011/0248970 | A1* | 10/2011 | Koyama | G09G 3/3426 345/204 |
| 2011/0287612 | A1 | 11/2011 | Lee et al. | |
| 2013/0252391 | A1 | 9/2013 | Lee et al. | |
| 2015/0053971 | A1 | 2/2015 | Miyanaga et al. | |
| 2015/0060993 | A1 | 3/2015 | Lee et al. | |
| 2015/0279857 | A1* | 10/2015 | Kim | H10B 43/27 438/269 |
| 2016/0351721 | A1 | 12/2016 | Miyanaga et al. | |
| 2017/0104090 | A1* | 4/2017 | Koezuka | H10D 30/6755 |
| 2018/0175210 | A1 | 6/2018 | Miyanaga et al. | |
| 2018/0374529 | A1* | 12/2018 | Kimura | G11C 11/404 |
| 2019/0181159 | A1* | 6/2019 | Suzawa | H10D 30/6755 |
| 2020/0105330 | A1 | 4/2020 | Kimura et al. | |
| 2020/0381556 | A1* | 12/2020 | Yamazaki | H10D 30/6734 |
| 2021/0074346 | A1 | 3/2021 | Kimura et al. | |
| 2021/0233769 | A1 | 7/2021 | Yamazaki et al. | |
| 2025/0126897 | A1 | 4/2025 | Okazaki et al. | |

FOREIGN PATENT DOCUMENTS

| | | | |
|---|---|---|---|
| JP | 2004-336019 | A | 11/2004 |
| JP | 2011-023718 | A | 2/2011 |
| JP | 2011-249803 | A | 12/2011 |
| JP | 2015-062223 | A | 4/2015 |
| JP | 2016-072633 | A | 5/2016 |
| JP | 2018-093150 | A | 6/2018 |
| JP | 2018-157205 | A | 10/2018 |
| JP | 2018-207038 | A | 12/2018 |
| JP | 2019-008862 | A | 1/2019 |
| JP | 2019-009472 | A | 1/2019 |
| KR | 2004-0090903 | A | 10/2004 |
| KR | 2011-0128717 | A | 11/2011 |
| KR | 2015-0022684 | A | 3/2015 |
| WO | WO-2019/130161 | | 7/2019 |

OTHER PUBLICATIONS

Written Opinion (Application No. PCT/IB2020/061918) Dated Mar. 16, 2021.

Kimizuka.N et al., “2.4.4 Discussion on Growth Mechanism”, Physics and Technology of Crystalline Oxide Semiconductor CAAC-IGZO: Fundamentals, Sep. 15, 2016, pp. 94-97, WILEY.

Murata.T et al., “Low-Temperature Silicon Oxide Offset Spacer Using Plasma-Enhanced Atomic Layer Deposition for High-k/Metal Gate Transistor”, Jpn. J. Appl. Phys. (Japanese Journal of Applied Physics) , Apr. 25, 2010, vol. 49, No. 4, pp. 04DB11-1-04DB11-5.

* cited by examiner

FIG. 9A
Intermediate state
New boundary region
| Amorphous | Crystalline | Crystal |
| --- | --- | --- |
| ·completely amorphous | ·CAAC<br>·nc<br>·CAC<br>excluding single crystal and poly crystal | ·single crystal<br>·poly crystal |
FIG. 9B
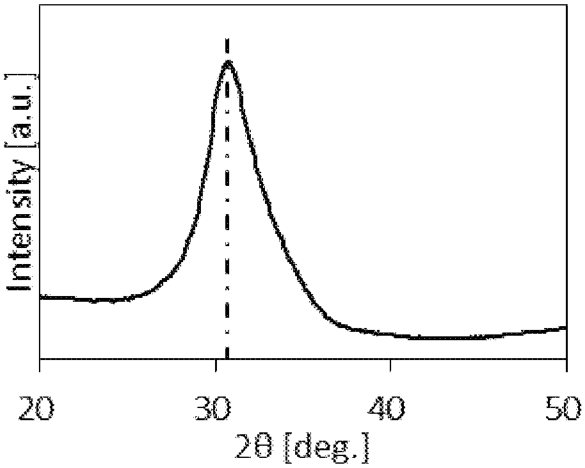
FIG. 9C
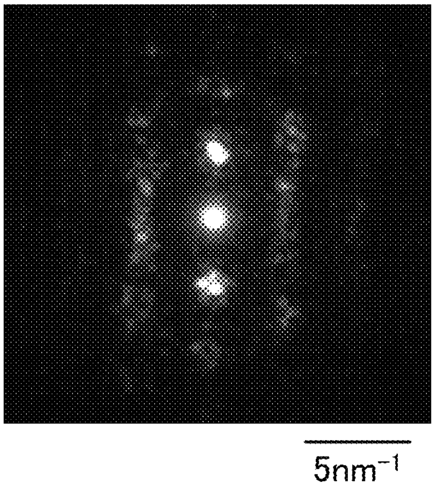

4000

MEMORY DEVICE AND MANUFACTURING METHOD THEREOF

TECHNICAL FIELD

One embodiment of the present invention relates to a semiconductor device and a manufacturing method thereof.

Note that one embodiment of the present invention is not limited to the above technical field. The technical field of the invention disclosed in this specification and the like relates to an object, a method, or a manufacturing method. One embodiment of the present invention relates to a process, a machine, manufacture, or a composition of matter.

Note that in this specification and the like, a semiconductor device generally means a device that can function by utilizing semiconductor characteristics. Thus, a semiconductor element such as a transistor or a diode and a circuit including a semiconductor element are semiconductor devices. A display device, a light-emitting device, a lighting device, an electro-optical device, a memory device, an imaging device, a communication device, a data processing device, an electronic device, and the like may include a semiconductor element or a semiconductor circuit. A display device, a light-emitting device, a lighting device, an electro-optical device, a memory device, an imaging device, a communication device, an electronic device, and the like may be referred to as a semiconductor device. One embodiment of the present invention particularly relates to a memory device and a manufacturing method thereof.

BACKGROUND ART

In recent years, with an increasing amount of data to process, a semiconductor device having a larger storage capacity has been required. To increase storage capacity per unit area, stacking memory cells is effective (see Patent Document 1 and Patent Document 2). Stacking memory cells can increase storage capacity per unit area in accordance with the number of stacked memory cells. Patent Document 3 and Patent Document 4 disclose memory devices that use an oxide semiconductor. Patent Document 5 discloses a semiconductor memory that uses an oxide semiconductor as a charge storage layer.

Non-patent Document 1 discloses a CAAC-IGZO as a crystalline oxide semiconductor. Non-patent Document 1 also discloses the growth mechanism and the like of the CAAC-IGZO.

REFERENCE

Patent Document

[Patent Document 1] United States Patent Application Publication No. 2011/0065270A1

[Patent Document 2] U.S. Pat. No. 9,634,097B2

[Patent Document 3] Japanese Published Patent Application No. 2018-207038

[Patent Document 4] Japanese Published Patent Application No. 2019-8862

[Patent Document 5] Japanese Published Patent Application No. 2018-157205

Non-Patent Document

[Non-Patent Document 1] Noboru Kimizuka and Shunpei Yamazaki, "PHYSICS AND TECHNOLOGY OF CRYSTALLINE OXIDE SEMICONDUCTOR CAAC-IGZO" FUNDAMENTALS (the United States), Wiley-SID Series in Display Technology, 2017, pp. 94-97

SUMMARY OF THE INVENTION

Problems to be Solved by the Invention

In Patent Document 1 and Patent Document 2, a plurality of memory elements (also referred to as memory cells) are stacked and connected in series, so that a three-dimensional memory cell array (also referred to as a memory string) is formed.

In Patent Document 1, a semiconductor provided in a columnar shape is in contact with an insulator including a charge accumulation layer. In Patent Document 2, a semiconductor provided in a columnar shape is in contact with an insulator functioning as a tunnel dielectric. In both Patent Document 1 and Patent Document 2, writing of data to the memory cells is performed by extraction and injection of charge through the insulator. In this case, trap centers might be formed at the interface where the semiconductor and the insulator are in contact with each other. The trap centers can shift the threshold voltage of the transistor by trapping electrons, in some cases. In addition, one or both of the inside of the insulator and the interface where the semiconductor and the insulator are in contact with each other deteriorate due to the extraction and injection of charge, resulting in the leakage and loss of charge held in the charge accumulation layer in some cases. This can adversely affect the reliability of the memory device.

In view of the above, an object of one embodiment of the present invention is to provide an insulator in which formation of trap centers is inhibited at the interface with a semiconductor and a method for forming the insulator. Another object of one embodiment of the present invention is to provide a memory device in which charge can be extracted and injected without through an insulator when data is written to a memory cell and a method for manufacturing the memory device.

Another object of one embodiment of the present invention is to provide a highly reliable memory device. Another object of one embodiment of the present invention is to provide a memory device with a large storage capacity. Another object of one embodiment of the present invention is to provide a memory device that occupies a small area. Another object of one embodiment of the present invention is to provide a memory device with low manufacturing cost. Another object of one embodiment of the present invention is to provide a highly reliable semiconductor device. Another object of one embodiment of the present invention is to provide a semiconductor device with low manufacturing cost. Another object of one embodiment of the present invention is to provide a novel semiconductor device.

Note that the description of these objects does not preclude the existence of other objects. One embodiment of the present invention does not need to achieve all the objects. Other objects will be apparent from and can be derived from the description of the specification, the drawings, the claims, and the like.

Means for Solving the Problems

One embodiment of the present invention is a method for manufacturing a memory device, which includes a step of forming a first insulator over a substrate, a step of forming a second insulator over the first insulator, a step of forming a third insulator over the second insulator, a step of forming an opening penetrating the first insulator, the second insulator, and the third insulator, a step of forming, in the opening, a fourth insulator covering a side surface of the first insulator, a side surface of the second insulator, and a side surface of the third insulator, a step of forming an oxide semiconductor adjacent to the fourth insulator, a step of removing the second insulator, and a step of forming a conductor between the first insulator and the third insulator. The fourth insulator is formed by performing, a plurality of times, a cycle including a first step of supplying a gas containing silicon and an oxidizing gas into a chamber where the substrate is placed, a second step of stopping the supply of the gas containing silicon into the chamber, and a third step of generating plasma containing the oxidizing gas in the chamber.

In the above embodiment, the gas containing silicon is preferably $SiH_4$.

In the above embodiment, the oxidizing gas is preferably $N_2O$.

In the above first step, He is preferably supplied into the chamber.

In the above embodiment, the oxide semiconductor preferably contains indium, an element M (the element M is one or more selected from aluminum, gallium, yttrium, tin, and titanium), and zinc.

In the above embodiment, the oxide semiconductor preferably has crystallinity.

In the above embodiment, the oxide semiconductor preferably includes a region where the c-axis is aligned with the direction normal to a side surface of the conductor, in the opening.

In the above embodiment, the fourth insulator preferably includes a region with a nitrogen concentration of higher than or equal to $3\times10^{19}$ atoms/cm$^3$ and lower than or equal to $1\times10^{21}$ atoms/cm$^3$.

In the above embodiment, the fourth insulator preferably includes a region with a carbon concentration of higher than or equal to $1\times10^{18}$ atoms/cm$^3$ and lower than or equal to $5\times10^{20}$ atoms/cm$^3$.

One embodiment of the present invention is a method for manufacturing a memory device, which includes a step of forming a first insulator over a substrate, a step of forming a first conductor over the first insulator, a step of forming a second insulator over the first conductor, a step of forming a third insulator over the second insulator, a step of forming a fourth insulator over the third insulator, a step of forming an opening penetrating the first insulator, the first conductor, the second insulator, the third insulator, and the fourth insulator, a step of forming, in the opening, a fifth insulator covering a side surface of the first insulator, a side surface of the first conductor, a side surface of the second insulator, a side surface of the third insulator, and a side surface of the fourth insulator, a step of forming an oxide semiconductor adjacent to the fifth insulator, a step of removing the third insulator, and a step of forming a second conductor between the second insulator and the fourth insulator. The fifth insulator is formed by performing, a plurality of times, a cycle including a first step of supplying a gas containing silicon and an oxidizing gas into a chamber where the substrate is placed, a second step of stopping the supply of the gas containing silicon into the chamber, and a third step of generating plasma containing the oxidizing gas in the chamber.

In the above embodiment, the gas containing silicon is preferably $SiH_4$.

In the above embodiment, the oxidizing gas is preferably $N_2O$.

In the above first step, He is preferably supplied into the chamber.

In the above embodiment, the oxide semiconductor preferably contains indium, an element M (the element M is one or more selected from aluminum, gallium, yttrium, tin, and titanium), and zinc.

In the above embodiment, the oxide semiconductor preferably has crystallinity.

In the above embodiment, the oxide semiconductor preferably includes a region where the c-axis is aligned with the direction normal to a side surface of at least one of the first conductor and the second conductor, in the opening.

In the above embodiment, the fifth insulator preferably includes a region with a nitrogen concentration of higher than or equal to $3\times10^{19}$ atoms/cm$^3$ and lower than or equal to $1\times10^{21}$ atoms/cm$^3$.

In the above embodiment, the fifth insulator preferably includes a region with a carbon concentration of higher than or equal to $1\times10^{18}$ atoms/cm$^3$ and lower than or equal to $5\times10^{20}$ atoms/cm$^3$.

One embodiment of the present invention is a memory device including a first insulator including a first opening, a conductor including a second opening over the first insulator, a second insulator including a third opening over the conductor, a third insulator on a side surface of the first opening, a side surface of the second opening, and a side surface of the third opening, and an oxide semiconductor provided over the side surface of the first opening, the side surface of the second opening, and the side surface of the third opening with the third insulator therebetween. The third insulator includes a region with a nitrogen concentration of higher than or equal to $3\times10^{19}$ atoms/cm$^3$ and lower than or equal to $1\times10^{21}$ atoms/cm$^3$ and a region with a carbon concentration of higher than or equal to $1\times10^{18}$ atoms/cm$^3$ and lower than or equal to $5\times10^{20}$ atoms/cm$^3$.

In the above embodiment, the oxide semiconductor preferably contains indium, an element M (the element M is one or more selected from aluminum, gallium, yttrium, tin, and titanium), and zinc.

In the above embodiment, the third insulator preferably includes a region with an indium concentration of lower than or equal to $1.0\times10^{19}$ atoms/cm$^3$.

In the above embodiment, the oxide semiconductor preferably has crystallinity.

In the above embodiment, the oxide semiconductor preferably includes a region where the c-axis is aligned with the direction normal to a side surface of the conductor, in the second opening.

In the above embodiment, the diameter of the second opening is preferably larger than the diameter of the first opening and the diameter of the third opening.

In the above embodiment, the diameter of the second opening is preferably smaller than the diameter of the first opening and the diameter of the third opening.

Effect of the Invention

In manufacture of a three-dimensional memory cell array in which a plurality of memory elements are stacked and connected in series, the total number of steps can be smaller than the product of the number of stacked memory elements and the number of steps for manufacturing one memory element, which is preferable. This means that, the number of manufacturing steps of the memory cell array is not proportional to the number of stacked memory elements. For example, when the number of manufacturing steps of a memory cell array B including 32 layers of memory elements is compared with the number of manufacturing steps of a memory cell array A including 4 layers of memory elements, the number of manufacturing steps of the memory cell array B can be significantly smaller than eight times the number of manufacturing steps of the memory cell array A in spite of the number of stacked memory elements eight times larger.

One embodiment of the present invention can provide a highly reliable memory device. One embodiment of the present invention can provide a memory device with a large storage capacity. One embodiment of the present invention can provide a memory device that occupies a small area. One embodiment of the present invention can provide a memory device with low manufacturing cost. One embodiment of the present invention can provide a highly reliable semiconductor device. One embodiment of the present invention can provide a semiconductor device with low manufacturing cost. One embodiment of the present invention can provide a novel semiconductor device.

Note that the description of these effects does not preclude the existence of other effects. One embodiment of the present invention does not have to have all these effects. Other effects will be apparent from and can be derived from the description of the specification, the drawings, the claims, and the like.

BRIEF DESCRIPTION OF THE DRAWINGS

FIG. 9A is a diagram showing the classification of crystal structures of IGZO. FIG. 9B is a diagram showing an XRD spectrum of a CAAC-IGZO film. FIG. 9C is an image showing a nanobeam electron diffraction pattern of a CAAC-IGZO film.

MODE FOR CARRYING OUT THE INVENTION

Figure 1:
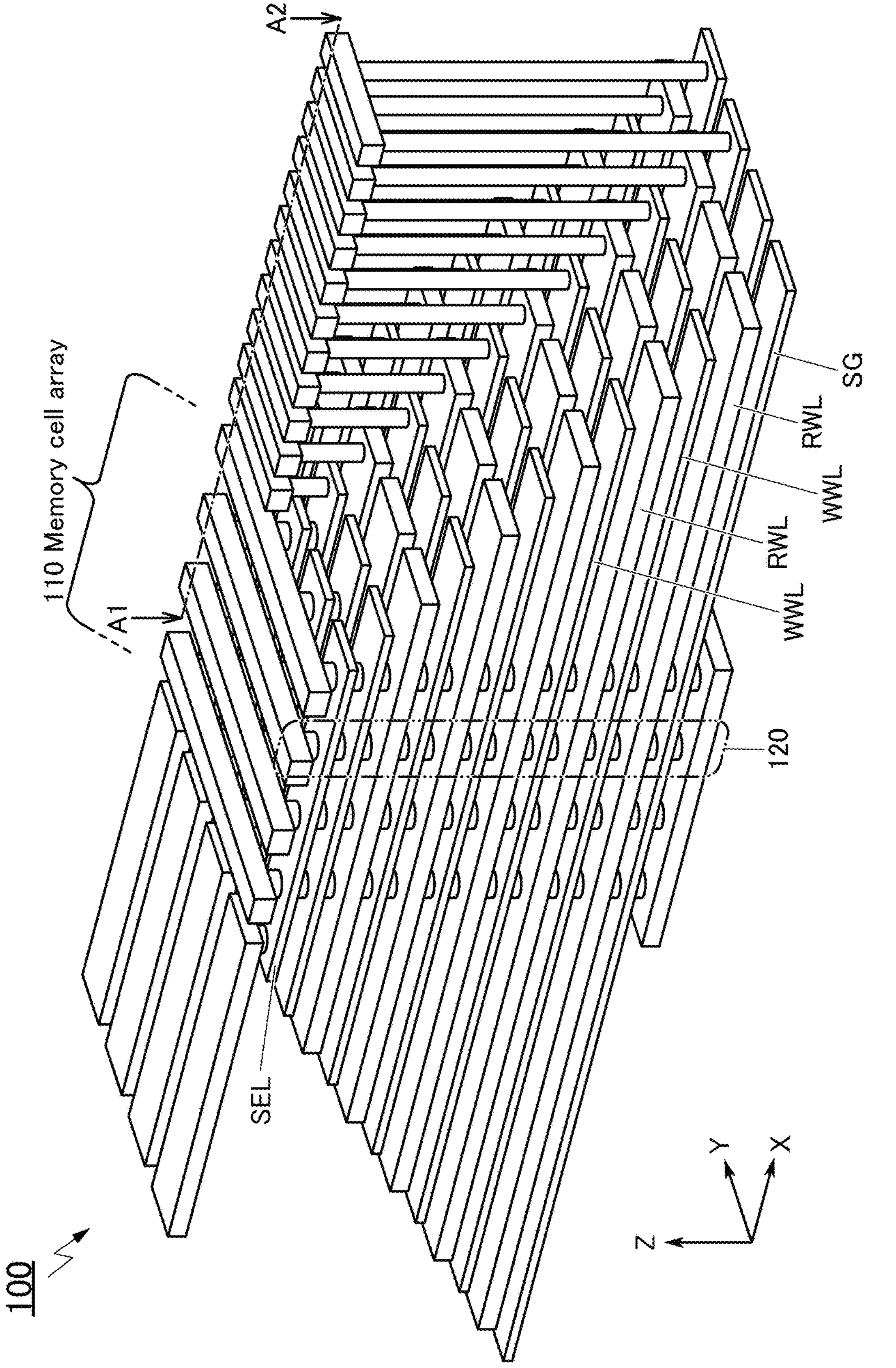
FIG. 1 is a perspective view of a memory device.

Embodiments are described in detail with reference to the drawings. However, the present invention is not limited to the following description, and it is readily appreciated by those skilled in the art that modes and details can be modified in various ways without departing from the spirit and the scope of the present invention. Thus, the present invention should not be construed as being limited to the description in the following embodiments. Note that in the structures of the invention described below, the same portions or portions having similar functions are denoted by the same reference numerals in different drawings, and description thereof is not repeated.

In addition, the position, size, range, and the like of each component illustrated in the drawings and the like do not represent the actual position, size, range, and the like in some cases for easy understanding of the invention. Therefore, the disclosed invention is not necessarily limited to the position, size, range, or the like disclosed in drawings and the like. For example, in an actual manufacturing process, a resist mask or the like might be unintentionally reduced in size by treatment such as etching, which might not be reflected in the drawings for easy understanding.

In drawings and the like, some components are omitted for easy understanding of the explanation, in some cases.

In addition, in this specification and the like, the terms "electrode" and "wiring" do not functionally limit these components. For example, an "electrode" is used as part of a "wiring" in some cases, and vice versa. Furthermore, the term "electrode" or "wiring" also includes the case where a plurality of "electrodes" or "wirings" are formed in an integrated manner, for example.

In this specification and the like, a "terminal" in an electric circuit refers to a portion that inputs or outputs a current, inputs or outputs a voltage, or receives or transmits a signal. Accordingly, part of a wiring or an electrode functions as a terminal in some cases.

Note that the term "over" or "under" in this specification and the like does not necessarily mean that a component is placed directly over and in contact with or directly under and in contact with another component. For example, the expression "electrode B over insulating layer A" does not necessarily mean that the electrode B is formed on and in direct contact with the insulating layer A, and does not exclude the case where another component is provided between the insulating layer A and the electrode B.

In addition, the term "overlap", for example, in this specification and the like does not limit a state such as the stacking order of components. For example, the expression "electrode B overlapping with insulating layer A" does not necessarily mean the state where "electrode B is formed over insulating layer A", and does not exclude the state where "electrode B is formed under insulating layer A" and the state where "electrode B is formed on the right side (or the left side) of insulating layer A".

The term "adjacent" or "proximity" in this specification and the like does not necessarily mean that a component is directly in contact with another component. For example, the expression "electrode B adjacent to insulating layer A" does not necessarily mean that the electrode B is formed in direct contact with the insulating layer A and does not exclude the case where another component is provided between the insulating layer A and the electrode B.

In addition, functions of a source and a drain are interchanged with each other depending on operation conditions and the like, for example, when a transistor of different polarity is employed or when the current direction is changed in a circuit operation; therefore, it is difficult to define which is the source or the drain. Thus, the terms "source" and "drain" can be interchangeably used in this specification.

In this specification and the like, the expression "electrically connected" includes the case where components are directly connected to each other and the case where components are connected through an "object having any electric function". Here, there is no particular limitation on the "object having any electric function" as long as electric signals can be transmitted and received between components that are connected through the object. Thus, even when the expression "electrically connected" is used, there is a case where no physical connection portion is made and a wiring is just extended in an actual circuit.

Furthermore, in this specification and the like, "parallel" indicates a state where two straight lines are placed at an angle of greater than or equal to −10° and less than or equal to 10°, for example. Accordingly, the case where the angle is greater than or equal to −5° and less than or equal to 5° is also included. Moreover, "perpendicular" and "orthogonal" indicate a state where two straight lines are placed at an angle of greater than or equal to 80° and less than or equal to 100°, for example. Accordingly, the case where the angle is greater than or equal to 85° and less than or equal to 95° is also included.

In this specification and the like, the terms "identical," "same," "equal," "uniform," and the like used in describing calculation values and measurement values or in describing objects, methods, events, and the like that can be converted into calculation values or measurement values allow for a margin of error of ±20% unless otherwise specified.

In addition, a voltage refers to a potential difference between a certain potential and a reference potential (e.g., a ground potential or a source potential) in many cases. Therefore, the terms "voltage" and "potential" can be replaced with each other in many cases. In this specification and the like, the terms "voltage" and "potential" can be replaced with each other unless otherwise specified.

Note that a "semiconductor" has characteristics of an "insulator" when conductivity is sufficiently low, for example. Thus, a "semiconductor" can be replaced with an "insulator". In that case, a "semiconductor" and an "insulator" cannot be strictly distinguished from each other because a border therebetween is not clear. Accordingly, a "semiconductor" and an "insulator" described in this specification can be replaced with each other in some cases.

Furthermore, a "semiconductor" has characteristics of a "conductor" when conductivity is sufficiently high, for example. Thus, a "semiconductor" can be replaced with a "conductor". In that case, a "semiconductor" and a "conductor" cannot be strictly distinguished from each other because a border therebetween is not clear. Accordingly, a "semiconductor" and a "conductor" in this specification can be replaced with each other in some cases.

Note that ordinal numbers such as "first" and "second" in this specification and the like are used in order to avoid confusion among components and do not denote the priority or the order such as the order of steps or the stacking order. A term without an ordinal number in this specification and the like might be provided with an ordinal number in the scope of claims in order to avoid confusion among components. Furthermore, a term with an ordinal number in this specification and the like might be provided with a different ordinal number in the scope of claims. Furthermore, even when a term is provided with an ordinal number in this specification and the like, the ordinal number might be omitted in the scope of claims and the like.

Note that in this specification and the like, an "on state" of a transistor refers to a state in which a source and a drain of the transistor are electrically short-circuited (also referred to as a "conduction state"). Furthermore, an "off state" of the transistor refers to a state in which the source and the drain of the transistor are electrically disconnected (also referred to as a "non-conduction state").

In addition, in this specification and the like, an "on-state current" sometimes refers to a current that flows between a source and a drain when a transistor is in an on state. Furthermore, an "off-state current" sometimes refers to a current that flows between a source and a drain when a transistor is in an off state.

In this specification and the like, a high power supply potential VDD (hereinafter, also simply referred to as "VDD", "H potential", or "H") is a power supply potential higher than a low power supply potential VSS (hereinafter, also simply referred to as "VSS", "L potential", or "L"). VSS refers to a power supply potential at a potential lower than VDD. A ground potential (hereinafter, also simply referred to as "GND" or "GND potential") can be used as VDD or VSS. For example, in the case where VDD is a ground potential, VSS is a potential lower than the ground potential, and in the case where VSS is a ground potential, VDD is a potential higher than the ground potential.

Unless otherwise specified, transistors described in this specification and the like are enhancement (normally-off) n-channel field-effect transistors. Thus, the threshold voltage (also referred to as "Vth") is higher than 0 V. Furthermore, unless otherwise specified, "an H potential is supplied to a gate of a transistor" means that "the transistor is brought into an on state" in some cases. Also, unless otherwise specified, "an L potential is supplied to a gate of a transistor" means that "the transistor is brought into an off state" in some cases.

In addition, in this specification and the like, a gate refers to part or the whole of a gate electrode and a gate wiring. A gate wiring refers to a wiring for electrically connecting at least one gate electrode of a transistor to another electrode or another wiring.

Furthermore, in this specification and the like, a source refers to part or the whole of a source region, a source electrode, or a source wiring. A source region refers to a region in a semiconductor layer, where the resistivity is lower than or equal to a given value. A source electrode refers to part of a conductive layer that is connected to a source region. A source wiring refers to a wiring for electrically connecting at least one source electrode of a transistor to another electrode or another wiring.

Moreover, in this specification and the like, a drain refers to part or the whole of a drain region, a drain electrode, or a drain wiring. A drain region refers to a region in a semiconductor layer, where the resistivity is lower than or equal to a given value. A drain electrode refers to part of a conductive layer that is connected to a drain region. A drain wiring refers to a wiring for electrically connecting at least one drain electrode of a transistor to another electrode or another wiring.

In the drawings and the like, for easy understanding of the potentials of a wiring, an electrode and the like, "H" representing an H potential or "L" representing an L potential is sometimes written near the wiring, the electrode, and the like. In addition, enclosed "H" or "L" is sometimes written near a wiring, an electrode, and the like whose potential changes. Moreover, a symbol "x" is sometimes written on a transistor in an off state.

In general, a "capacitor" has a structure in which two electrodes face each other with an insulator (dielectric) therebetween. This specification and the like include a case where a "capacitor element" is the above-described "capacitor." That is, this specification and the like include cases where a "capacitor element" is one having a structure in which two electrodes face each other with an insulator therebetween, one having a structure in which two wirings face each other with an insulator therebetween, or one in which two wirings are positioned with an insulator therebetween.

In this specification and the like, when a plurality of components are denoted by the same reference numeral and, in particular, need to be distinguished from each other, an identification sign such as "_1," "_2," "[n]", or "[m,n]" is sometimes added to the reference numeral. For example, the second conductor WWL may be expressed as a conductor WWL[2].

Embodiment 1

Figure 2:
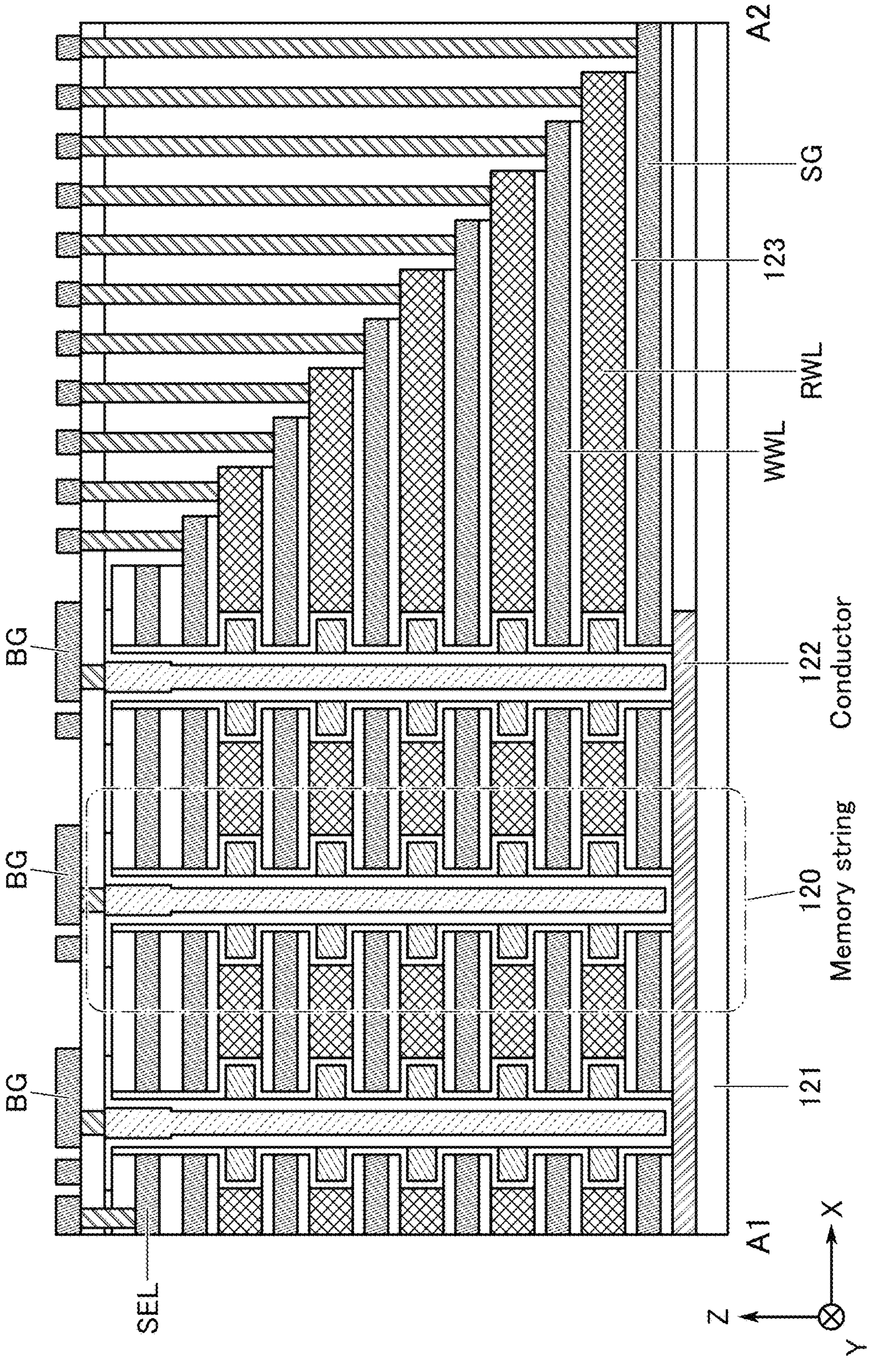
FIG. 2 is a cross-sectional view of a memory device.

FIG. 1 is a perspective view of a memory device 100 of one embodiment of the present invention. The memory device 100 is a memory device having a three-dimensional stacked-layer structure. FIG. 2 is a cross-sectional view of a portion A1-A2 indicated by a dashed-dotted line in FIG. 1 and a connection portion between a conductor SEL and a wiring. Note that arrows indicating the X direction, the Y direction, and the Z direction are illustrated in some drawings such as FIG. 1. The X direction, the Y direction, and the Z direction are directions orthogonal to each other. In this specification and the like, one of the X direction, the Y direction, and the Z direction may be referred to as "first direction." Another one of the directions may be referred to as "second direction." Furthermore, the remaining one of the directions may be referred to as "third direction." Note that in this embodiment and the like, the direction in which a conductor 130 described later extends is defined as the Z direction.

FIG. 2 illustrates a cross section along the X-Z plane. As described above, some components may be omitted in FIG. 1, FIG. 2, and the like for easy understanding of the explanation.

<Structure Example of Memory Device>

The memory device 100 of one embodiment of the present invention includes a memory cell array 110. The memory cell array 110 includes a plurality of memory strings 120. The memory strings 120 extend in the Z direction and are arranged in a matrix on the XY plane.

Figure 3:
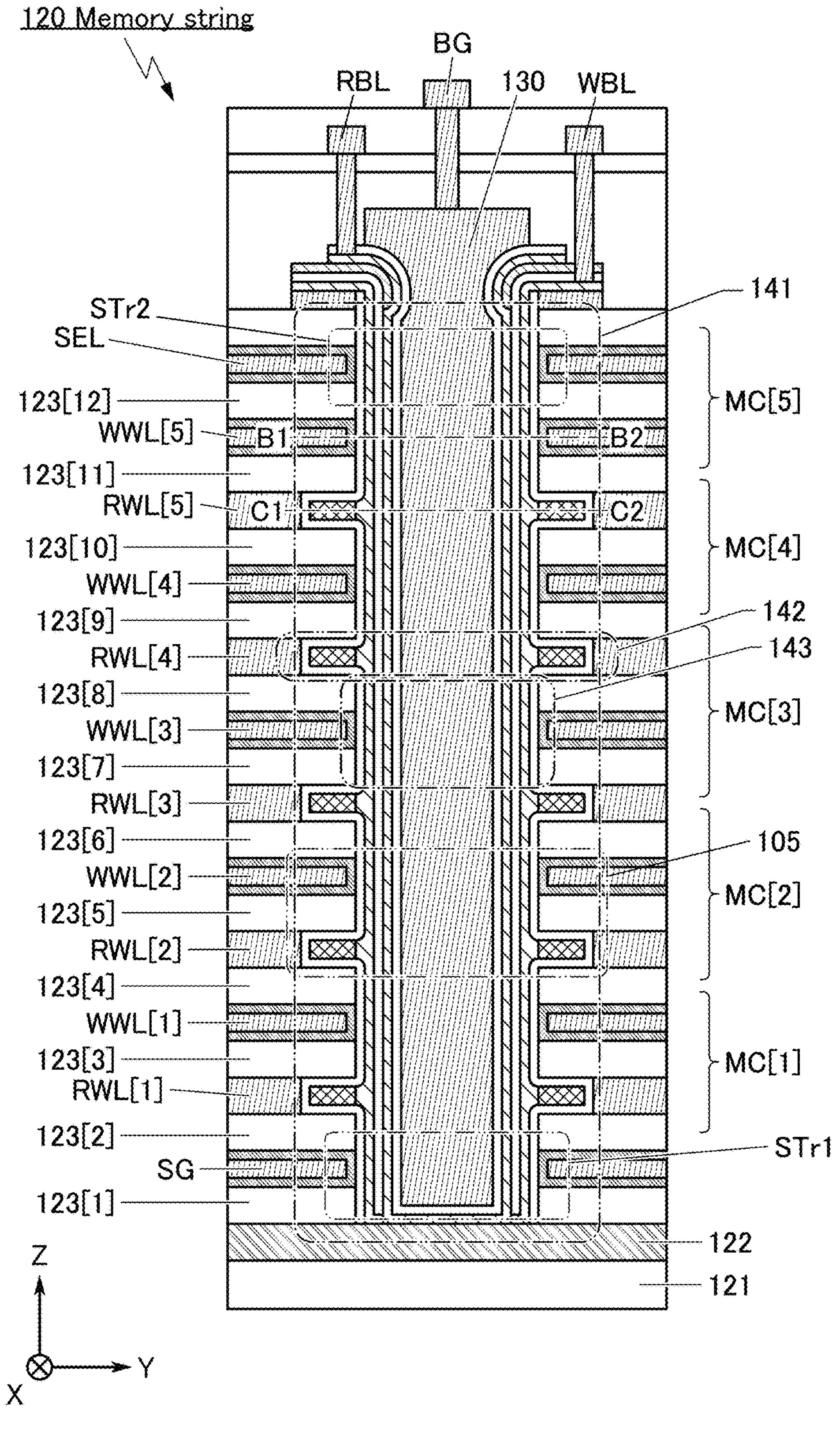
FIG. 3 is a cross-sectional view of a memory string.

FIG. 3 illustrates a cross-sectional structure example of the memory string 120 of one embodiment of the present invention. The memory string 120 has a structure in which a plurality of memory elements MC (also referred to as "memory cells") are connected in series. Although the case where five memory elements MC are connected in series is described in this embodiment, the number of memory elements MC provided in the memory string 120 is not limited to five. Given that the number of memory elements MC provided in the memory string 120 is n, n is an integer of 2 or more.

Furthermore, the memory string 120 includes a plurality of conductors WWL, a plurality of conductors RWL, a conductor SG, and a conductor SEL. The plurality of conductors WWL and the plurality of conductors RWL are alternately stacked and separated by insulators 123. The conductor SG is provided in a layer below the plurality of conductors WWL and the plurality of conductors RWL. The conductor SEL is provided in a layer above the plurality of conductors WWL and the plurality of conductors RWL.

FIG. 3 illustrates the five memory elements MC as a memory element MC[1] to a memory element MC[5]. When explaining a matter common to the memory element MC[1] to the memory element MC[5], the memory elements are simply referred to as the "memory element(s) MC." The same applies to the other components such as the conductors WWL, the conductors RWL, and the insulators 123.

The memory string 120 includes a transistor STr1 connected to the memory element MC[1] and a transistor STr2 connected to the memory element MC[5].

The conductors WWL, the conductors RWL, the conductor SG, and the conductor SEL extend beyond the memory cell array 110. Furthermore, the conductors WWL, the conductors RWL, the conductor SG, and the conductor SEL are stacked stepwise outside the memory cell array 110 (see FIG. 1 and FIG. 2).

Figure 4A:
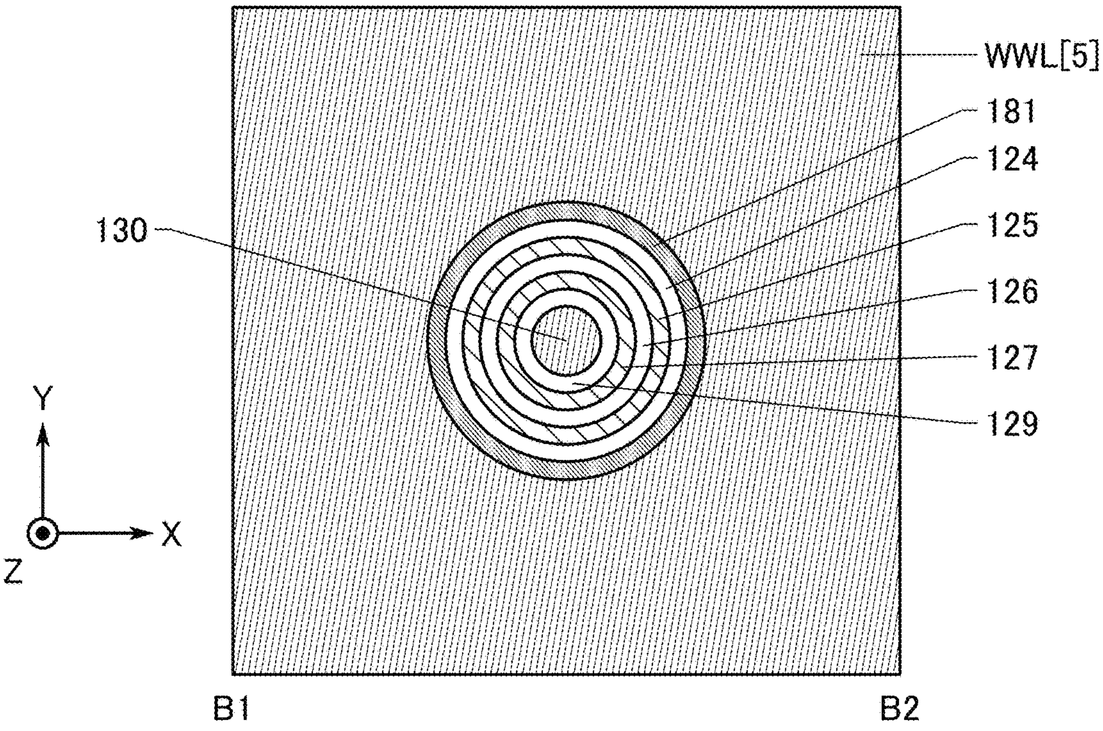
FIG. 4A and FIG. 4B are cross-sectional views of a memory string.
Figure 4B:
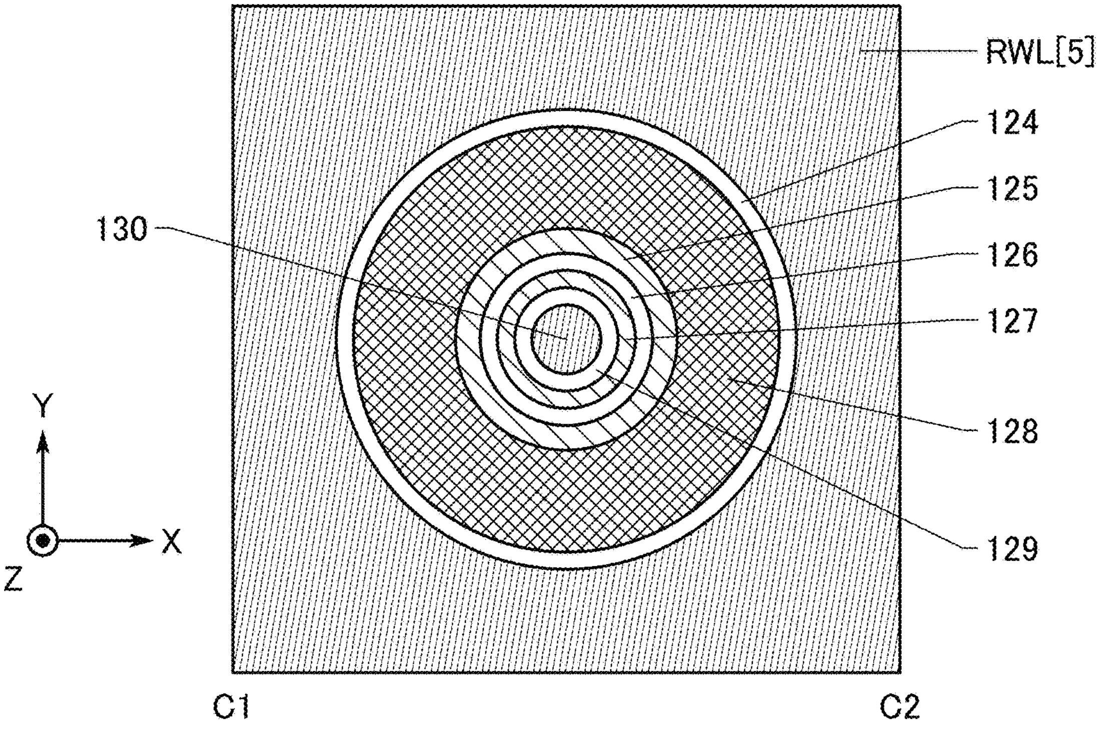
Figure 5A:
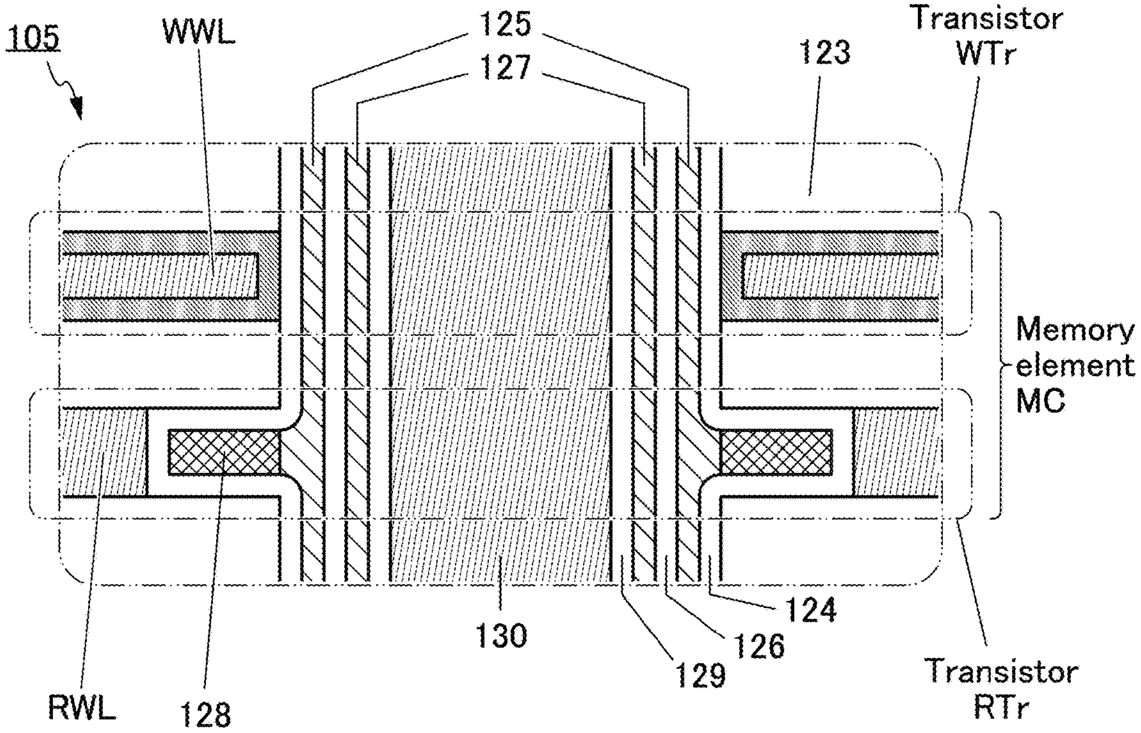
FIG. 5A and FIG. 5B are each a cross-sectional view of a memory element.

FIG. 4A illustrates a cross section of a portion B1-B2 indicated by a dashed-dotted line in FIG. 3 when seen from the Z direction. FIG. 4B illustrates a cross section of a portion C1-C2 indicated by a dashed-dotted line in FIG. 3 when seen from the Z direction. FIG. 5A is an enlarged diagram of a region 105 indicated by a dashed double-dotted line in FIG. 3. FIG. 5A corresponds to a cross-sectional view of the memory element MC.

The memory string 120 includes a conductor 122 over a substrate 121. As the substrate 121, an insulator is used, for example. In addition, an insulator 123[1], the conductor SG, an insulator 123[2], a conductor RWL[1], an insulator 123[3], a conductor WWL[1], an insulator 123[4], a conductor RWL[2], an insulator 123[5], a conductor WWL[2], an insulator 123[6], a conductor RWL[3], an insulator 123[7], a conductor WWL[3], an insulator 123[8], a conductor RWL[4], an insulator 123[9], a conductor WWL[4], an insulator 123[10], a conductor RWL[5], an insulator 123[11], a conductor WWL[5], an insulator 123[12], and the conductor SEL are included over the conductor 122 (see FIG. 3).

Furthermore, the memory string 120 includes an opening 141 which is formed by removing part of each of the insulator 123[1], the conductor SG, the insulator 123[2], the conductor RWL[1], the insulator 123[3], the conductor WWL[1], the insulator 123[4], the conductor RWL[2], the insulator 123[5], the conductor WWL[2], the insulator 123 [6], the conductor RWL[3], the insulator 123[7], the conductor WWL[3], the insulator 123[8], the conductor RWL [4], the insulator 123[9], the conductor WWL[4], the insulator 123[10], the conductor RWL[5], the insulator 123[11], the conductor WWL[5], the insulator 123[12], and the conductor SEL.

The opening 141 extends in the Z direction and reaches the conductor 122. In the opening 141, the diameter of a region 142 overlapping with the conductor RWL is larger than the diameter of a region 143 overlapping with the conductor WWL. Thus, a side surface of the opening 141 has projections and depressions.

An insulator 124 and a semiconductor 125 are provided along the side surface of the opening 141. Furthermore, in a region overlapping with the conductor RWL in the opening 141, a conductor 128 is provided between the insulator 124 and the semiconductor 125. The semiconductor 125 includes a region overlapping with the side surface of the opening 141 with the insulator 124 therebetween.

Furthermore, the memory string 120 includes a conductor 130 extending in the Z direction. The conductor 130 is provided in or in the vicinity of the center of the opening 141. A region of the conductor 130 overlapping with the side surface of the opening 141 is provided with an insulator 129, a semiconductor 127, and an insulator 126. The semiconductor 127 includes a region overlapping with a side surface of the conductor 130 with the insulator 129 therebetween. The insulator 126 includes a region overlapping with the side surface of the conductor 130 with the insulator 129 and the semiconductor 127 therebetween. In a bottom portion of the opening 141, the semiconductor 125 and the semiconductor 127 each include a region electrically connected to the conductor 122. In the bottom portion of the opening 141, the conductor 130 includes a region overlapping with the conductor 122 with the insulator 129 and the semiconductor 127 therebetween.

Between the conductor WWL and the conductor 130, an insulator 181, the insulator 124, the semiconductor 125, the insulator 126, the semiconductor 127, and the insulator 129 are provided in this order from the conductor WWL side (see FIG. 4A). Between the conductor RWL and the conductor 130, the insulator 124, the conductor 128, the semiconductor 125, the insulator 126, the semiconductor 127, and the insulator 129 are provided in this order from the conductor RWL side (see FIG. 4B).

The memory element MC includes a transistor WTr and a transistor RTr (see FIG. 5A). A region where the conductor WWL and the conductor 130 overlap with each other functions as the transistor WTr. The conductor WWL functions as a gate electrode of the transistor WTr, and the conductor 130 functions as a back gate electrode of the transistor WTr. Part of the semiconductor 125 functions as a semiconductor layer where a channel of the transistor WTr is formed. The semiconductor layer where the channel of the transistor WTr is formed overlaps with the gate electrode (the conductor WWL) with part of the insulator 124 therebetween. Note that although part of the conductor WWL functions as the gate electrode in the example described in this embodiment and the like, the gate electrode and the conductor WWL may be provided independently and they may be electrically connected to each other.

A region where the conductor 128, the conductor RWL, and the conductor 130 overlap with one another functions as the transistor RTr. The conductor RWL functions as a gate electrode of the transistor RTr. The conductor 130 functions as a back gate electrode of the transistor RTr. Part of the semiconductor 127 functions as a semiconductor layer where a channel of the transistor RTr is formed. The semiconductor layer where the channel of the transistor RTr is formed overlaps with the gate electrode (the conductor RWL) with part of each of the insulator 126, the semiconductor 125, the conductor 128, and the insulator 124 therebetween. The semiconductor layer where the channel of the transistor RTr is formed overlaps with the back gate electrode (the conductor 130) with part of the insulator 129 therebetween.

The transistor STr1 includes the conductor SG, the semiconductor 125, and the semiconductor 127. The transistor STr2 includes the conductor SEL, the semiconductor 125, and the semiconductor 127.

Here, a back gate is described. A gate and a back gate are positioned so as to overlap with each other with a channel formation region of a semiconductor layer therebetween. The back gate can function like the gate. By changing the potential of the back gate, the threshold voltage of the transistor can be changed. One of the gate and the back gate is referred to as a "first gate" and the other is referred to as a "second gate," in some cases.

The gate and the back gate are formed using conductive layers, semiconductor layers with low resistivity, or the like and thus each have a function of preventing an electric field generated outside the transistor from influencing the semiconductor layer where a channel is formed (particularly, a function of blocking static electricity). Specifically, a variation in the electrical characteristics of the transistor due to the influence of an external electric field such as static electricity can be prevented.

Controlling the potential of the back gate can control the threshold voltage of the transistor. The potential of the back gate may be the same as the potential of the gate or may be a ground potential (GND potential) or a given potential.

For the semiconductor layers where the channels of the transistor WTr and the transistor RTr are formed, a single crystal semiconductor, a polycrystalline semiconductor, a microcrystalline semiconductor, an amorphous semiconductor, or the like can be used alone or in combination. As a semiconductor material, silicon, germanium, or the like can be used, for example. Alternatively, a compound semiconductor such as silicon germanium, silicon carbide, gallium arsenide, an oxide semiconductor, or a nitride semiconductor may be used. The same applies to the transistor STr1 and the transistor STr2.

Note that the semiconductor layers used for the transistor may be stacked. In the case of stacking semiconductor layers, semiconductors having different crystal states may be used or different semiconductor materials may be used.

The semiconductor layers used for the transistor WTr, the transistor RTr, the transistor STr1, and the transistor STr2 are preferably oxide semiconductors including a metal oxide. A transistor that uses a metal oxide in its semiconductor layer achieves a higher field effect mobility than a transistor that uses amorphous silicon in its semiconductor layer. Furthermore, in a transistor that uses polycrystalline silicon in its semiconductor layer, a grain boundary might be generated in the semiconductor layer. It is highly probable that the grain boundary traps carriers and thus decreases the on-state current and field-effect mobility of the transistor, for example. By contrast, as described in detail later, an oxide semiconductor can have a crystal structure in which a clear grain boundary is not observed or a crystal structure in which the number of grain boundaries is extremely small. Using such an oxide semiconductor in a semiconductor layer is preferable to obtain a transistor with favorable electrical characteristics such as a high on-state current and a high field-effect mobility.

In this embodiment, as the oxide semiconductor, an oxide with a composition of In:Ga:Zn=1:3:4 [atomic ratio] or in the neighborhood thereof, a composition of In:Ga:Zn=4:2:3 [atomic ratio] or in the neighborhood thereof, a composition of In:Ga:Zn=1:1:1 [atomic ratio] or in the neighborhood thereof, or a composition of In:Ga:Zn=1:1:0.5 [atomic ratio] or in the neighborhood thereof is used.

Moreover, an oxide semiconductor, particularly a CAAC-IGZO, which is a crystalline oxide semiconductor, has a characteristic structure where nanoclusters of several nanometers (e.g., 1 to 3 nm) with a c-axis alignment in the direction vertical to a surface on which the oxide semiconductor is deposited are connected to each other. Therefore, a crystal structure in which a clear grain boundary is not observed can be formed also in an opening extending in the Z direction.

In particular, the transistor WTr is preferably a transistor including an oxide semiconductor, which is a kind of metal oxide, in its semiconductor layer where a channel is formed (also referred to as an "OS transistor"). An oxide semiconductor has a band gap of 2 eV or more and thus has an extremely low off-state current. When an OS transistor is used as the transistor WTr, charge written to a node ND, which will be described later, can be retained for a long time. In the case where OS transistors are used as transistors included in the memory element MC, the memory element MC can be referred to as an "OS memory." In addition, the memory string 120 including the memory element MC can also be referred to as an "OS memory." Furthermore, the memory device 100 can also be referred to as an "OS memory."

The OS memory can retain written data for a year or more, or ten years or more even after power supply is stopped. Thus, the OS memory can be regarded as a nonvolatile memory.

In the OS memory, the amount of written charge is less likely to change over a long period of time; hence, the OS memory can retain multilevel (multibit) data as well as binary (1-bit) data.

Furthermore, an OS memory employs a method in which charge is written to a node through the transistor; hence, a high voltage, which is required for a conventional flash memory, is unnecessary and a high-speed writing operation is possible. The OS memory does not require an erasing operation before data rewriting, which is performed in a flash memory. Furthermore, the OS memory does not perform charge injection and extraction to and from a floating gate or a charge-trap layer, allowing a substantially unlimited number of times of data writing and reading. The OS memory is less likely to degrade than a conventional flash memory and can have high reliability.

Here, the insulator 124, the insulator 126, and the insulator 129 included in the OS memory of one embodiment of the present invention are insulators with sufficiently reduced nitrogen and carbon concentrations, and inhibit formation of trap centers at the interface with the neighboring semiconductor 125 or semiconductor 127. Thus, a highly reliable memory device in which a change in the threshold voltage is suppressed can be provided. Similar effects can be obtained in the case where the OS memory of one embodiment of the present invention is a floating gate memory element or a charge-trapping memory element. As described in detail later, the use of the above insulators as the insulator 126 and the insulator 129 that are adjacent to the semiconductor 127 inhibits formation of trap centers at the interface between the semiconductor 127 and the insulator 126 and at the interface between the semiconductor 127 and the insulator 129.

The carbon concentration in the insulator 124, the insulator 126, and the insulator 129 measured by SIMS is preferably higher than or equal to $1\times10^{18}$ atoms/cm$^3$ and lower than or equal to $5\times10^{20}$ atoms/cm$^3$, further preferably higher than or equal to $5\times10^{18}$ atoms/cm$^3$ and lower than or equal to $1\times10^{20}$ atoms/cm$^3$. The insulators also contain nitrogen, and the nitrogen concentration therein measured by SIMS is preferably higher than or equal to $3\times10^{19}$ atoms/cm$^3$ and lower than or equal to $1\times10^{21}$ atoms/cm$^3$, further preferably higher than or equal to $1\times10^{19}$ atoms/cm$^3$ and lower than or equal to $2\times10^{20}$ atoms/cm$^3$.

Furthermore, the insulator 124, the insulator 126, and the insulator 129 preferably have as low an In concentration as possible. The metal In in the insulators, traps negative charge, which might affect transistor characteristics and variations in transistor characteristics, and for example, might cause a positive shift in the threshold voltage of the transistor and an increase in an S value. For example, in the case where the threshold voltage of the transistor is positively shifted and the transistor exhibits normally-off characteristics, higher drive voltage is needed, which makes it difficult to perform low-voltage driving. In that case, the power consumption of the transistor and an electronic device including the transistor is increased.

Thus, the concentration of In contained in the insulators is preferably lower than or equal to $1.0\times10^{19}$ atoms/cm$^3$, further preferably lower than or equal to $1.0\times10^{18}$ atoms/cm$^3$, still further preferably lower than or equal to $1.0\times10^{17}$ atoms/cm$^3$.

In the case where the insulator 124, the insulator 126, and the insulator 129 are in contact with one or both of the semiconductor 125 and the semiconductor 127, the carbon concentration, the nitrogen concentration, and the In concentration in the above insulators are those in regions 1 nm or more apart from the interface with the semiconductor 125 or the semiconductor 127 in some cases.

Unlike a magnetoresistive random access memory (MRAM), a resistive random access memory (ReRAM), and the like, the OS memory does not undergo a structure change at the atomic level in rewriting. Hence, the OS memory has higher rewrite endurance than the magnetoresistive random access memory and the resistive random access memory.

The off-state current of the OS transistor hardly increases even in a high-temperature environment. Specifically, the off-state current hardly increases even at an environment temperature higher than or equal to room temperature and lower than or equal to 200° C. In addition, the on-state current is unlikely to decrease even in a high-temperature environment. A memory device including the OS memory can operate stably and have high reliability even in a high-temperature environment. Furthermore, the OS transistor has high withstand voltage between its source and drain. With the use of the OS transistor as a transistor included in a semiconductor device, the semiconductor device can operate stably and have high reliability even in a high-temperature environment.

The semiconductor 127 is preferably an n-type semiconductor. A region of the semiconductor 125 that overlaps with the conductor WWL is preferably an i-type or substantially i-type semiconductor. In that case, the transistor WTr is an enhancement (normally-off) transistor, and the transistor RTr is a depletion (normally-on) transistor.

Note that the semiconductor 125 and the semiconductor 127 may include the same material or different materials. For example, the semiconductor 125 and the semiconductor 127 may each be an oxide semiconductor. The semiconductor 125 and the semiconductor 127 may each be a semiconductor including silicon. The semiconductor 125 may be an oxide semiconductor, and the semiconductor 127 may be a semiconductor including silicon. The semiconductor 125 may be a semiconductor including silicon, and the semiconductor 127 may be an oxide semiconductor.

Note that FIG. 4A corresponds to the X-Y plane of the center of the transistor WTr or the vicinity of the center, and FIG. 4B corresponds to the X-Y plane of the center of the transistor RTr or the vicinity of the center. In the case where the cross-sectional shape of the conductor 130 is a circular shape in FIG. 4A and FIG. 4B, the insulator 129 is concentrically provided outside the conductor 130, the semiconductor 127 is concentrically provided outside the insulator 129, the insulator 126 is concentrically provided outside the semiconductor 127, the semiconductor 125 is concentrically provided outside the insulator 126, and the insulator 124 is concentrically provided outside the semiconductor 125. Furthermore, the conductor 128 is concentrically provided between the semiconductor 125 and the insulator 124.

The cross-sectional shape of the conductor 130 is not limited to a circular shape. The cross-sectional shape of the conductor 130 may be a rectangular shape. Alternatively, the cross-sectional shape of the conductor 130 may be a triangular shape.

Figure 5B:
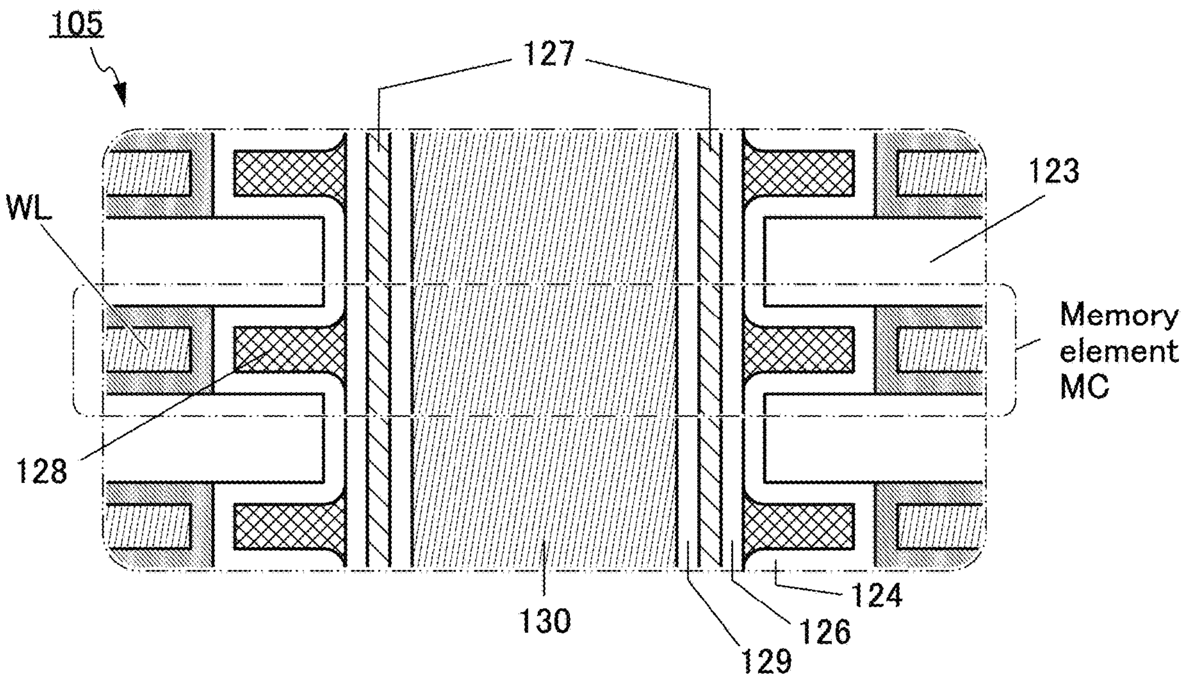

In the above, the example in which the memory element MC includes two layers of the semiconductor 125 and the semiconductor 127 is described; however, the present invention is not limited thereto. FIG. 5B illustrates an example in which the memory element MC includes the semiconductor 127 and the conductor 128 functioning as a floating gate.

A region where the conductor WL and the conductor 130 overlap with each other functions as the memory element MC. The conductor WL functions as a control gate electrode of the memory element MC, and the conductor 130 functions as a back gate electrode of the memory element MC. Part of the semiconductor 127 functions as a semiconductor layer where a channel of the memory element MC is formed. The semiconductor layer where the channel of the memory element MC is formed overlaps with the conductor WL with part of the insulator 124 therebetween. In addition, the conductor 128 is provided between the conductor WL and the semiconductor layer where the channel of the memory element MC is formed, the insulator 124 is provided between the conductor WL and the conductor 128, and the insulator 126 functioning as a tunnel insulating film is provided between the conductor 128 and the semiconductor layer where the channel of the memory element MC is formed.

The conductor 128 has a depressed portion with respect to the insulator 123. The conductor 128 is provided in the depression portion with the insulator 124 therebetween.

Figure 6A:
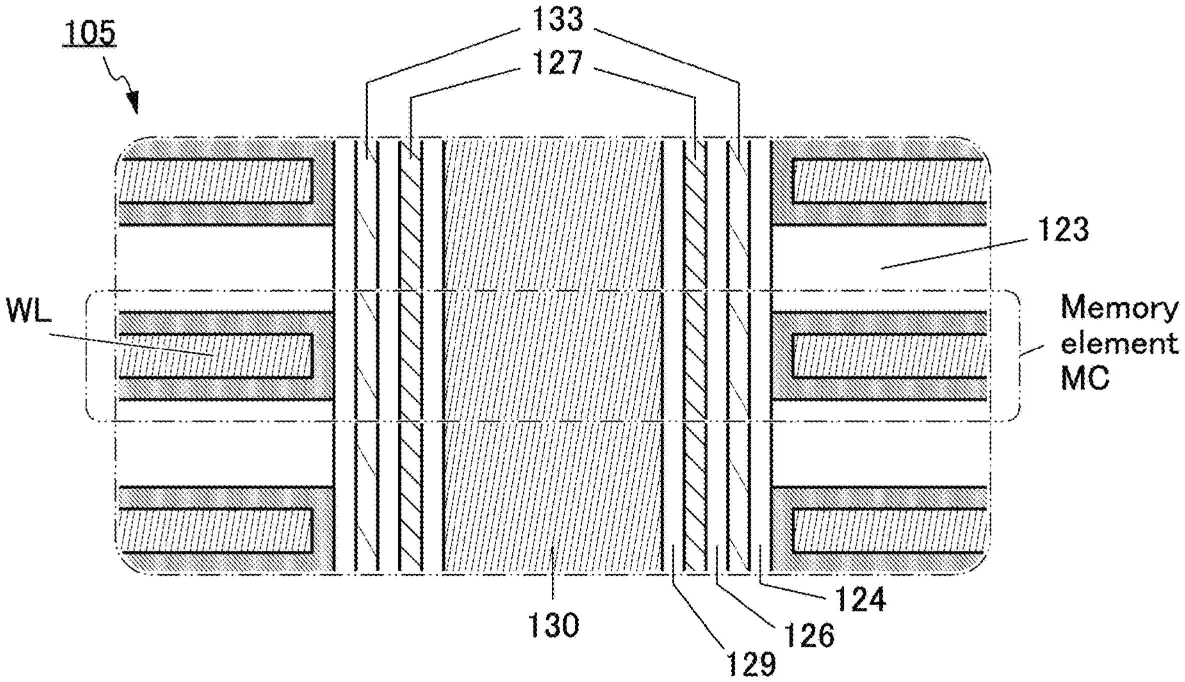
FIG. 6A and FIG. 6B are each a cross-sectional view of a memory element.

As illustrated in FIG. 6A, an insulator 133 functioning as a charge accumulation layer may be provided instead of the conductor 128 functioning as a floating gate.

A region where the conductor WL and the conductor 130 overlap with each other functions as the memory element MC. The conductor WL functions as a control gate electrode of the memory element MC, and the conductor 130 functions as a back gate electrode of the memory element MC. Part of the semiconductor 127 functions as the semiconductor layer where the channel of the memory element MC is formed. The semiconductor layer where the channel of the memory element MC is formed overlaps with the conductor WL with part of the insulator 124 therebetween. Part of the insulator 133 is provided between the conductor WL and the semiconductor layer where the channel of the memory element MC is formed and functions as a charge accumulation layer. The insulator 124 is provided between the conductor WL and the insulator 133, and the insulator 126 functioning as a tunnel insulating film is provided between the insulator 133 and the semiconductor layer where the channel of the memory element MC is formed.

The insulator 133 functioning as a charge accumulation layer is preferably an insulator containing silicon nitride.

Figure 6B:
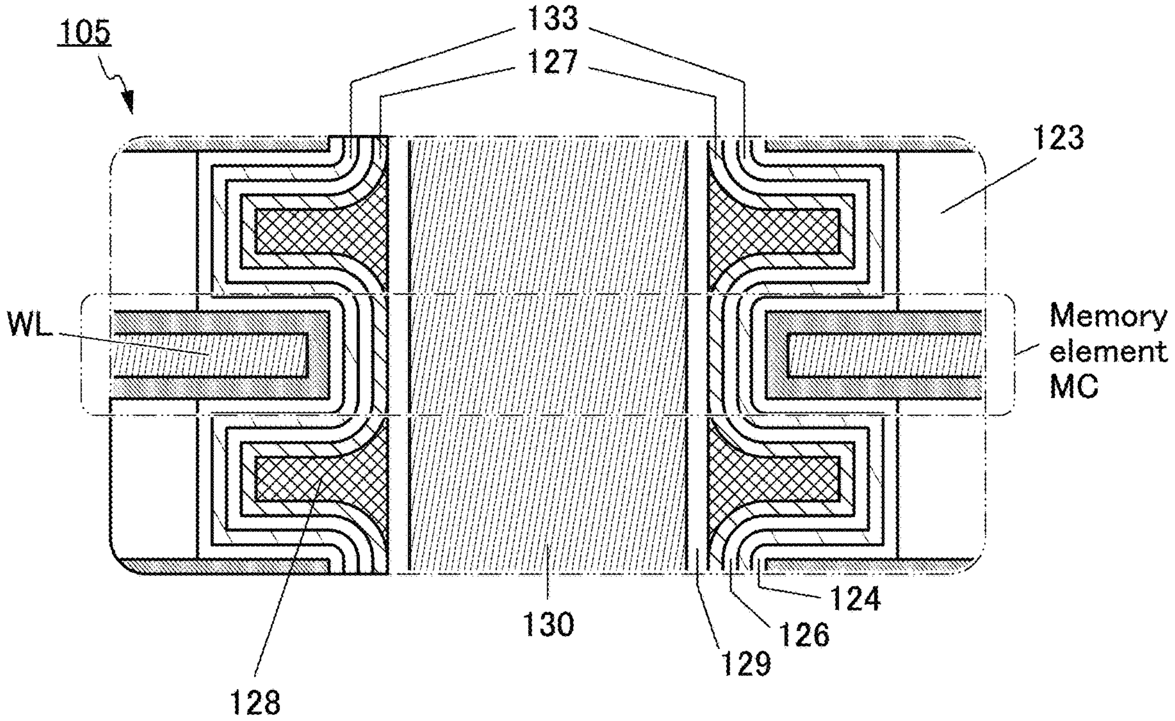

Alternatively, as illustrated in FIG. 6B, the conductor 128 may be provided in contact with the semiconductor 127 positioned between the adjacent memory elements MC in the Z-axis direction.

The insulator 123 has a depressed portion with respect to the conductor 128. The conductor 128 is provided in contact with the semiconductor 127, in the depressed portion. The conductor 128 is preferably provided, in which case the resistance between the channels of the adjacent memory elements MC in the Z-axis direction can be reduced.

In the memory elements MC illustrated in FIG. 5B, FIG. 6A, and FIG. 6B, the conductor WWL and the conductor RWL are not necessary because writing and reading are performed using a common conductor WL. For the conductor WL, a material that can be used for the conductor WWL or the conductor RWL and a formation method similar to that for the conductor WWL or the conductor RWL can be used. The writing operation, the reading operation, and the erasing operation can be performed using known methods.

In the above, impurities such as nitrogen and carbon are sufficiently reduced in the insulator 124 and the insulator 126 that are in contact with the semiconductor 127, leading to inhibition of formation of trap centers at the interface between the semiconductor 127 and each of the insulators. Thus, a highly reliable memory device in which a change in the threshold voltage is suppressed can be provided.

Note that the memory string 120 can also be referred to as a memory device, and the memory element MC can also be referred to as a memory device.

Insulators in which impurities such as nitrogen and carbon are reduced, such as the insulator 124, the insulator 126, and the insulator 129, are preferably formed by an ALD (Atomic Layer Deposition) method using a gas 401 containing silicon (precursor) and an oxidizing gas 402 (reactant). A rare gas such as helium, neon, argon, krypton, or xenon may be added to the oxidizing gas 402.

Examples of ALD methods include a thermal ALD method, in which a precursor and a reactant react with each other only by a thermal energy, and a PEALD (Plasma Enhanced ALD) method, in which a reactant excited by plasma is used.

An ALD method, which enables one atomic layer to be deposited at a time using self-regulating characteristics of atoms, has advantages such as deposition of an extremely thin film, deposition on a component with a high aspect ratio, deposition of a film with a small number of defects such as pinholes, deposition with excellent coverage, and low-temperature deposition. The use of plasma in a PEALD method is sometimes preferable because deposition at a lower temperature is possible. Note that a precursor used in an ALD method sometimes contains carbon and the like. Thus, in some cases, a film provided by an ALD method contains impurities such as carbon in a larger amount than a film provided by another deposition method. The quantity of the impurities can be determined by secondary ion mass spectrometry (SIMS) or X-ray photoelectron spectroscopy (XPS).

In this embodiment, a PEALD method is used. As a gas containing silicon and no carbon hydride, $SiH_4$, $Si_2H_6$, $SiF_4$, $SiCl_4$, $SiBr_4$, $SiH_2Cl_2$, $SiH_2I_2$, or the like can be used. As an oxidizing gas, $O_2$, $O_3$, $N_2O$, $NO_2$, $H_2O$, or the like can be used. In this embodiment, $SiH_4$ is used as the gas 401 containing silicon and no carbon hydride, and $N_2O$ is used as the oxidizing gas 402.

Figure 7:
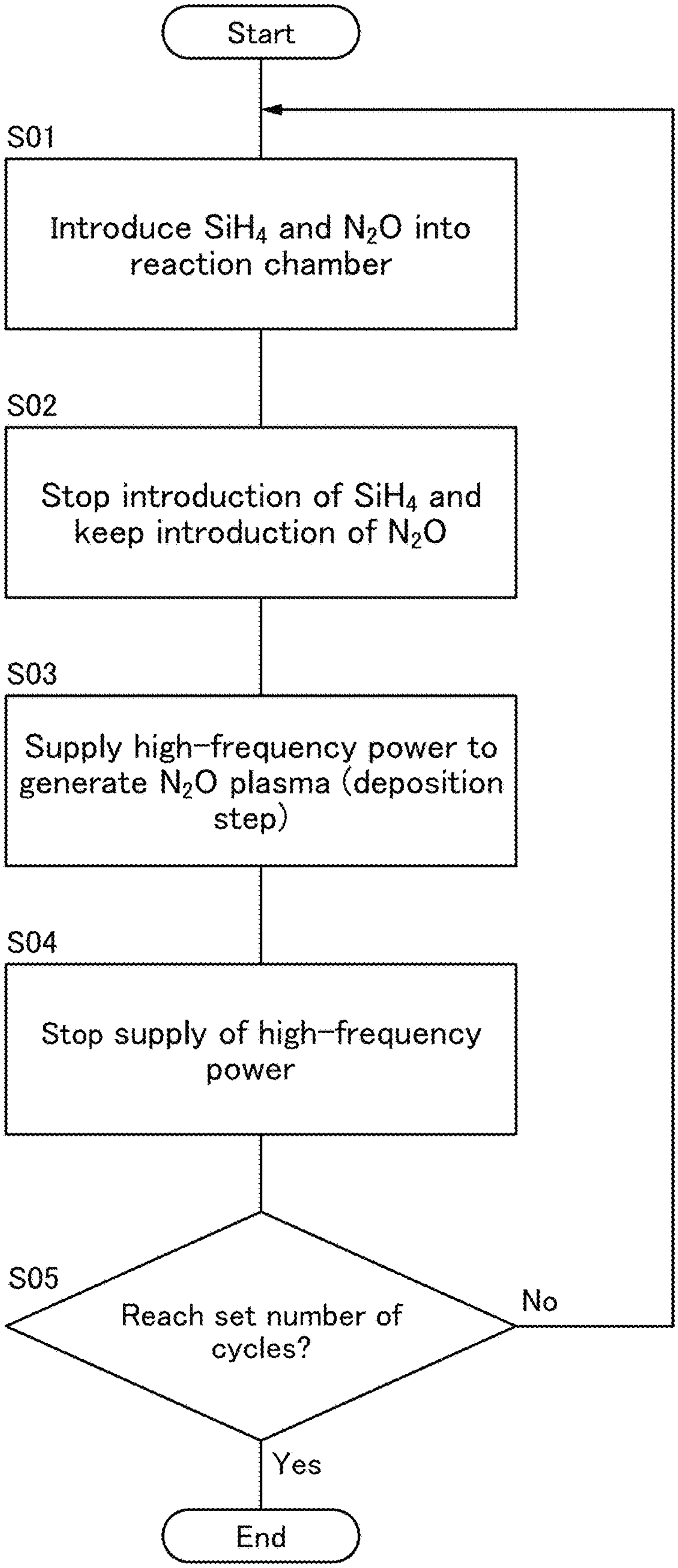
FIG. 7 is a process flowchart showing a manufacturing process of a semiconductor device of one embodiment of the present invention.
Figure 8A:
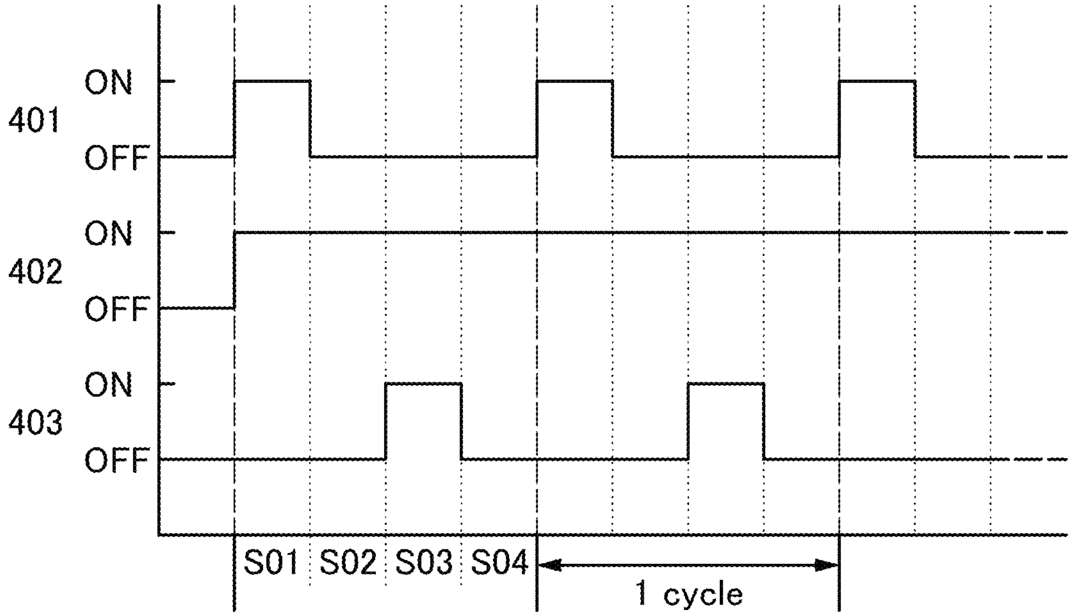
FIG. 8A and FIG. 8B are each a deposition sequence showing a manufacturing process of a semiconductor device of one embodiment of the present invention.

FIG. 7 shows a process flowchart for forming an insulator that can be used for the insulator 124, the insulator 126, the insulator 129, and the like, by a PEALD method using $SiH_4$ as the gas 401 containing silicon and $N_2O$ as the oxidizing gas 402, and FIG. 8A shows a deposition sequence of the insulator.

First, $SiH_4$ and $N_2O$ are introduced into a reaction chamber, and the pressure in the reaction chamber is kept constant (Step S01). Here, a rare gas such as helium, neon, argon, krypton, or xenon may be introduced into the reaction chamber. Regarding the flow rate ratio of $SiH_4$ to $N_2O$, when the $SiH_4$ flow rate is 1, the $N_2O$ flow rate is greater than or equal to 10 and less than or equal to 3000, preferably greater than or equal to 10 and less than or equal to 800, further preferably greater than or equal to 50 and less than or equal to 400. The pressure in the reaction chamber is set to higher than or equal to 200 Pa and lower than or equal to 1200 Pa, preferably higher than or equal to 400 Pa and lower than or equal to 1000 Pa, further preferably higher than or equal to 600 Pa and lower than or equal to 800 Pa. The temperature of a substrate is higher than or equal to 100° C. and lower than or equal to 500° C., preferably higher than or equal to 200° C. and lower than or equal to 400° C. The substrate does not need to be heated and deposition may be performed at room temperature.

Next, the introduction of $SiH_4$ is stopped, and $SiH_4$ remaining in the reaction chamber is purged with $N_2O$ kept being introduced into the reaction chamber (Step S02).

Next, a high-frequency power 403 is supplied to the reaction chamber so that $N_2O$ plasma is generated. The high frequency is higher than or equal to 13.56 MHz and lower than or equal to 60 MHz. $SiH_x$ adsorbed on the substrate in Step S01 is oxidized with the use of $N_2O$ plasma, whereby approximately one molecular layer of silicon oxide can be formed (Step S03). The silicon oxide contains nitrogen injected using $N_2O$ plasma, in some cases. Silicon oxide containing nitrogen is referred to as silicon oxynitride in some cases.

Then, the supply of the high-frequency power 403 is stopped (Step S04).

Figure 8B:
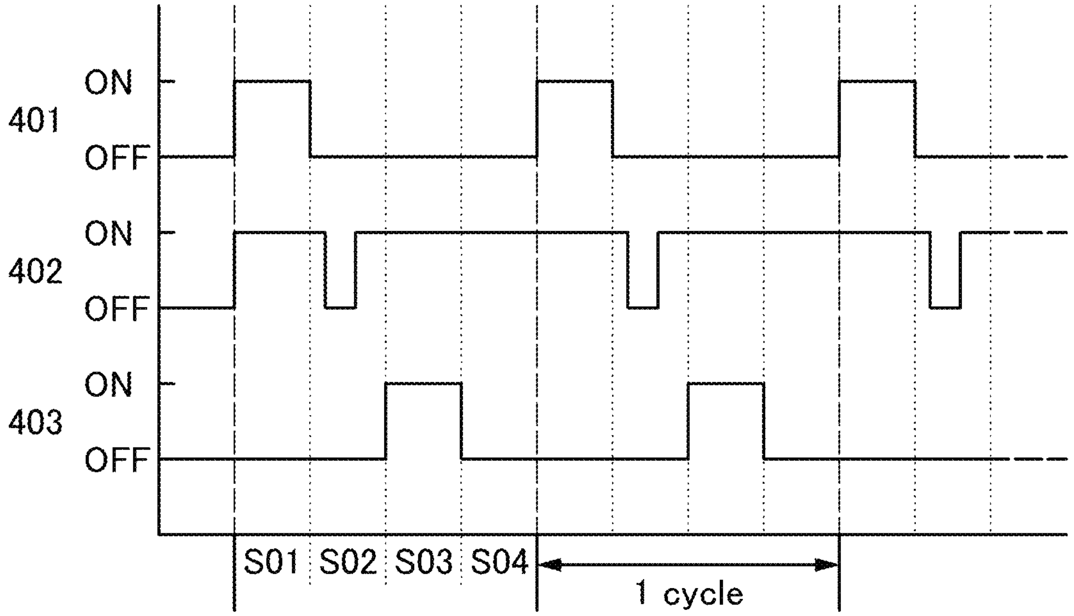

When Step S01 to Step S04 are regarded as one cycle, whether the number of cycles reaches a predetermined value is determined (Step S05), and in the case where the number of cycles does not reach the predetermined value, the process returns to Step S01. In the case where the number of cycles reaches the predetermined value, the process terminates. By repeating the above cycle until the cycle number reaches the predetermined cycle number so that a desired thickness can be obtained, the insulator is formed. As shown in FIG. 8B, a vacuum evacuation step in which the introduction of $SiH_4$ and $N_2O$ is stopped and $SiH_4$ and $N_2O$ remaining in the reaction chamber are evacuated may be inserted in Step S02. In that case, the introduction of $SiH_4$ and the introduction of $N_2O$ may be stopped at the same time, or the introduction of $N_2O$ may be stopped after the introduction of $SiH_4$ is stopped. It is preferable that introduction of $N_2O$ be resumed before the start of Step S03.

The silicon oxide to be the insulator 124, the insulator 126, the insulator 129, and the like deposited in the above manner can be a favorable insulator having a lower hydrogen concentration and a lower carbon concentration than silicon oxide deposited by a PECVD (Plasma Enhanced CVD) method using $SiH_4$ and $N_2O$.

In a PECVD method using $SiH_4$ and $N_2O$, plasma is generated by applying high-frequency power in the state where $SiH_4$ and $N_2O$ are introduced; thus, $SiH_4$ is decomposed in the plasma to generate a large amount of hydrogen radicals, so that hydrogen enters the silicon oxide. Since the insulator 124, the insulator 126, and the insulator 129 are in contact with one or both of the semiconductor 125 and the semiconductor 127, when oxygen in the semiconductor 125 or the semiconductor 127 is extracted by the reduction reaction of hydrogen radicals to form VoH, the hydrogen concentration in the semiconductor 125 and the semiconductor 127 increases.

In contrast, in a PEALD method using $SiH_4$ and $N_2O$ of one embodiment of the present invention, high-frequency power is not applied during the introduction of $SiH_4$ and $N_2O$ in Step S01, and after remaining $SiH_4$ is purged in Step S02, plasma is generated by applying high-frequency power in the state where only $N_2O$ is introduced in Step S03; therefore, generation of hydrogen radicals can be inhibited. Accordingly, entry of hydrogen into the silicon oxide, the semiconductor 125, or the semiconductor 127 can be inhibited. In a PEALD method using $SiH_4$ and $N_2O$, $SiH_4$ is used as a precursor instead of a precursor containing impurities such as carbon, e.g., an organic precursor containing a CH group; thus, entry of impurities such as carbon, hydrocarbon, and the like into the silicon oxide can be inhibited. The silicon oxide deposited in such a manner is a denser film with a reduced impurity concentration and thus can prevent diffusion of In from the semiconductor 125 or the semiconductor 127 to the silicon oxide.

The carbon concentration in the silicon oxide measured by SIMS is preferably higher than or equal to $1\times10^{18}$ atoms/cm$^3$ and lower than or equal to $5\times10^{20}$ atoms/cm$^3$, further preferably higher than or equal to $5\times10^{18}$ atoms/cm$^3$ and lower than or equal to $1\times10^{20}$ atoms/cm$^3$. The silicon oxide also contains nitrogen, and the nitrogen concentration therein measured by SIMS is preferably higher than or equal to $3\times10^{19}$ atoms/cm$^3$ and lower than or equal to $1\times10^{21}$ atoms/cm$^3$, further preferably higher than or equal to $1\times10^{19}$ atoms/cm$^3$ and lower than or equal to $2\times10^{20}$ atoms/cm$^3$.

Thus, the silicon oxide to be the insulator 124, the insulator 126, the insulator 129, and the like is deposited by a PEALD method using a gas containing silicon and no carbon hydride (precursor) and an oxidizing gas (reactant) of one embodiment of the present invention, whereby a highly reliable transistor having excellent electrical characteristics can be obtained.

The In concentration in the silicon oxide to be the insulator 124, the insulator 126, the insulator 129, and the like is preferably as low as possible. The metal In in the silicon oxide, traps negative charge, which might affect transistor characteristics and variations in transistor characteristics, and for example, might cause a positive shift in the threshold voltage of the transistor and an increase in an S value. For example, in the case where the threshold voltage of the transistor is positively shifted and the transistor exhibits normally-off characteristics, higher drive voltage is needed, which makes it difficult to perform low-voltage driving. In that case, the power consumption of the transistor and an electronic device including the transistor is increased.

Thus, the concentration of In contained in the silicon oxide is preferably lower than or equal to $1.0\times10^{19}$ atoms/cm$^3$, further preferably lower than or equal to $1.0\times10^{18}$ atoms/cm$^3$, still further preferably lower than or equal to $1.0\times10^{17}$ atoms/cm$^3$.

[Constituent Materials of Semiconductor Device]

Next, constituent materials that can be used for the memory device 100 will be described.

[Substrate]

The memory device 100 can be provided over a substrate. As the substrate, an insulator substrate, a semiconductor substrate, or a conductor substrate is used, for example. Examples of the insulator substrate include a glass substrate, a quartz substrate, a sapphire substrate, a stabilized zirconia substrate (e.g., an yttria-stabilized zirconia substrate), and a resin substrate. Examples of the semiconductor substrate include a semiconductor substrate using silicon or germanium as a material and a compound semiconductor substrate containing silicon carbide, silicon germanium, gallium arsenide, indium phosphide, zinc oxide, or gallium oxide. Another example is the above-described semiconductor substrate in which an insulator region is included, e.g., an SOI (Silicon On Insulator) substrate. Examples of the conductor substrate include a graphite substrate, a metal substrate, an alloy substrate, and a conductive resin substrate. Other examples include a substrate including a metal nitride and a substrate including a metal oxide. Other examples include an insulator substrate provided with a conductor or a semiconductor, a semiconductor substrate provided with a conductor or an insulator, and a conductor substrate provided with a semiconductor or an insulator. Alternatively, these substrates provided with elements may be used. Examples of the element provided for the substrate include a capacitor element, a resistor element, a switching element, a light-emitting element, and a storage element.

[Insulator]

Examples of the insulator include an insulating oxide, an insulating nitride, an insulating oxynitride, an insulating nitride oxide, an insulating metal oxide, an insulating metal oxynitride, and an insulating metal nitride oxide.

Note that in this specification and the like, "oxynitride" refers to a material that contains more oxygen than nitrogen as its main component. For example, "silicon oxynitride" refers to a material that contains silicon, nitrogen, and oxygen and contains more oxygen than nitrogen. In this specification and the like, "nitride oxide" refers to a material that contains more nitrogen than oxygen as its main component. For example, "aluminum nitride oxide" refers to a material that contains aluminum, nitrogen, and oxygen and contains more nitrogen than oxygen.

As miniaturization and high integration of transistors progress, for example, a problem such as a leakage current arises because of a thinner gate insulator, in some cases. When a high-k material is used for the insulator functioning as a gate insulator, the voltage during operation of the transistor can be lowered while the physical thickness of the gate insulator is maintained. In contrast, when a material with a low relative permittivity is used for the insulator functioning as an interlayer film, parasitic capacitance generated between wirings can be reduced. Thus, a material is preferably selected depending on the function of an insulator.

Examples of the insulator with a high relative permittivity include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

Examples of the insulator with a low relative permittivity include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin.

When an OS transistor is surrounded by an insulator having a function of inhibiting passage of oxygen and impurities such as hydrogen, the transistor can have stable electrical characteristics. As the insulator having a function of inhibiting passage of oxygen and impurities such as hydrogen, a single layer or stacked layers of an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum are used. Specifically, as the insulator having a function of inhibiting passage of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide; or a metal nitride such as aluminum nitride, silicon nitride oxide, or silicon nitride can be used.

In the case where an oxide semiconductor is used as the semiconductor 125 and/or the semiconductor 127, the insulator functioning as a gate insulator preferably includes a region containing oxygen that is released by heating. For example, when a structure is employed in which silicon oxide or silicon oxynitride including a region containing oxygen that is released by heating is in contact with the semiconductor 125 and/or the semiconductor 127, oxygen vacancies included in the semiconductor 125 and/or the semiconductor 127 can be compensated for.

The insulator 181 is preferably provided in order to inhibit oxidation of a conductor 182 functioning as the conductor WWL and a conductor 183 functioning as the conductor SEL. The materials given above that have a barrier property against oxygen or hydrogen are preferably used for the insulator 181. The insulator 181 is preferably provided in contact with the bottom surfaces, the top surfaces, and side surfaces of the conductor 182 and the conductor 183.

As the insulator 124, the insulator 126, and the insulator 129 in contact with one or both of the semiconductor 125 and the semiconductor 127, insulators in which impurities such as nitrogen and carbon are reduced are preferably used. To form such insulators, it is preferable to employ an ALD method. It is particularly preferable to employ a PEALD method using plasma.

The carbon concentration in the insulator 124, the insulator 126, and the insulator 129 measured by SIMS is preferably higher than or equal to $1\times10^{18}$ atoms/cm$^3$ and lower than or equal to $5\times10^{20}$ atoms/cm$^3$, further preferably higher than or equal to $5\times10^{18}$ atoms/cm$^3$ and lower than or equal to $1\times10^{20}$ atoms/cm$^3$. The insulator 124, the insulator 126, and the insulator 129 also contain nitrogen, and the nitrogen concentration therein measured by SIMS is preferably higher than or equal to $3\times10^{19}$ atoms/cm$^3$ and lower than or equal to $1\times10^{21}$ atoms/cm$^3$, further preferably higher than or equal to $1\times10^{19}$ atoms/cm$^3$ and lower than or equal to $2\times10^{20}$ atoms/cm$^3$.

In addition, the concentration of In contained in the insulator 124, the insulator 126, and the insulator 129 is preferably lower than or equal to $1.0\times10^{19}$ atoms/cm$^3$, further preferably lower than or equal to $1.0\times10^{18}$ atoms/cm$^3$, still further preferably lower than or equal to $1.0\times10^{17}$ atoms/cm$^3$.

In an ALD method, one atomic layer can be deposited at a time using self-regulating characteristics of precursor molecules or atoms included in the precursor. Hence, an ALD method has effects such as deposition of an extremely thin film, deposition of a film on a component with a high aspect ratio, deposition of a film with a small number of defects such as pinholes, deposition of a film with excellent coverage, and deposition of a film at a low A plasma ALD method, which allows deposition at a lower temperature, is temperature. preferably employed. An ALD method in which a precursor and a reactant react with each other by thermal energy (such an ALD method is referred to as a thermal ALD method in some cases) may be employed.

[Conductor]

As a conductor, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, lanthanum, and the like; an alloy containing any of the above metal elements; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. In addition, tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen. Alternatively, a semiconductor having high electrical conductivity, typified by polycrystalline silicon containing an impurity element such as phosphorus, or silicide such as nickel silicide may be used.

A stack of a plurality of conductive layers formed of the above materials may be used. For example, a stacked-layer structure combining a material containing the above metal element and a conductive material containing oxygen may be employed. Alternatively, a stacked-layer structure combining a material containing the above metal element and a conductive material containing nitrogen may be employed. Alternatively, a stacked-layer structure combining a material containing the above metal element, a conductive material containing oxygen, and a conductive material containing nitrogen may be employed.

In the case where an oxide semiconductor, which is a type of metal oxide, is used for the channel formation region of the transistor, the conductor functioning as the gate electrode preferably employs a stacked-layer structure combining a material containing the above metal element and a conductive material containing oxygen. In this case, the conductive material containing oxygen is preferably provided on the channel formation region side. When the conductive material containing oxygen is provided on the channel formation region side, oxygen released from the conductive material is easily supplied to the channel formation region.

For the conductor functioning as the gate electrode, it is particularly preferable to use a conductive material containing oxygen and a metal element contained in the oxide semiconductor where the channel is formed. Alternatively, a conductive material containing the above metal element and nitrogen may be used. For example, a conductive material containing nitrogen, such as titanium nitride or tantalum nitride, may be used. Indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Indium gallium zinc oxide containing nitrogen may be used.

With the use of such a material, hydrogen contained in the oxide semiconductor where the channel is formed can be captured in some cases. Alternatively, hydrogen entering from an external insulator or the like can be captured in some cases.

[Oxide Semiconductor]

For the semiconductor 125 and the semiconductor 127, a metal oxide functioning as a semiconductor (an oxide semiconductor) is preferably used. An oxide semiconductor that can be used for the semiconductor 125 and the semiconductor 127 is described below.

The oxide semiconductor preferably contains at least indium or zinc. In particular, indium and zinc are preferably contained. Furthermore, aluminum, gallium, yttrium, tin, or the like is preferably contained in addition to them. Furthermore, one kind or a plurality of kinds selected from boron, titanium, iron, nickel, germanium, zirconium, molybdenum, lanthanum, cerium, neodymium, hafnium, tantalum, tungsten, magnesium, cobalt, and the like may be contained.

Here, the case where the oxide semiconductor is an In-M-Zn oxide containing indium, the element M, and zinc is considered. The element M represents one or more selected from aluminum, gallium, yttrium, and tin. Examples of other elements that can be used as the element M include boron, titanium, iron, nickel, germanium, zirconium, molybdenum, lanthanum, cerium, neodymium, hafnium, tantalum, tungsten, magnesium, and cobalt. Note that two or more of the above-described elements may be used in combination as the element M.

Note that in this specification and the like, a metal oxide containing nitrogen is also collectively referred to as a metal oxide in some cases. A metal oxide containing nitrogen may be referred to as a metal oxynitride.

<Classification of Crystal Structures>

First, the classification of crystal structures of an oxide semiconductor is described with reference to FIG. 9A. FIG. 9A is a diagram showing the classification of crystal structures of an oxide semiconductor, typically IGZO (a metal oxide containing In, Ga, and Zn).

As shown in FIG. 9A, an oxide semiconductor is roughly classified into "Amorphous", "Crystalline", and "Crystal". The term "Amorphous" includes completely amorphous. The term "Crystalline" includes CAAC (c-axis-aligned crystalline), nc (nanocrystalline), and CAC (cloud-aligned composite). Note that the term "Crystalline" excludes single crystal, poly crystal, and completely amorphous. The term "Crystal" includes single crystal and poly crystal.

Note that the structures in the thick frame in FIG. 9A are in an intermediate state between "Amorphous" and "Crystal", and belong to a new boundary region (New crystalline phase). That is, these structures are completely different from "Amorphous", which is energetically unstable, and "Crystal".

A crystal structure of a film or a substrate can be analyzed with an X-ray diffraction (XRD) spectrum. Here, FIG. 9B shows an XRD spectrum, which is obtained by GIXD (Grazing-Incidence XRD) measurement, of a CAAC-IGZO film classified into "Crystalline". Note that a GIXD method is also referred to as a thin film method or a Seemann-Bohlin method. The XRD spectrum that is shown in FIG. 9B and obtained by GIXD measurement is hereinafter simply referred to as an XRD spectrum. The CAAC-IGZO film shown in FIG. 9B has a composition in the neighborhood of In:Ga:Zn=4:2:3 [atomic ratio]. The CAAC-IGZO film shown in FIG. 9B has a thickness of 500 nm.

As shown in FIG. 9B, a clear peak indicating crystallinity is detected in the XRD spectrum of the CAAC-IGZO film. Specifically, a peak indicating c-axis alignment is detected at 2θ of around 31° in the XRD spectrum of the CAAC-IGZO film. As shown in FIG. 9B, the peak at 2θ of around 31° is asymmetric with respect to the axis of the angle at which the peak intensity is detected.

A crystal structure of a film or a substrate can also be evaluated with a diffraction pattern obtained by a nanobeam electron diffraction (NBED) method (such a pattern is also referred to as a nanobeam electron diffraction pattern). FIG. 9C shows a diffraction pattern of the CAAC-IGZO film. FIG. 9C shows a diffraction pattern obtained with NBED in which an electron beam is incident in the direction parallel to the substrate. The CAAC-IGZO film in FIG. 9C has a composition in the neighborhood of In:Ga:Zn=4:2:3 [atomic ratio]. In the nanobeam electron diffraction method, electron diffraction is performed with a probe diameter of 1 nm.

As shown in FIG. 9C, a plurality of spots indicating c-axis alignment are observed in the diffraction pattern of the CAAC-IGZO film.

[Structure of Oxide Semiconductor]

Oxide semiconductors might be classified in a manner different from that in FIG. 9A when classified in terms of the crystal structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Next, the above-described CAAC-OS, nc-OS, and a-like OS will be described in detail.

[CAAC-OS]

The CAAC-OS is an oxide semiconductor that has a plurality of crystal regions each of which has c-axis alignment in a particular direction. Note that the particular direction refers to the film thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that the distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. In the case where the crystal region is formed of a large number of fine crystals, the size of the crystal region may be approximately several tens of nanometers.

In the case of an In-M-Zn oxide (the element Mis one kind or two or more kinds selected from aluminum, gallium, yttrium, tin, titanium, and the like), the CAAC-OS tends to have a layered crystal structure (also referred to as a layered structure) in which a layer containing indium (In) and oxygen (hereinafter, an In layer) and a layer containing the element M, zinc (Zn), and oxygen (hereinafter, an (M,Zn) layer) are stacked. Indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution TEM image, for example.

When the CAAC-OS film is subjected to structural analysis by out-of-plane XRD measurement with an XRD apparatus using θ/2θ scanning, for example, a peak indicating c-axis alignment is detected at 2θ of 31° or around 31°. Note that the position of the peak indicating c-axis alignment (the value of 2θ) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear grain boundary cannot be observed even in the vicinity of the distortion in the CAAC-OS. That is, formation of a crystal grain boundary is inhibited by the distortion of lattice arrangement. This is probably because the CAAC-OS can tolerate distortion owing to a low density of arrangement of oxygen atoms in the a-b plane direction, an interatomic bond distance changed by substitution of a metal atom, and the like.

A crystal structure in which a clear grain boundary is observed is what is called polycrystal. It is highly probable that the grain boundary becomes a recombination center and captures carriers and thus decreases the on-state current and field-effect mobility of a transistor, for example. Thus, the CAAC-OS in which no clear grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a grain boundary as compared with an In oxide.

The CAAC-OS is an oxide semiconductor with high crystallinity in which no clear grain boundary is observed. Thus, in the CAAC-OS, a reduction in electron mobility due to the grain boundary is unlikely to occur. Moreover, since the crystallinity of an oxide semiconductor might be decreased by entry of impurities, formation of defects, or the like, the CAAC-OS can be regarded as an oxide semiconductor that has small amounts of impurities and defects (e.g., oxygen vacancies). Thus, an oxide semiconductor including the CAAC-OS is physically stable. Therefore, the oxide semiconductor including the CAAC-OS is resistant to heat and has high reliability. In addition, the CAAC-OS is stable with respect to high temperature in the manufacturing process (what is called thermal budget). Accordingly, the use of the CAAC-OS for the OS transistor can extend the degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor with some analysis methods. For example, when an nc-OS film is subjected to structural analysis using out-of-plane XRD measurement with an XRD apparatus using θ/2θ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or smaller than the diameter of a nanocrystal (e.g., 1 nm or larger and 30 nm or smaller).

[a-like OS]

The a-like OS is an oxide semiconductor having a structure between those of the nc-OS and the amorphous oxide semiconductor. The a-like OS includes a void or a low-density region. That is, the a-like OS has low crystallinity as compared with the nc-OS and the CAAC-OS. Moreover, the a-like OS has a higher hydrogen concentration in the film than the nc-OS and the CAAC-OS.

[Structure of Oxide Semiconductor]

Next, the above-described CAC-OS will be described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Note that the atomic ratios of In, Ga, and Zn to the metal elements contained in the CAC-OS in an In—Ga—Zn oxide are denoted with [In], [Ga], and [Zn], respectively. For example, the first region in the CAC-OS in the In—Ga—Zn oxide has [In] higher than that in the composition of the CAC-OS film. Moreover, the second region has [Ga] higher than that in the composition of the CAC-OS film. For example, the first region has higher [In] and lower [Ga] than the second region. Moreover, the second region has higher [Ga] and lower [In] than the first region.

Specifically, the first region includes indium oxide, indium zinc oxide, or the like as its main component. The second region includes gallium oxide, gallium zinc oxide, or the like as its main component. That is, the first region can be referred to as a region containing In as its main component. The second region can be referred to as a region containing Ga as its main component.

Note that a clear boundary between the first region and the second region cannot be observed in some cases.

For example, energy dispersive X-ray spectroscopy (EDX) is used to obtain EDX mapping, and according to the EDX mapping, the CAC-OS in the In—Ga—Zn oxide has a structure in which the region containing In as its main component (the first region) and the region containing Ga as its main component (the second region) are unevenly distributed and mixed.

In the case where the CAC-OS is used for a transistor, a switching function (on/off switching function) can be given to the CAC-OS owing to the complementary action of the conductivity derived from the first region and the insulating property derived from the second region. The CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, high on-state current (Ion), high field-effect mobility (u), and excellent switching operation can be achieved.

An oxide semiconductor has various structures with different properties. Two or more kinds among the amorphous oxide semiconductor, the polycrystalline oxide semiconductor, the a-like OS, the CAC-OS, the nc-OS, and the CAAC-OS may be included in an oxide semiconductor of one embodiment of the present invention.

[Transistor Including Oxide Semiconductor]

Next, the case where the above oxide semiconductor is used for a transistor will be described.

When the above oxide semiconductor is used for a transistor, a transistor with high field-effect mobility can be achieved. In addition, a transistor having high reliability can be fabricated.

An oxide semiconductor with a low carrier concentration is preferably used for a channel formation region of the transistor. For example, the carrier concentration of the channel formation region of the oxide semiconductor is preferably lower than or equal to $1\times10^{18}$ $cm^{-3}$, further preferably lower than $1\times10^{17}$ $cm^{-3}$, still further preferably lower than $1\times10^{16}$ $cm^{-3}$, yet further preferably lower than $1\times10^{13}$ $cm^{-3}$, yet still further preferably lower than $1\times10^{12}$ $cm^{-3}$. In order to reduce the carrier concentration of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor. A highly purified intrinsic or substantially highly purified intrinsic state may be referred to as an i-type or a substantially i-type.

A highly purified intrinsic or substantially highly purified intrinsic oxide semiconductor film has a low density of defect states and thus has a low density of trap states in some cases.

Charge trapped by the trap states in the oxide semiconductor takes a long time to disappear and might behave like fixed charge. Thus, a transistor whose channel formation region is formed in an oxide semiconductor with a high density of trap states has unstable electrical characteristics in some cases.

Accordingly, in order to obtain stable electrical characteristics of a transistor, reducing the impurity concentration in an oxide semiconductor is effective. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon.

[Impurity]

Here, the influence of each impurity in the oxide semiconductor will be described.

When silicon or carbon, which is one of Group 14 elements, is contained in the oxide semiconductor, defect states are formed in the oxide semiconductor. Thus, the concentration of silicon or carbon in the channel formation region of the oxide semiconductor and the concentration of silicon or carbon in the vicinity of the interface with the channel formation region of the oxide semiconductor (the concentration obtained by secondary ion mass spectrometry (SIMS)) are each set lower than or equal to $2\times10^{18}$ atoms/$cm^3$, preferably lower than or equal to $2\times10^{17}$ atoms/$cm^3$.

When the oxide semiconductor contains an alkali metal or an alkaline earth metal, defect states are formed and carriers are generated in some cases. Thus, a transistor using an oxide semiconductor that contains an alkali metal or an alkaline earth metal is likely to have normally-on characteristics. Thus, the concentration of an alkali metal or an alkaline earth metal in the channel formation region of the oxide semiconductor, which is obtained using SIMS, is lower than or equal to $1\times10^{18}$ atoms/$cm^3$, preferably lower than or equal to $2\times10^{16}$ atoms/$cm^3$.

Furthermore, when the oxide semiconductor contains nitrogen, the oxide semiconductor easily becomes n-type because of generation of electrons serving as carriers and an increase in carrier concentration. As a result, a transistor using an oxide semiconductor containing nitrogen as a semiconductor is likely to have normally-on characteristics. When nitrogen is contained in the oxide semiconductor, a trap state is sometimes formed. This might make the electrical characteristics of the transistor unstable. Therefore, the concentration of nitrogen in the channel formation region of the oxide semiconductor, which is obtained using SIMS, is set lower than $5\times10^{19}$ atoms/$cm^3$, preferably lower than or equal to $5\times10^{18}$ atoms/$cm^3$, further preferably lower than or equal to $1\times10^{18}$ atoms/$cm^3$, still further preferably lower than or equal to $5\times10^{17}$ atoms/$cm^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. Accordingly, hydrogen in the channel formation region of the oxide semiconductor is preferably reduced as much as possible. Specifically, the hydrogen concentration in the channel formation region of the oxide semiconductor, which is obtained using SIMS, is set lower than $1\times10^{20}$ atoms/cm$^3$, preferably lower than $5\times10^{19}$ atoms/cm$^3$, further preferably lower than $1\times10^{19}$ atoms/cm$^3$, still further preferably lower than $5\times10^{18}$ atoms/cm$^3$, yet still further preferably lower than $1\times10^{18}$ atoms/cm$^3$.

When an oxide semiconductor with sufficiently reduced impurities is used for the channel formation region of the transistor, stable electrical characteristics can be given.

[Other Semiconductor Materials]

A semiconductor material that can be used for the semiconductor 125 and the semiconductor 127 is not limited to the above oxide semiconductors. A semiconductor material that has a band gap (a semiconductor material that is not a zero-gap semiconductor) may be used for the semiconductor 125 and the semiconductor 127. For example, a single element semiconductor such as silicon, a compound semiconductor such as gallium arsenide, or a layered material functioning as a semiconductor (also referred to as an atomic layer material or a two-dimensional material) may be used as a semiconductor material. In particular, a layered material functioning as a semiconductor is preferably used as a semiconductor material.

Here, in this specification and the like, the layered material generally refers to a group of materials having a layered crystal structure. In the layered crystal structure, layers formed by covalent bonding or ionic bonding are stacked with bonding such as the Van der Waals force, which is weaker than covalent bonding or ionic bonding. The layered material has high electrical conductivity in a monolayer, that is, high two-dimensional electrical conductivity. When a material that functions as a semiconductor and has high two-dimensional electrical conductivity is used for a channel formation region, a transistor can having a high on-state current can be provided.

Examples of the layered material include graphene, silicene, and chalcogenide. Chalcogenide is a compound containing chalcogen. Chalcogen is a general term of elements belonging to Group 16, which includes oxygen, sulfur, selenium, tellurium, polonium, and livermorium. Examples of chalcogenide include transition metal chalcogenide and chalcogenide of Group 13 elements.

For the semiconductor 125 and the semiconductor 127, a transition metal chalcogenide functioning as a semiconductor is preferably used, for example. Specific examples of the transition metal chalcogenide which can be used for the semiconductor 125 and the semiconductor 127 include molybdenum sulfide (typically $MoS_2$), molybdenum selenide (typically $MoSe_2$), molybdenum telluride (typically $MoTe_2$), tungsten sulfide (typically $WS_2$), tungsten selenide (typically $WSe_2$), tungsten telluride (typically $WTe_2$), hafnium sulfide (typically $HfS_2$), hafnium selenide (typically $HfSe_2$), zirconium sulfide (typically $ZrS_2$), and zirconium selenide (typically $ZrSe_2$).

<Example of Method for Manufacturing Memory Device>

Next, an example of a method for manufacturing a memory device according to the present invention will be described with reference to FIG. 10 to FIG. 19. Note that FIG. 10 to FIG. 19 each show a cross section along the X-Z plane and are cross-sectional views seen from the Y direction. Although three memory strings 120 including five (five stages of) memory elements MC are manufactured as an example in this manufacturing method, this embodiment is not limited to the example. The memory string 120 includes two or more stages of memory elements MC. For example, the memory string 120 may include four or more stages of memory elements MC. The memory string 120 preferably includes 32 or more, further preferably 64 or more, still further preferably 128 or more, yet still further preferably 256 or more stages of memory elements MC. One embodiment of the present invention enables two or more memory strings 120 to be manufactured at a time.

Figure 10:
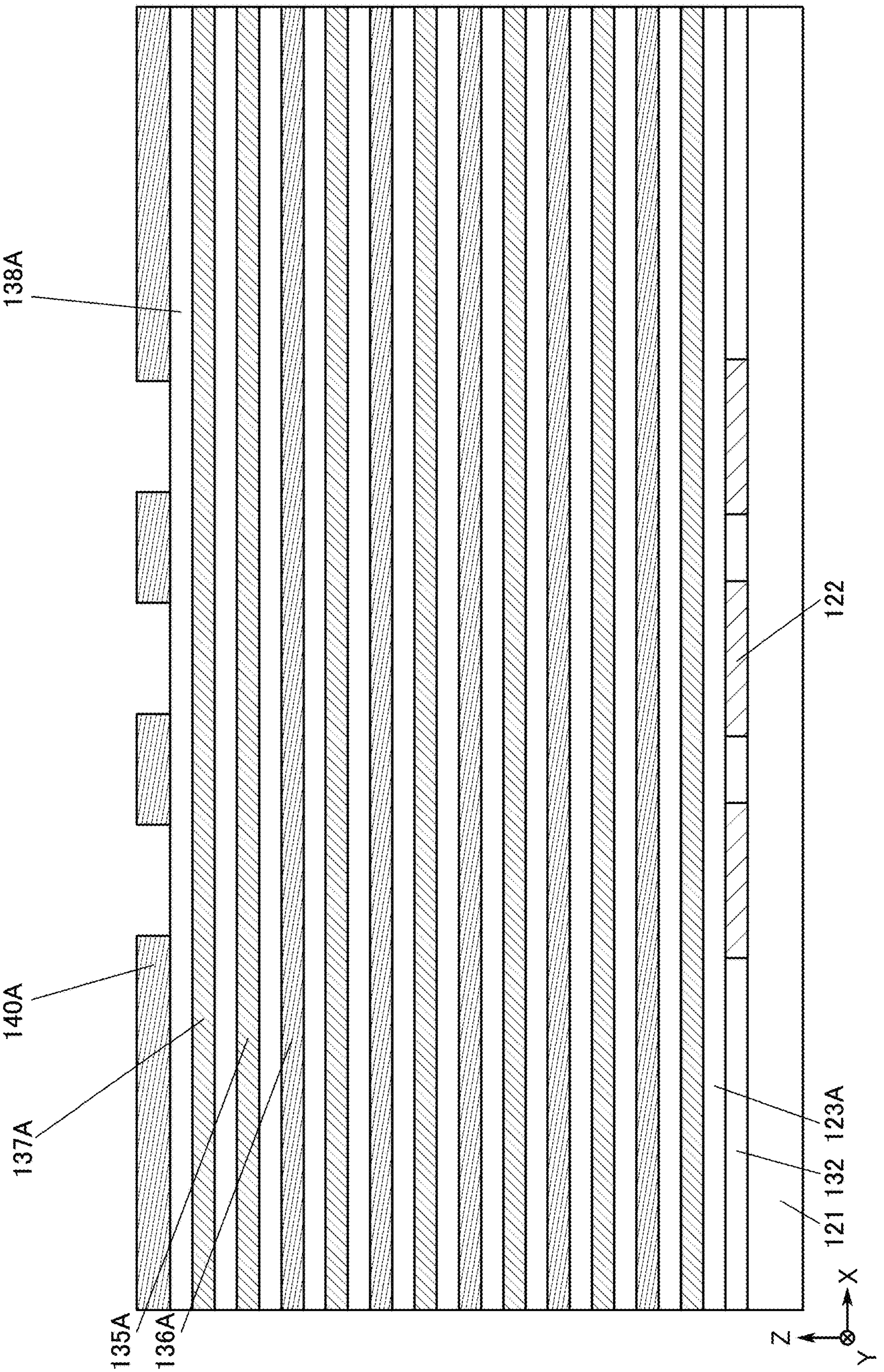
FIG. 10 is a cross-sectional view illustrating manufacturing steps of a semiconductor device of one embodiment of the present invention.

First, the conductor 122 is formed over the substrate 121 having an insulating surface, and an insulator 132 is formed around the conductor 122 (see FIG. 10).

Specifically, a conductive film is formed and processed by a lithography method, whereby the conductor 122 is formed. Then, an insulating film is formed over the substrate 121 so as to cover the conductor 122. Next, the insulating film is preferably subjected to planarization treatment. In the planarization treatment, the insulating film is preferably polished until a surface of the conductor 122 is exposed. By the above-described method, the insulator 132 can be formed. Note that the method for forming the conductor 122 and the insulator 132 is not limited to this method. The insulator 132 may be formed over the substrate 121 and an unnecessary portion of the insulator 132 may be removed to form a groove or an opening, and the conductor 122 may be embedded in the groove or the opening. Such a formation method of the conductor is referred to as a damascene method (a single damascene method or a dual damascene method) in some cases. By the above-described method, the structure illustrated in FIG. 10 can be obtained.

The conductor 122 and the insulator 132 can be formed by a sputtering method, a CVD method, a molecular beam epitaxy (MBE) method, a pulsed laser deposition (PLD) method, an ALD method, or the like.

Note that the CVD method can be classified into a plasma CVD (PECVD: plasma Enhanced CVD) method using plasma, a thermal CVD (TCVD) method using heat, a photo CVD method using light, and the like. Moreover, the CVD method can be classified into a metal CVD (MCVD) method and a metal organic CVD (MOCVD) method depending on a source gas to be used.

A high-quality film can be obtained at a relatively low temperature by a plasma CVD method. Furthermore, a thermal CVD method is a deposition method that does not use plasma and thus enables less plasma damage to an object to be processed. For example, a wiring, an electrode, an element (a transistor, a capacitor, or the like), or the like included in a semiconductor device might be charged up by receiving charge from plasma. In that case, accumulated charge might break the wiring, the electrode, the element, or the like included in the semiconductor device. In contrast, such plasma damage does not occur in the case of a thermal CVD method, which does not use plasma, and thus the yield of the semiconductor device can be increased. In addition, a thermal CVD method does not cause plasma damage during deposition, so that a film with few defects can be obtained.

An ALD method is also a deposition method that causes less plasma damage to an object. An ALD method also does not cause plasma damage during deposition, so that a film with few defects can be obtained.

Unlike a deposition method in which particles ejected from a target or the like are deposited, a CVD method and an ALD method are deposition methods in which a film is formed by reaction at a surface of an object to be processed. Thus, a CVD method and an ALD method are deposition methods that enable favorable step coverage almost regardless of the shape of an object to be processed. In particular, an ALD method has excellent step coverage and excellent thickness uniformity and thus is suitable for covering a surface of an opening portion with a high aspect ratio, for example. On the other hand, an ALD method has a relatively low deposition rate, and thus is preferably used in combination with another deposition method with a high deposition rate, such as a CVD method, in some cases.

By a CVD method a film with a certain composition can be formed depending on the flow rate ratio of the source gases. For example, a CVD method enables a film with a gradually-changed composition to be formed by changing the flow rate ratio of the source gases during film formation. In the case of forming a film while changing the flow rate ratio of the source gases, as compared with the case of forming a film with use of a plurality of deposition chambers, the time taken for the deposition can be shortened by the time taken for transfer and pressure adjustment. Thus, the productivity of the semiconductor device can be increased in some cases.

By an ALD method, a film having a given composition can be formed by introducing a plurality of precursors with different compositions at the same time or controlling the cycle number of each of the precursors with different compositions.

Note that in a lithography method, first, a resist is exposed to light through a photomask. Next, a region exposed to light is removed or left using a developer, so that a resist mask is formed. Then, etching treatment through the resist mask is conducted, whereby a conductor, a semiconductor, an insulator, or the like can be processed into a desired shape. The resist mask is formed through, for example, exposure of the resist to KrF excimer laser light, ArF excimer laser light, EUV (Extreme Ultraviolet) light, or the like. Alternatively, a liquid immersion technique may be employed, in which a gap between a substrate and a projection lens is filled with liquid (e.g., water) in light exposure. An electron beam or an ion beam may be used instead of the above-described light. Note that a photomask is not necessary in the case of using an electron beam or an ion beam. Note that the resist mask can be removed by dry etching treatment such as ashing, wet etching treatment, wet etching treatment after dry etching treatment, or dry etching treatment after wet etching treatment.

In addition, a hard mask formed of an insulator or a conductor may be used instead of the resist mask. In the case where a hard mask is used, a hard mask with a desired shape can be formed by forming an insulating film or a conductive film to be the hard mask material over the conductive film, forming a resist mask thereover, and then etching the hard mask material.

A dry etching method or a wet etching method can be employed for the processing. Processing by a dry etching method is suitable for microfabrication.

As a dry etching apparatus, a capacitively coupled plasma (CCP) etching apparatus including parallel plate electrodes can be used. The capacitively coupled plasma etching apparatus including the parallel plate electrodes may have a structure in which a high-frequency power is applied to one of the parallel plate electrodes. Alternatively, a structure may be employed in which different high-frequency powers are applied to one of the parallel plate electrodes. Alternatively, a structure may be employed in which high-frequency powers with the same frequency are applied to the parallel plate electrodes. Alternatively, a structure may be employed in which high-frequency powers with different frequencies are applied to the parallel plate electrodes. Alternatively, a dry etching apparatus including a high-density plasma source can be used. As the dry etching apparatus including a high-density plasma source, an inductively coupled plasma (ICP) etching apparatus or the like can be used, for example.

In the case where a hard mask is used for etching of the conductive film, the etching treatment may be performed after the resist mask used for the formation of the hard mask is removed or with the resist mask left. In the latter case, the resist mask is sometimes removed during the etching. The hard mask may be removed by etching after the etching of the conductive film. Meanwhile, the hard mask does not necessarily need to be removed when the hard mask material does not affect subsequent steps or can be utilized in subsequent steps.

As a conductive film to be the conductor 122, a conductive film containing a metal element is preferably formed by a sputtering method. The conductive film can also be formed by a CVD method.

A surface of the insulator 132 is preferably subjected to planarization treatment as needed. As the planarization treatment, a chemical mechanical polishing (CMP) method or a reflow method can be employed.

Insulating films 123A, insulating films 135A, and conductive films 136A are alternately stacked over the conductor 122 and the insulator 132. In this embodiment, an example where the insulating films 123A is formed over the insulator 132, the insulating film 135A is formed over the insulating film 123A, the insulating film 123A is formed over the insulating film 135A, and the conductive film 136A is formed over the insulating film 123A is described (see FIG. 10). A CVD method can be employed to form the insulating films 135A, the conductive films 136A, and the insulating films 123A. Alternatively, a sputtering method may be employed.

For the conductor 122 and the conductive films 136A, a conductive material such as silicon to which an impurity is added or a metal can be used. A material that can be selectively etched against the conductor 122 and the insulating films 135A is preferably used for the conductive films 136A because the conductive films 136A need to be selectively etched against the conductor 122 and the conductive films 135A in a later step. In the case where silicon is used for the conductor 122 or the conductive films 136A, amorphous silicon or polysilicon can be used. A p-type impurity or an n-type impurity may be added to give a conducting property to silicon. Silicide containing titanium, cobalt, or nickel, which is a conductive material containing silicon, can be used for the conductor 122 or the conductive films 136A. In the case where a metal material is used for the conductor 122 or the conductive films 136A, a material containing one or more kinds of metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, and the like can be used.

An insulating oxide, an insulating nitride, an insulating oxynitride, an insulating nitride oxide, an insulating metal oxide, an insulating metal oxynitride, an insulating metal nitride oxide, or the like can be used for the insulator 132, the insulating films 135A, and the insulating films 123A. It is possible to use silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide or resin, aluminum oxide, gallium oxide, hafnium oxide, zirconium oxide, an oxide containing aluminum and hafnium, an oxynitride containing aluminum and hafnium, an oxide containing silicon and hafnium, an oxynitride containing silicon and hafnium, a nitride containing silicon and hafnium, or the like.

A material that can be selectively etched against the insulator 132 and the insulating films 123A is preferably used for the insulating films 135A because the insulating films 135A need to be selectively etched against the insulator 132 and the insulating films 123A in a later step. For example, silicon oxide or silicon oxynitride is preferably used as the insulator 132 and the insulating films 123A, and silicon nitride or silicon nitride oxide is preferably used as the insulating films 135A.

Although an example where twelve insulating films 123A, six insulating films 135A, and five conductive films 136A are formed is described in this embodiment, the number of stacked layers is not limited thereto. Each of the films can be formed in accordance with the required performance of the semiconductor device. Assuming that the number of stacked insulating films 135A is m (m is an integer greater than or equal to 2), the number of stacked insulating films 123A is 2×m and the number of stacked conductive films 136A is m−1. For example, m can be greater than or equal to 33, preferably greater than or equal to 65, further preferably greater than or equal to 129, still further preferably greater than or equal to 257.

An insulating film 137A is formed over the uppermost insulating film 123A, and an insulating film 138A is formed over the insulating film 137A. The insulating film 137A can be formed using a method and a material similar to those of the insulating films 135A. Furthermore, the insulating film 138A can be formed using a method and a material similar to those of the insulating films 123A. A mask 140A is formed over the insulating film 138A.

Figure 11:
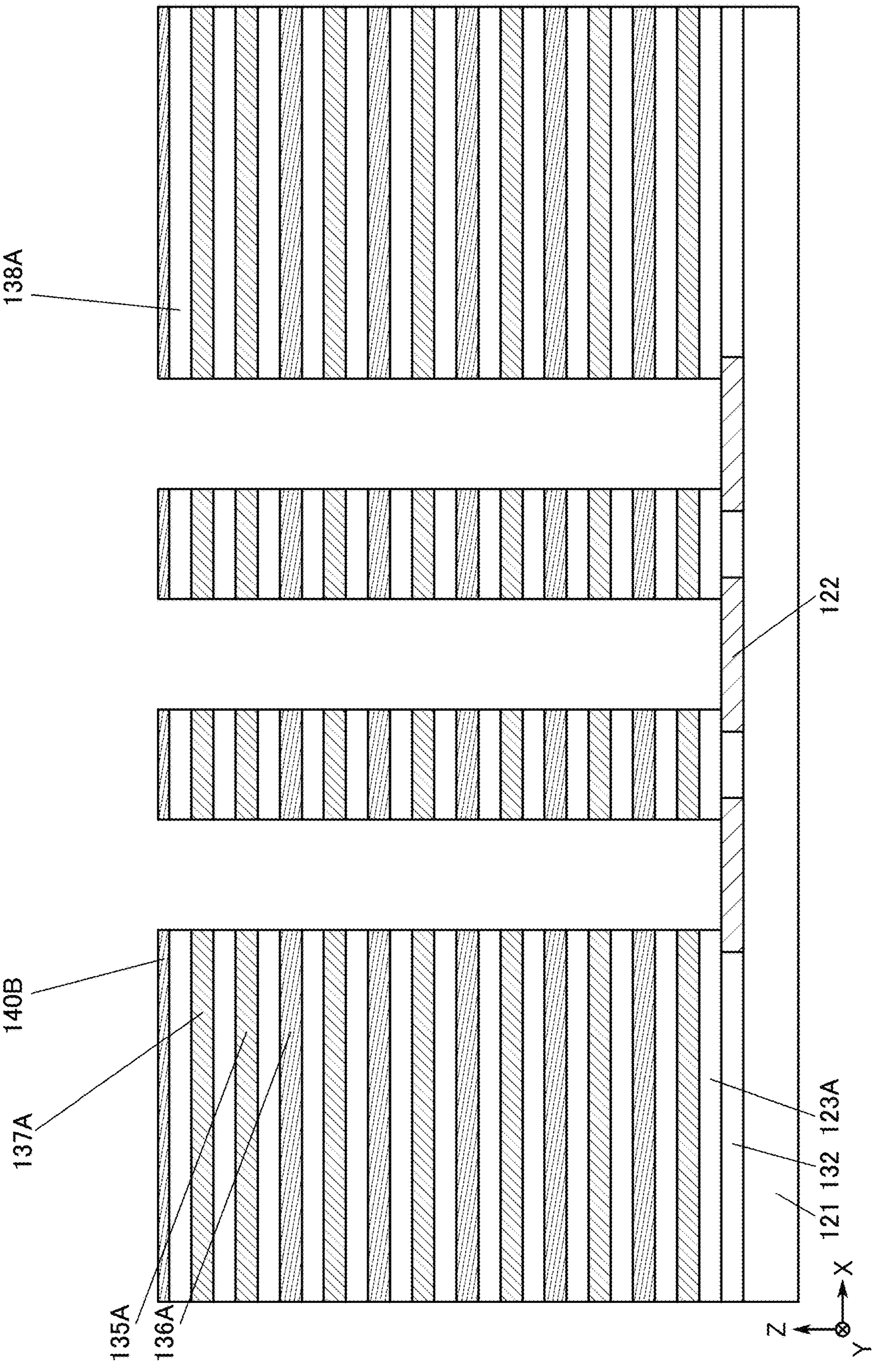
FIG. 11 is a cross-sectional view illustrating manufacturing steps of the semiconductor device of one embodiment of the present invention.

Next, the insulating film 138A, the insulating film 137A, the insulating films 123A, the insulating films 135A, and the conductive films 136A are processed using the mask 140A to form first openings exposing the conductor 122 (see FIG. 11). The mask 140A is etched by the processing to become a mask 140B in some cases.

Figure 12:
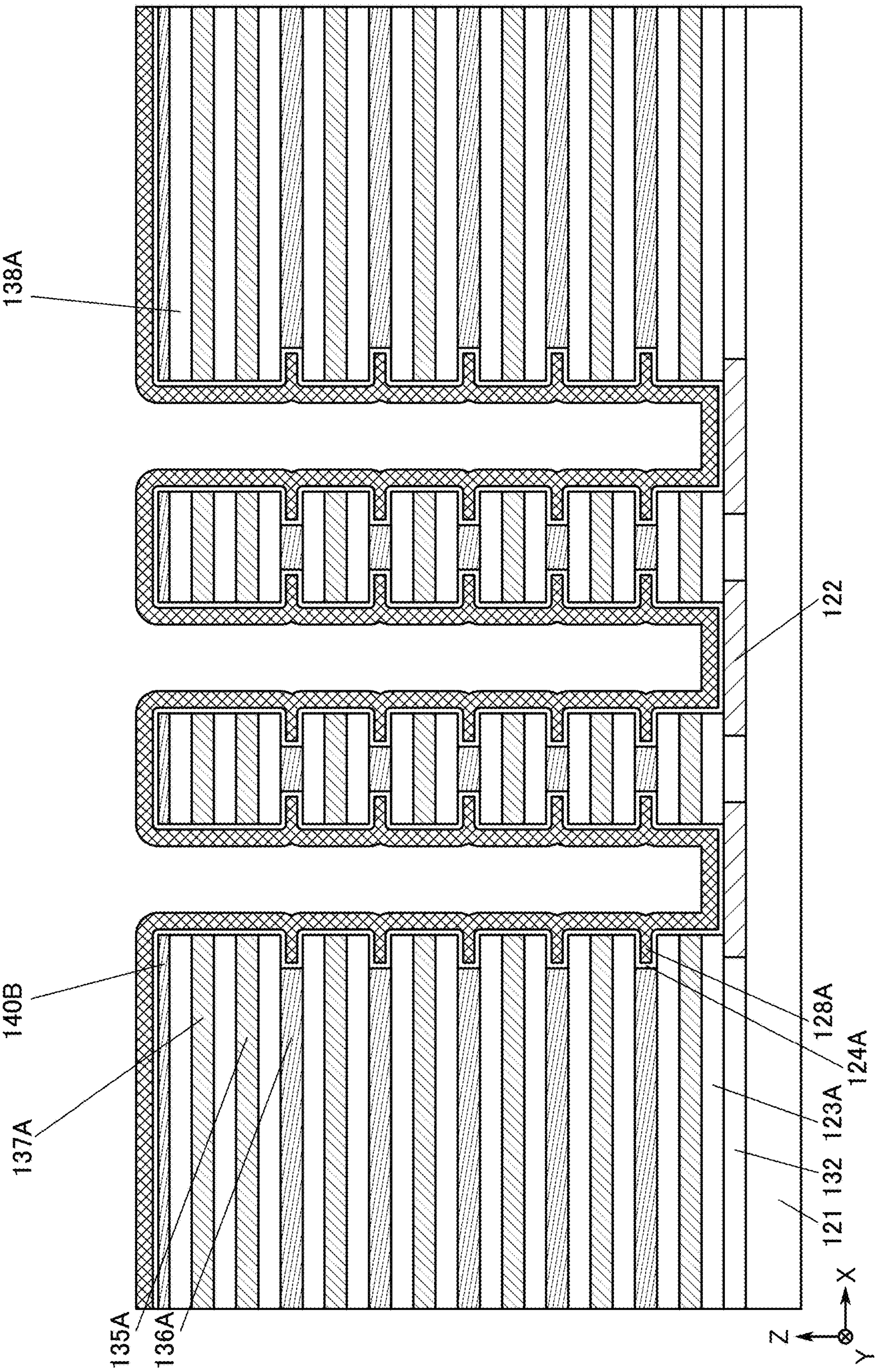
FIG. 12 is a cross-sectional view illustrating manufacturing steps of the semiconductor device of one embodiment of the present invention.

Next, isotropic etching is performed on the conductive films 136A to increase the diameters of openings of the conductive films 136A (see FIG. 12). By this treatment, the diameter of each of the openings of the conductive films 136A becomes larger than the diameters of the openings of the insulating film 138A, the insulating film 137A, the insulating films 123A, and the insulating films 135A. The conductive film 136A can be regarded as being depressed against a side surface of the insulating film 138A, the insulating film 137A, the insulating film 123A, or the insulating film 135A positioned over or under the conductive film 136A. As such processing, isotropic etching using dry etching with a gas, a radical, plasma, or the like, or isotropic etching using wet etching with a liquid can be used. A liquid used in wet etching may be referred to as an etchant. In the case where isotropic etching is performed using dry etching, a gas, a radical, plasma, or the like containing at least one of chlorine, bromine, and fluorine can be used. Isotropic etching is preferably performed without removal of the mask used for the formation of the first openings. The first opening obtained by the above treatment corresponds to the opening 141 illustrated in FIG. 3.

Next, an insulating film 124A and a conductive film 128A are formed over the insulating film 138A and the mask 140B and in the first openings (see FIG. 12). Although not illustrated, the insulating film 124A may have a stacked-layer structure. The insulating film 124A can be formed by a CVD method or an ALD method. It is particularly preferable to employ an ALD method, in which case a film with a uniform thickness can be formed even in a groove or an opening having a high aspect ratio.

It is also preferable to employ a PEALD method, in which case the insulating film 124A can be formed at a low temperature compared with the case of employing a thermal ALD method. For example, the insulating film 124A is preferably formed by a PEALD method using a gas containing silicon as a precursor and an oxidizing gas as a reactant. As the gas containing silicon, $SiH_4$, $SiF_4$, $SiH_2Cl_2$, $SiCl_4$, or the like can be used. In particular, $SiH_4$ is preferably used. As an oxidizing gas, $O_2$, $O_3$, $N_2O$, $NO_2$, or the like can be used. In particular, $N_2O$ is preferably used. A rare gas such as helium, neon, argon, krypton, or xenon may be added to the reactant. In the case where the insulating film 124A has a stacked-layer structure, insulating films may be formed in the same deposition apparatus or different deposition apparatuses. Alternatively, the insulating film 124A may be formed by a combination of an ALD method and a CVD method.

The insulating film 124A formed by the above-described method has high coverage and can also be formed in the depressed portions of the conductive films 136A. In other words, the insulating film 124A can be formed in contact with not only side surfaces of the insulating films 123A, the insulating films 135A, and the conductive films 136A but also part of the top surface and part of the bottom surfaces of the insulating films 123A.

The carbon concentration in the insulating film 124A measured by SIMS is preferably higher than or equal to $1\times10^{18}$ atoms/cm$^3$ and lower than or equal to $5\times10^{20}$ atoms/cm$^3$, further preferably higher than or equal to $5\times10^{18}$ atoms/cm$^3$ and lower than or equal to $1\times10^{20}$ atoms/cm$^3$. The insulating film 124A also contains nitrogen, and the nitrogen concentration therein measured by SIMS is preferably higher than or equal to $3\times10^{19}$ atoms/cm$^3$ and lower than or equal to $1\times10^{21}$ atoms/cm$^3$, further preferably higher than or equal to $1\times10^{19}$ atoms/cm$^3$ and lower than or equal to $2\times10^{20}$ atoms/cm$^3$.

Thus, the concentration of In contained in the insulating film 124A is preferably lower than or equal to $1.0\times10^{19}$ atoms/cm$^3$, further preferably lower than or equal to $1.0\times10^{18}$ atoms/cm$^3$, still further preferably lower than or equal to $1.0\times10^{17}$ atoms/cm$^3$.

The conductive film 128A is at least formed to fill the depressed portions of the conductive films 136A with the insulating film 124A positioned between the conductive film 128A and the conductive films 136A, and need not entirely fill the inside of the first openings. The conductive film 128A can be formed by a CVD method or an ALD method. It is particularly preferable to employ an ALD method, in which case a film with a uniform thickness can be formed even in a groove or an opening having a high aspect ratio. Alternatively, the conductive film 128A may be formed by a combination of an ALD method and a CVD method.

Figure 13:
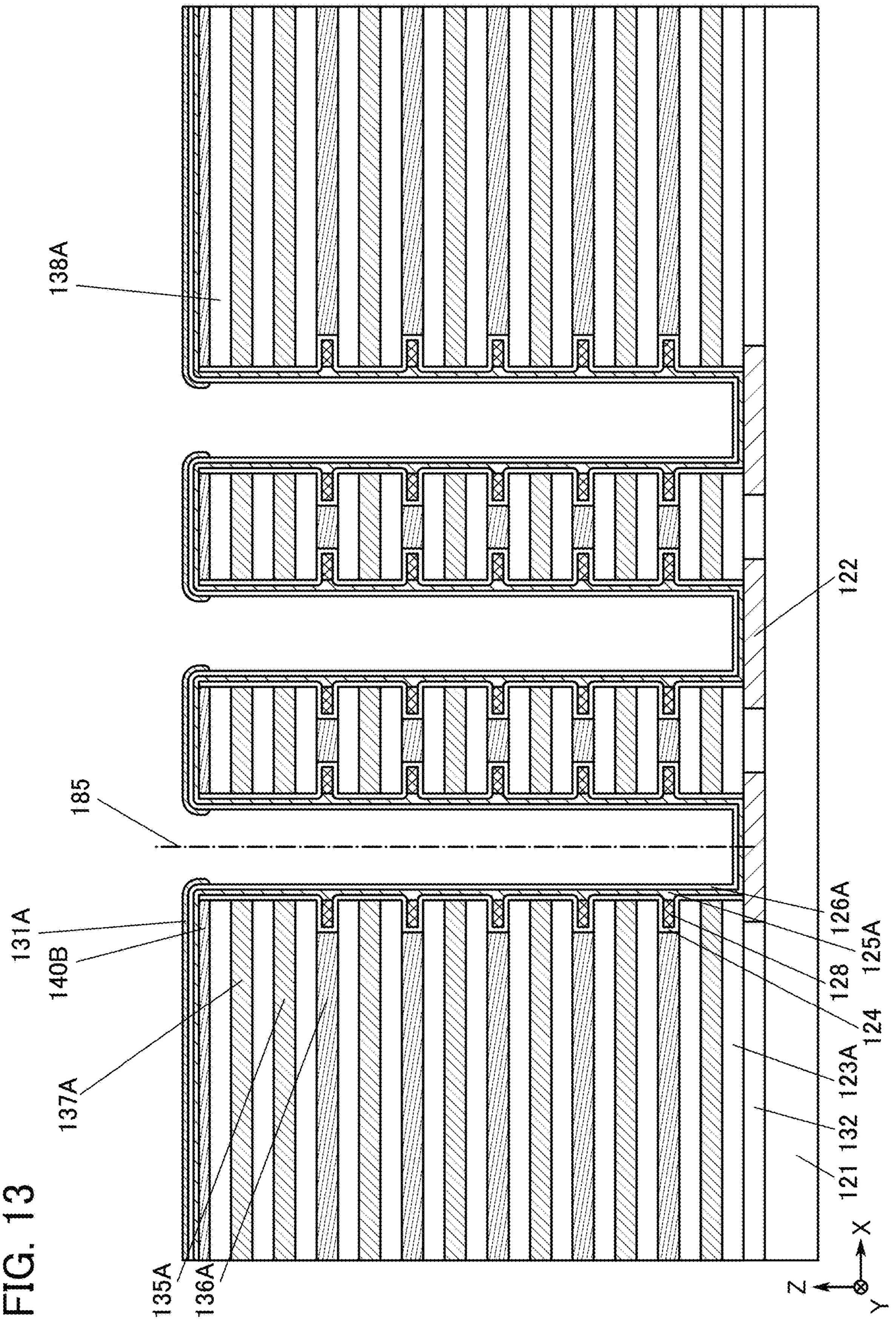
FIG. 13 is a cross-sectional view illustrating manufacturing steps of the semiconductor device of one embodiment of the present invention.

Next, the conductive film 128A is processed to form the conductors 128 (see FIG. 13). For the processing of the conductive film 128A, isotropic etching or anisotropic etching can be used. In the case where the formed conductive film 128A fills the depressed portions and does not completely fill the first openings as illustrated in FIG. 12, isotropic etching is preferably used for the processing of the conductive film 128A. By contrast, in the case where the conductive film 128A is formed to fill the depressed portions and the first openings, anisotropic etching is preferably used.

By the above-described processing, the conductors 128 can be formed inside the depressed portions.

Then, the insulating film 124A formed in bottom portions of the first openings is removed to obtain the insulators 124. Anisotropic etching is preferably used to remove the insulating film 124A. At this time, the insulating film 124A over the insulating film 138A and the mask 140B are also removed; thus, the insulators 124 are provided only on the sidewalls of the first openings (see FIG. 13). The conductor 122 is exposed again by removal of the insulating film 124A in the bottom portions of the first openings.

Then, a semiconductor film 125A is formed in the first openings so as to be in contact with the conductor 122 (see FIG. 13). The semiconductor film 125A can be formed by a CVD method or an ALD method. It is particularly preferable to employ an ALD method, in which case a film with a uniform thickness can be formed even in a groove or an opening having a high aspect ratio. It is also preferable to employ a PEALD method, in which case the semiconductor film 125A can be formed at a low temperature compared with the case of employing a thermal ALD method. Alternatively, the semiconductor film 125A may be formed by a combination of an ALD method and a CVD method. The semiconductor film 125A is preferably an oxide semiconductor having a CAAC structure. In the case where the semiconductor film 125A is an oxide semiconductor having a CAAC structure, c-axes of the semiconductor film 125A are aligned in the direction normal to a surface on which the semiconductor film 125A is formed, in the first opening. In this case, c-axes of the semiconductor film 125A positioned on the side surfaces of the insulating film 138A, the insulating film 137A, the insulating films 123A, the insulating films 135A, and the conductive films 136A with the insulators 124 therebetween are aligned toward an axis 185 illustrated in FIG. 13 from the surface on which the semiconductor film 125A is formed. Note that the axis 185 can be referred to as a central axis of the first opening. Thus, the c-axes of the semiconductors 125 positioned as described above are aligned toward the axis 185 from the surface on which the semiconductors 125 are formed.

Here, in the case where a metal oxide is formed as the semiconductor film 125A by an ALD method, an In—Ga—Zn oxide is preferably formed using a precursor containing indium, a precursor containing gallium, and a precursor containing zinc. Alternatively, an In—Ga—Zn oxide may be formed using a precursor containing indium and gallium and a precursor containing zinc.

As the precursor containing indium, triethylindium, trimethylindium, tris(2,2,6,6-tetramethyl-3,5-heptanedione acid) indium, cyclopentadienylindium, indium (III) chloride, or the like can be used. As the precursor containing gallium, trimethylgallium, triethylgallium, tris(dimethylamide)gallium, gallium(III) acetylacetonate, tris(2,2,6,6-tetramethyl-3,5-heptanedione acid)gallium, dimethylchlorogallium, diethylchlorogallium, gallium(III) chloride, or the like can be used. As the precursor containing zinc, dimethylzinc, diethylzinc, bis(2,2,6,6,tetramethyl-3,5-heptanedione acid) zinc, zinc chloride, or the like can be used.

Next, an insulating film 126A is formed more inward than the semiconductor film 125A (see FIG. 13).

The insulating film 126A can be formed by a CVD method or an ALD method. It is particularly preferable to employ an ALD method, in which case a film with a uniform thickness can be formed even in a groove or an opening having a high aspect ratio. It is also preferable to employ a PEALD method, in which case the insulating film 126A can be formed at a low temperature compared with the case of employing a thermal ALD method. Alternatively, the insulating film 126A may be formed by a combination of an ALD method and a CVD method.

For example, the insulating film 126A can be formed by a method similar to that for the insulating film 124A. For example, the insulating film 126A is preferably formed by a PEALD method using a gas containing silicon as a precursor and an oxidizing gas as a reactant. As the gas containing silicon, $SiH_4$, $SiF_4$, $SiH_2Cl_2$, or the like can be used. In particular, $SiH_4$ is preferably used. As an oxidizing gas, $O_2$, $O_3$, $N_2O$, $NO_2$, or the like can be used. In particular, $N_2O$ is preferably used. A rare gas such as helium, neon, argon, krypton, or xenon may be added to the reactant.

The carbon concentration in the insulating film 126A measured by SIMS is preferably higher than or equal to $1\times10^{18}$ atoms/cm$^3$ and lower than or equal to $5\times10^{20}$ atoms/cm$^3$, further preferably higher than or equal to $5\times10^{18}$ atoms/cm$^3$ and lower than or equal to $1\times10^{20}$ atoms/cm$^3$. The insulating film 126A also contains nitrogen, and the nitrogen concentration therein measured by SIMS is preferably higher than or equal to $3\times10^{19}$ atoms/cm$^3$ and lower than or equal to $1\times10^{21}$ atoms/cm$^3$, further preferably higher than or equal to $1\times10^{19}$ atoms/cm$^3$ and lower than or equal to $2\times10^{20}$ atoms/cm$^3$.

Thus, the concentration of In contained in the insulating film 126A is preferably lower than or equal to $1.0\times10^{19}$ atoms/cm$^3$, further preferably lower than or equal to $1.0\times10^{18}$ atoms/cm$^3$, still further preferably lower than or equal to $1.0\times10^{17}$ atoms/cm$^3$.

Next, an insulator 131A is formed on the top surface of the insulating film 126A. The insulator 131A is preferably formed selectively so as not to be formed in the first openings. Alternatively, the insulator 131A may be formed on the top surface of the insulating film 126A and in the first openings, a mask may be formed over the top surface of the insulating film 126A with the insulator 131A therebetween, and the insulator 131A in the first openings may be removed selectively. As the insulator 131A, silicon nitride is preferably used. A PECVD method is preferably used to selectively form the insulator 131A on the top surface of the insulating film 126A. A mixed gas containing $SiH_4$ and $N_2$ is preferably used as a deposition gas, in which case the insulator 131A is inhibited from being formed in the first openings. When $NH_3$ is contained in the mixed gas, the insulator 131A is easily formed in the first openings; for this reason, it is preferable that $NH_3$ not be contained in the mixed gas. In the case where $N_2$ and $NH_3$ are contained in the mixed gas, the mixing rate of $NH_3$ is preferably 10% or lower, further preferably 5% or lower, still further preferably 1% or lower of the mixing rate of $N_2$. When the ratio (flow rate ratio) of $N_2$ to $SiH_4$ in the mixed gas is low, the amount of nitrogen contained in the insulator 131A is decreased, resulting in formation of amorphous silicon in some cases. For this reason, the ratio (flow rate ratio) of $N_2$ to $SiH_4$ is preferably greater than or equal to 100.

Next, the resistance of part of the semiconductor film 125A is increased to form a high-resistance region (i-type region). In a formation method of the high-resistance regions, irradiation of the semiconductor film 125A with microwaves is performed to remove hydrogen contained in the semiconductor film 125A. The microwave irradiation is preferably performed in an atmosphere containing oxygen, in which case oxygen is supplied to the semiconductor film 125A. In this embodiment, the semiconductor film 125A is irradiated with the microwaves in an atmosphere containing oxygen and argon, whereby the resistance of the semiconductor film 125A is increased. At this time, the resistance value of a region of the semiconductor film 125A that is in contact with the conductors 128 remains low in some cases.

During the microwave treatment, thermal energy might be directly transferred to the semiconductor film 125A owing to electromagnetic interaction between the microwaves and the molecules in the semiconductor film 125A. The semiconductor film 125A might be heated by this thermal energy. Such heat treatment is sometimes referred to as microwave annealing. When microwave treatment is performed in an atmosphere containing oxygen, an effect equivalent to that of oxygen annealing might be obtained. In the case where hydrogen is contained in the semiconductor film 125A, it is probable that the thermal energy is transmitted to the hydrogen in the semiconductor film 125A and the hydrogen activated by the energy is released from the semiconductor film 125A.

Here, heat treatment may be performed. The heat treatment is preferably performed in an atmosphere containing nitrogen at higher than or equal to 200° C. and lower than or equal to 500° C., preferably higher than or equal to 300° C. and lower than or equal to 400° C. The atmosphere in which the heat treatment is performed is not limited to the above atmosphere as long as at least one of nitrogen, oxygen, and argon is contained. The heat treatment may be performed in a reduced-pressure atmosphere or in an atmospheric pressure atmosphere.

The resistance of the semiconductor film 125A in contact with the conductors 128 can be decreased by heat treatment, so that a low-resistance region (N-type region) can be formed. The heat treatment performed in the state where the semiconductor film 125A and the conductors 128 are in contact with each other sometimes forms a metal compound layer containing a metal element contained in the conductors 128 and a component of the semiconductor film 125A at interfaces between the conductors 128 and the semiconductor film 125A. The metal compound layer is preferably formed, in which case the resistance of the semiconductor film 125A in the region in contact with the conductors 128 is reduced. In addition, oxygen contained in the semiconductor film 125A is absorbed by the conductors 128 in some cases. The heat treatment performed in the state where the semiconductor film 125A and the conductors 128 are in contact with each other further reduces the resistance of the semiconductor film 125A. The semiconductor film 125A is made to be a CAAC-OS or an nc-OS by the heat treatment in some cases. In addition, the crystallinity of the semiconductor film 125A is improved in some cases. The heat treatment may also be performed before the microwave treatment. Incidentally, the above-described microwave treatment, i.e., microwave annealing, may double as this heat treatment. The heat treatment does not need to be performed in the case where the semiconductor film 125A and the like are sufficiently heated by microwave annealing.

The carrier concentration of the semiconductor film 125A after the above-described microwave treatment and heat treatment is preferably lower than $1\times10^{18}/cm^3$, further preferably lower than or equal to $1\times10^{17}/cm^3$, still further preferably lower than or equal to $1\times10^{16}/cm^3$. The carrier concentration of the region of the semiconductor film 125A that is in contact with the conductors 128 is preferably higher than or equal to $1\times10^{18}/cm^3$, further preferably higher than or equal to $1\times10^{19}/cm^3$, still further preferably higher than or equal to $1\times10^{20}/cm^3$.

Note that although the treatment of increasing the resistance of the semiconductor film 125A is performed after the formation of the insulating film 126A in the above example, this embodiment is not limited to the example. The treatment of increasing the resistance may be performed before the formation of the insulating film 126A.

Next, the semiconductor film 125A and the insulating film 126A that are formed in the bottom portions of the first openings are removed to obtain a semiconductor 125B and an insulator 126B. The semiconductor film 125A and the insulating film 126A are preferably removed by anisotropic etching using the insulator 131A as a mask. In that case, the semiconductor film 125A and the insulating film 126A over the insulating film 138A and the mask 140B are not removed because they are covered with the insulator 131A (see FIG. 14). The conductor 122 is exposed again by the removal of the semiconductor film 125A and the insulating film 126A in the bottom portions of the first openings.

Figure 14:
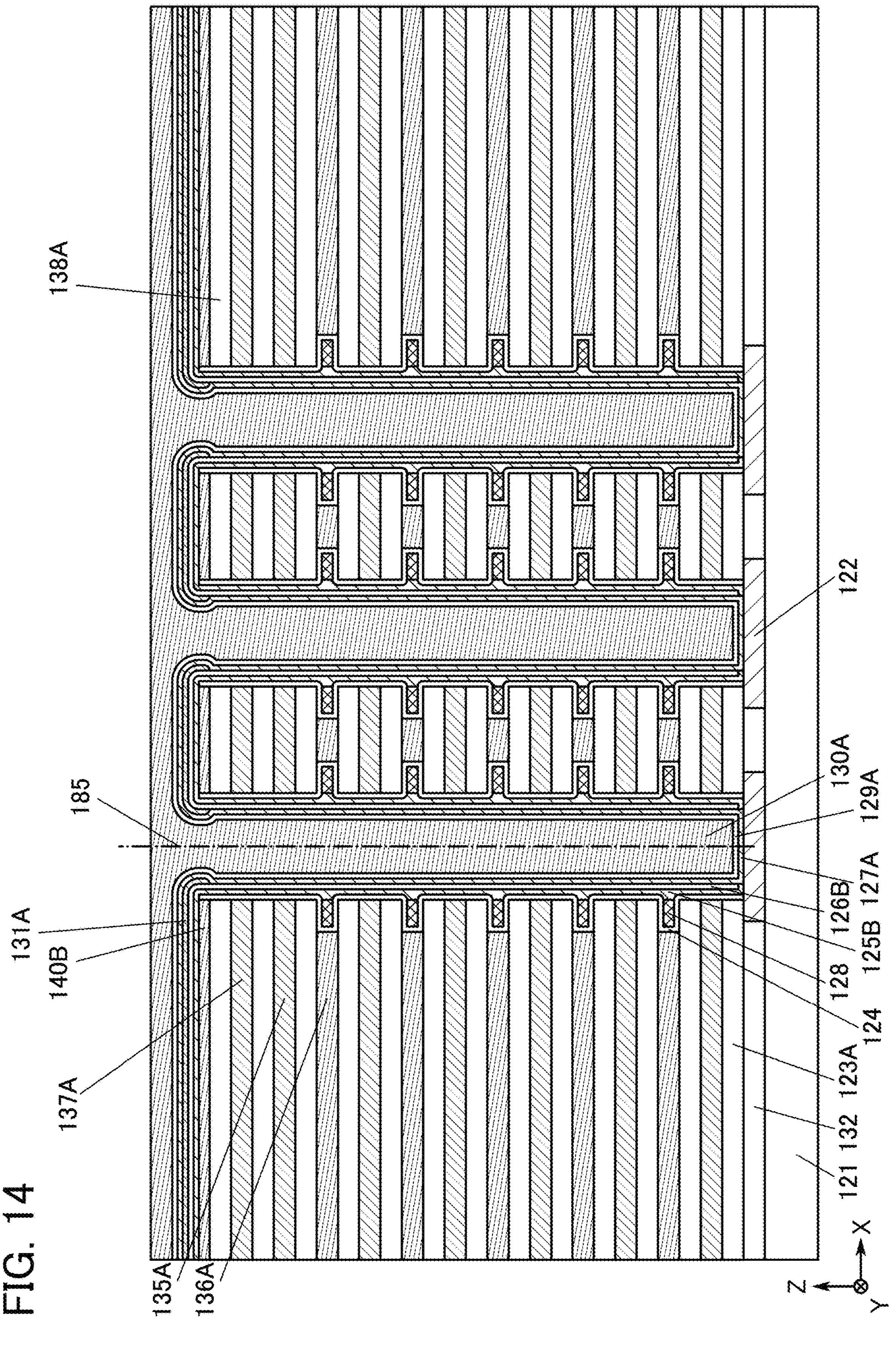
FIG. 14 is a cross-sectional view illustrating manufacturing steps of the semiconductor device of one embodiment of the present invention.

Then, a semiconductor film 127A is formed in the first openings so as to be in contact with the conductor 122 (see FIG. 14). At this time, the semiconductor film 127A is preferably formed so as to be in contact with the semiconductor 125B in the bottom portions of the first openings. The semiconductor film 127A can be formed by a CVD method or an ALD method. It is particularly preferable to employ an ALD method, in which case a film with a uniform thickness can be formed even in a groove or an opening having a high aspect ratio. It is also preferable to employ a PEALD method, in which case the semiconductor film 127A can be formed at a low temperature compared with the case of employing a thermal ALD method. Alternatively, the semiconductor film 127A may be formed by a combination of an ALD method and a CVD method. The semiconductor film 127A is preferably an oxide semiconductor having a CAAC structure. In the case where the semiconductor film 127A is an oxide semiconductor having a CAAC structure, c-axes of the semiconductor film 127A are aligned in the direction normal to a surface on which the semiconductor film 127A is formed, in the first openings. In this case, c-axes of the semiconductor film 127A positioned on the side surfaces of the first openings are aligned toward the axis 185 illustrated in FIG. 14 from the surface on which the semiconductor film 127A is formed. Thus, the c-axes of the semiconductors 127 positioned as described above are aligned toward the axis 185 from the surface on which the semiconductors 127 is formed.

Here, in the case where a metal oxide is formed as the semiconductor film 127A by an ALD method, an In—Ga—Zn oxide is preferably formed using a precursor containing indium, a precursor containing gallium, and a precursor containing zinc.

As the precursor containing indium, triethylindium, tris(2,2,6,6-tetramethyl-3,5-heptanedione acid) indium, cyclopentadienylindium, indium (III) chloride, or the like can be used. As the precursor containing gallium, trimethylgallium, triethylgallium, gallium trichloride, tris(dimethylamide)gallium, gallium(III) acetylacetonate, tris(2,2,6,6-tetramethyl-3,5-heptanedione acid)gallium, dimethylchlorogallium, diethylchlorogallium, gallium(III) chloride, or the like can be used. As the precursor containing zinc, dimethylzinc, diethylzinc, bis(2,2,6,6,tetramethyl-3,5-heptanedione acid) zinc, zinc chloride, or the like can be used.

Next, an insulating film 129A is formed more inward than the semiconductor film 127A and a conductive film 130A is formed more inward than the insulating film 129A (see FIG. 14). The semiconductor film 127A, the insulating film 129A, and the conductive film 130A can be formed by a CVD method or an ALD method. It is preferable to employ a CVD method or an ALD method, in which case a film with a uniform thickness can be formed even in a groove or an opening having a high aspect ratio. Alternatively, the films may be formed by a combination of an ALD method and a CVD method. Alternatively, the films may be formed using different deposition methods or different deposition apparatuses. For example, an ALD method is preferably employed to form the semiconductor film 127A.

It is also preferable to employ a PEALD method for formation of the insulating film 129A, in which case the insulating film 129A can be formed at a low temperature compared with the case of employing a thermal ALD method. The conductive film 130A is preferably formed by a CVD method. In the case where the conductive film 130A has a stacked-layer structure, the first layer of the conductive film 130A may be formed by an ALD method and the second layer of the conductive film 130A may be formed by a CVD method.

For example, the insulating film 129A can be formed by a method similar to that for the insulating film 124A. For example, the insulating film 129A is preferably formed by a PEALD method using a gas containing silicon as a precursor and an oxidizing gas as a reactant. As the gas containing silicon, $SiH_4$, $SiF_4$, $SiH_2Cl_2$, or the like can be used. In particular, $SiH_4$ is preferably used. As an oxidizing gas, $O_2$, $O_3$, $N_2O$, $NO_2$, or the like can be used. In particular, $N_2O$ is preferably used. A rare gas such as helium, neon, argon, krypton, or xenon may be added to the reactant.

The carbon concentration in the insulating film 129A measured by SIMS is preferably higher than or equal to $1\times10^{18}$ atoms/cm$^3$ and lower than or equal to $5\times10^{20}$ atoms/cm$^3$, further preferably higher than or equal to $5\times10^{18}$ atoms/cm$^3$ and lower than or equal to $1\times10^{20}$ atoms/cm$^3$. The insulators also contain nitrogen, and the nitrogen concentration therein measured by SIMS is preferably higher than or equal to $3\times10^{19}$ atoms/cm$^3$ and lower than or equal to $1\times10^{21}$ atoms/cm$^3$, further preferably higher than or equal to $1\times10^{19}$ atoms/cm$^3$ and lower than or equal to $2\times10^{20}$ atoms/cm$^3$.

Thus, the concentration of In contained in the insulating film 129A is preferably lower than or equal to $1.0\times10^{19}$ atoms/cm$^3$, further preferably lower than or equal to $1.0\times10^{18}$ atoms/cm$^3$, still further preferably lower than or equal to $1.0\times10^{17}$ atoms/cm$^3$.

Here, the semiconductor film 127A may be subjected to treatment of increasing resistance similar to that performed on the semiconductor film 125A. In the case where the treatment of increasing resistance is performed on the semiconductor film 127A, the treatment is preferably performed before the formation of the conductive film 130A or before the formation of the insulating film 129A. In the case where the resistance of the semiconductor film 125A can also be increased by the treatment of increasing resistance performed on the semiconductor film 127A, the treatment of increasing resistance in the aforementioned step may be omitted.

Then, heat treatment is performed. The heat treatment is preferably performed in an atmosphere containing nitrogen at higher than or equal to 200° C. and lower than or equal to 500° C., preferably higher than or equal to 300° C. and lower than or equal to 400° C. The atmosphere in which the heat treatment is performed is not limited to the above atmosphere as long as at least one of nitrogen, oxygen, and argon is contained. The heat treatment may be performed in a reduced-pressure atmosphere or in an atmospheric pressure atmosphere. The semiconductor film 127A is made to be a CAAC-OS or an nc-OS by the heat treatment in some cases. In addition, the crystallinity of the semiconductor film 127A is improved in some cases. The heat treatment may be performed by microwave annealing.

For the above treatment of increasing resistance and the above heat treatment, microwave treatment can be employed.

Figure 15:
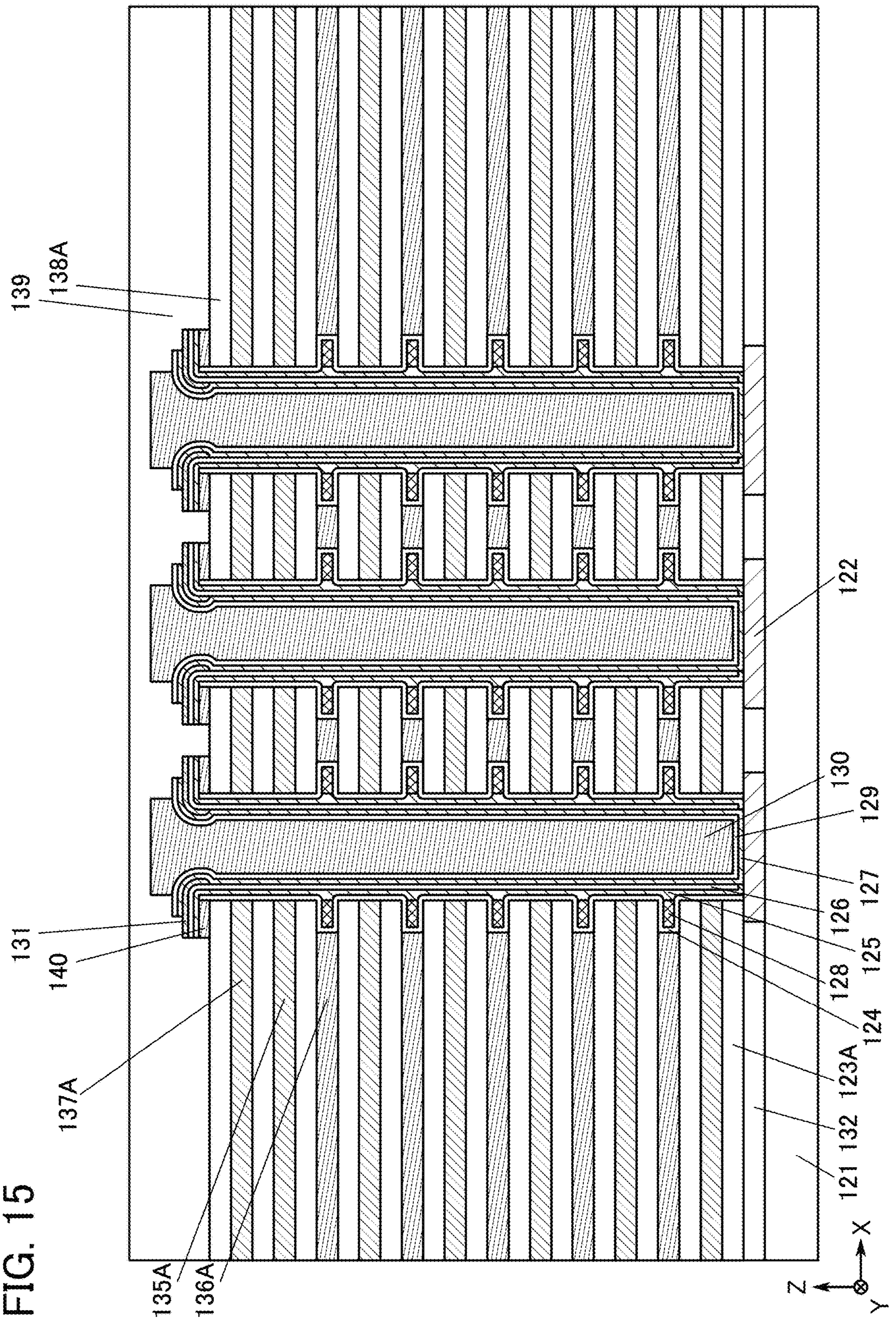
FIG. 15 is a cross-sectional view illustrating manufacturing steps of the semiconductor device of one embodiment of the present invention.

Next, the conductive film 130A, the insulating film 129A, the semiconductor film 127A, the insulator 131A, the insulator 126B, the semiconductor 125B, and the mask 140B are processed to obtain conductors 130, insulators 129, semiconductors 127, insulators 131, insulators 126, semiconductors 125, and masks 140 (see FIG. 15). For the processing, a dry etching method or a wet etching method can be employed. Processing by a dry etching method is suitable for microfabrication. The processing may be performed in the following order: the conductive film 130A is processed, the insulating film 129A and the semiconductor film 127A are processed, and then the insulator 131A, the insulator 126B, the semiconductor 125B, and the mask 140B are processed. In such a processing process, different masks may be formed for processing steps. Alternatively, the conductive film 130A, the insulating film 129A, the semiconductor film 127A, the insulator 131A, the insulator 126B, the semiconductor 125B, and the mask 140B may be processed using a mask for first processing; the conductive film 130A, the insulating film 129A, and the semiconductor film 127A may be processed again for second processing; and then the conductive film 130A may be processed again for third processing. In the second processing and the third processing, a mask obtained by processing the mask used in the first processing or a mask different from that used in the first processing may be formed.

Next, an insulator 139 is formed over the insulating film 138A so as to cover the conductors 130, the insulators 129, the semiconductors 127, the insulators 131, the insulators 126, the semiconductors 125, and the masks 140. The insulator 139 can be formed using a method and a material that can be used to form the insulator 132.

Figure 16:
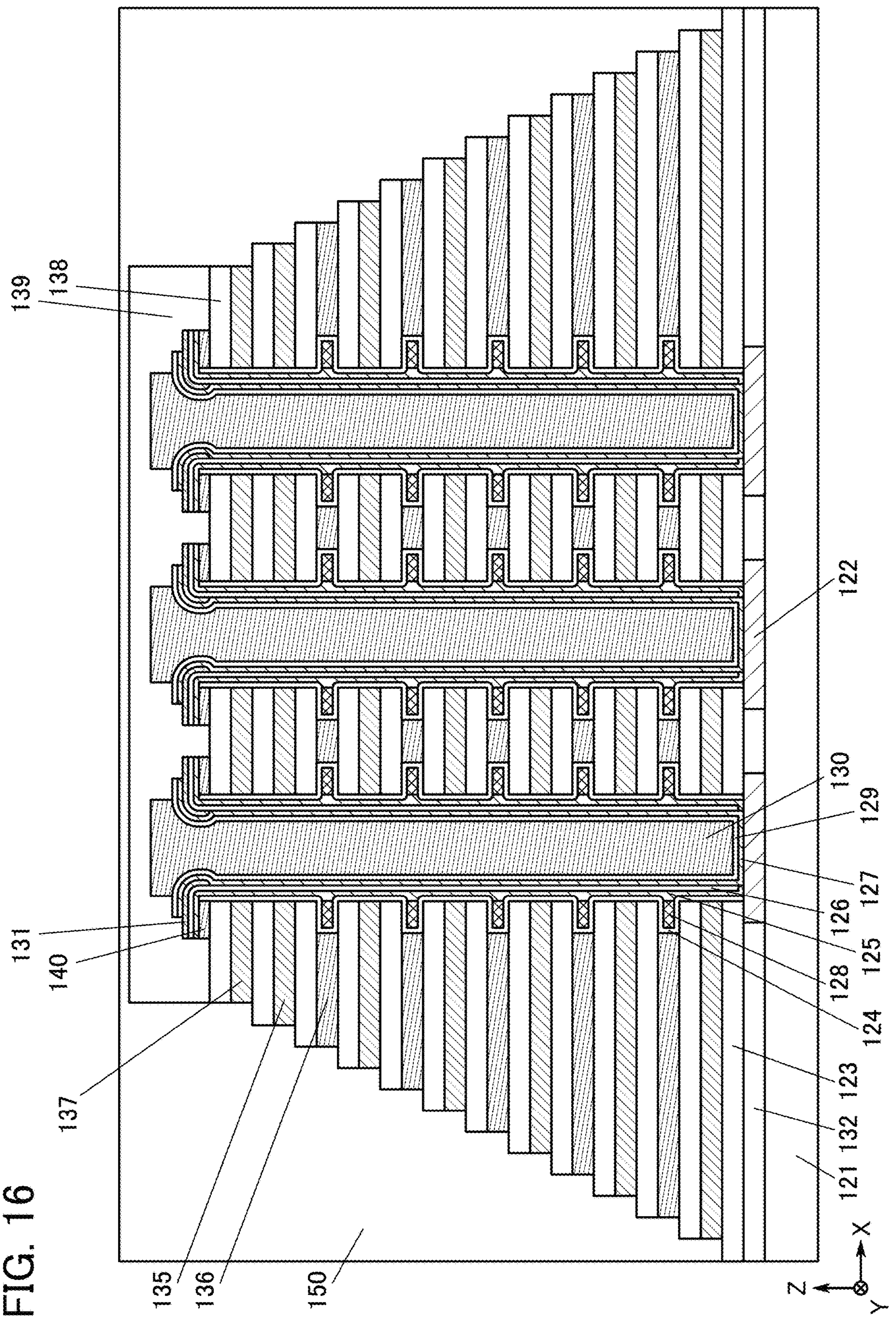
FIG. 16 is a cross-sectional view illustrating manufacturing steps of the semiconductor device of one embodiment of the present invention.

Then, the insulator 139, the insulating film 138A, the insulating film 137A, the insulating films 123A, the insulating films 135A, and the conductive films 136A are processed to form the insulator 139, an insulator 138, an insulator 137, insulators 123, insulators 135, and conductors 136 that have a step-like shape as illustrated in FIG. 16. In the processing of the insulator 139, the insulating film 138A, the insulating film 137A, the insulating films 123A, the insulating films 135A, and the conductive films 136A, etching of the insulator 139, the insulating film 138A, the insulating film 137A, the insulating films 123A, the insulating films 135A, and the conductive films 136A and slimming of a mask are alternately performed, whereby the insulator 139, the insulator 138, the insulator 137, the insulators 123, the insulators 135, and the conductors 136 that have a step-like shape can be formed.

Next, an insulator 150 is formed (see FIG. 16). The insulator 150 can be formed by a CVD method. The insulator 150 is preferably subjected to planarization treatment by a CMP method or a reflow method.

Next, in order to separate the memory strings 120 arranged in the Y direction, the insulator 150, the insulator 139, the insulator 138, the insulator 137, the insulators 123, the insulators 135, and the conductors 136 are processed to form slits. Note that the slits are not illustrated because they are formed in the Y direction of the cross section illustrated in FIG. 16. In addition, the slits are formed so as to extend in the X direction. Furthermore, each of the slits is preferably formed between the memory strings 120 arranged in the Y direction.

Figure 17:
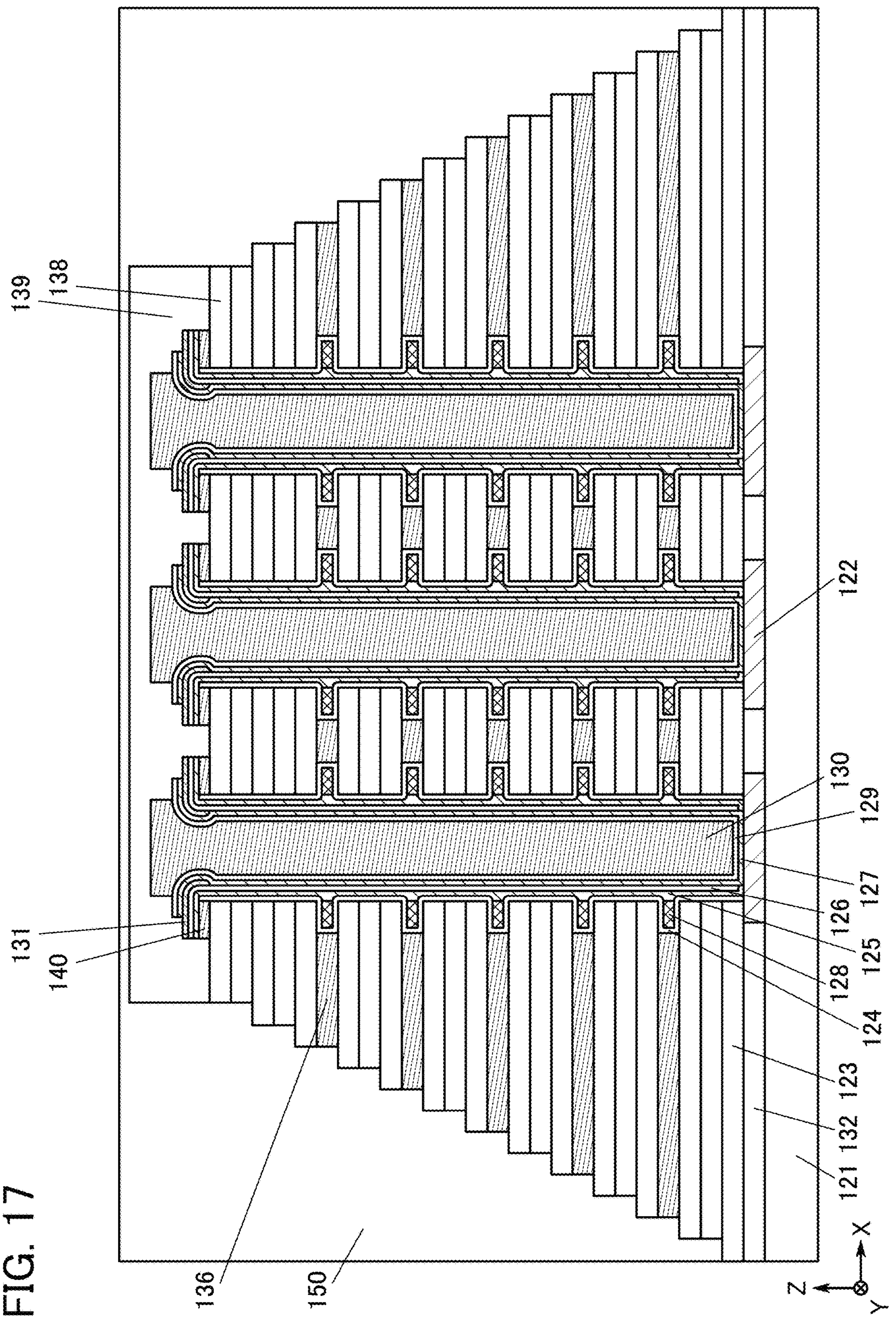
FIG. 17 is a cross-sectional view illustrating manufacturing steps of the semiconductor device of one embodiment of the present invention.

Next, the insulator 137 and the insulators 135 are removed (see FIG. 17). Wet etching or dry etching can be used to remove the insulator 137 and the insulators 135. An etchant used for wet etching or a gas used for dry etching is introduced from the slits, and the insulator 137 and the insulators 135 are removed by isotropic etching. At least one of $CH_3F$, $CH_2F_2$, and $CHF_3$ can be used as an etching gas of the insulator 137 and the insulators 135. Alternatively, a mixed gas containing at least one of the gases given above can be used. As an example of the mixed gas, a mixed gas containing at least one of the gases given above and a gas selected from He, Ne, Ar, Kr, Xe, and Rn is given. Phosphoric acid can be used as an etchant of the insulator 137 and the insulators 135. Note that in the case where wet etching is used to remove the insulator 137 and the insulators 135, the etching rate of the insulator 137 and the insulators 135 can be controlled by adjusting the temperature of the etchant. The insulator 137 and the insulators 135 are preferably etched with heated phosphoric acid.

The removal of the insulator 137 and the insulators 135 results in generation of a layer serving as a cavity between the insulators 123 positioned thereover and thereunder.

Figure 18:
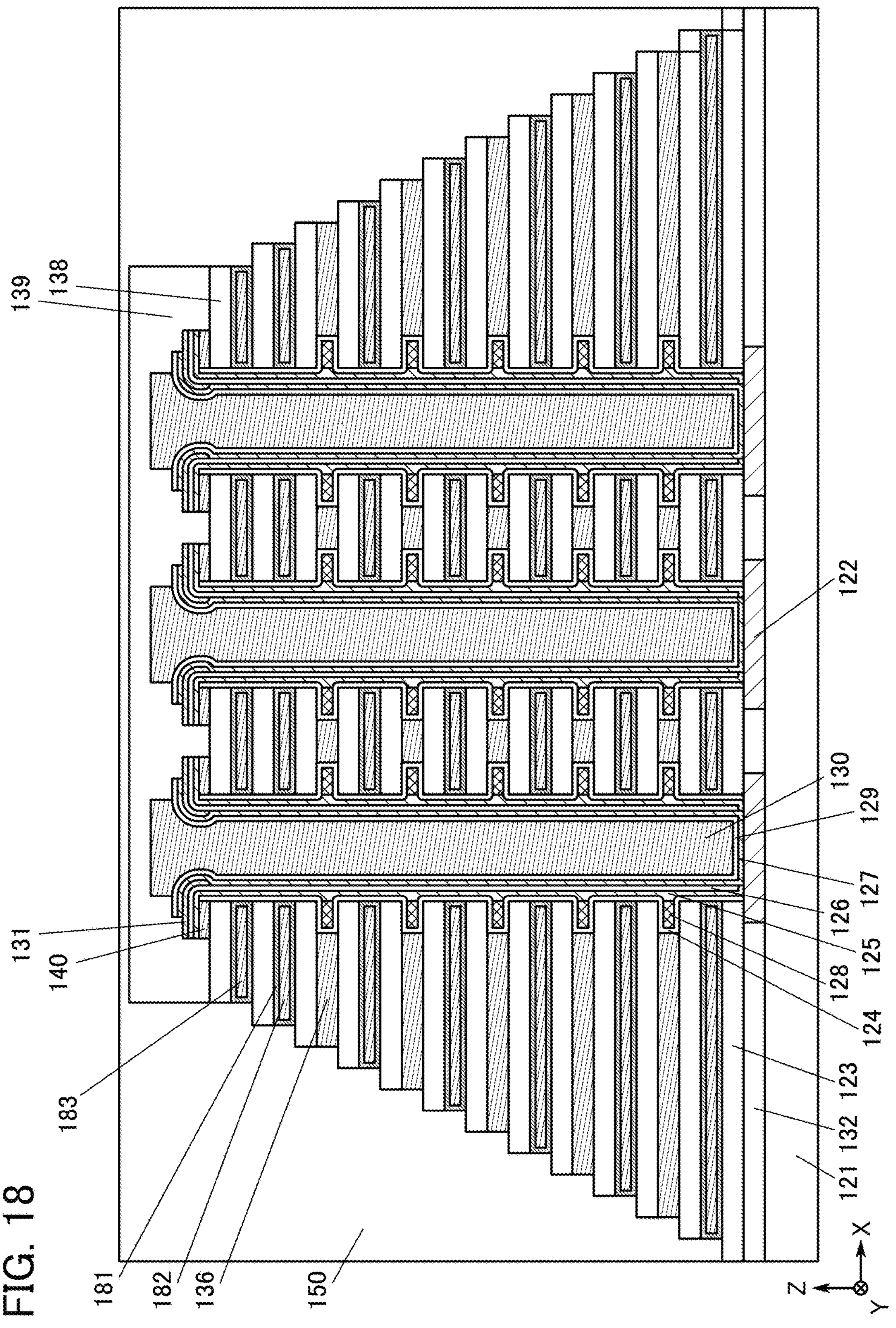
FIG. 18 is a cross-sectional view illustrating manufacturing steps of the semiconductor device of one embodiment of the present invention.

Conductors to be the conductors 182 and the conductor 183 are formed in regions where the insulator 137 and the insulators 135 have been removed (see FIG. 18). The conductor can be formed by a CVD method or an ALD method. It is particularly preferable to employ an ALD method, in which case a film with a uniform thickness can be formed even in a groove or an opening having a high aspect ratio. For the conductor, a material that can be used for the conductor 122 or the conductive films 136A can be used. The conductor may contain a material that is the same as or different from that for the conductor 122 or the conductive films 136A. In order to inhibit oxidation of the conductor, the insulators 181 are preferably formed before the formation of the conductor. The insulators 181 preferably have a barrier property against oxygen. The insulators 181 can be formed by an ALD method. An ALD method allows the insulators 181 to be formed on the top surfaces of the insulators 123, the bottom surfaces of the insulators 123, the side surfaces of the insulators 124, and the side surface of the insulator 150.

Next, the conductors positioned in the slits formed in the preceding step are subjected to anisotropic etching, so that the conductors 182 and the conductor 183 are obtained (see FIG. 18). Here, the conductor formed in the region where the insulator 135 has been provided is the conductor 182, and the conductor formed in the region where the insulator 137 has been provided is the conductor 183. The conductors 182 and the conductor 183 are each covered with the insulator 181 except for a plane positioned on the slit side, that is, a plane perpendicular to the Y direction.

Next, an insulator is formed so as to fill the portions removed by the above processing, that is, the slit portions. The insulators can be formed by a CVD method or an ALD method. It is particularly preferable to employ an ALD method, in which case a film with a uniform thickness can be formed even in a groove or an opening having a high aspect ratio. Alternatively, the insulators may be formed by a combination of an ALD method and a CVD method. The insulator is preferably subjected to planarization treatment by a CMP method or a reflow method.

Next, the insulator 150, the insulator 139, the insulators 129, the insulators 131, the insulators 126, the insulator 138, and the insulators 181 are processed by a lithography method, whereby second openings are formed so as to expose the conductors 182, the conductors 136, the conductors 130, the conductor 183, the semiconductors 125, and the semiconductors 127. The second openings are formed for the respective conductors 182 and 136 formed in the step-like shape (see FIG. 19).

Figure 19:
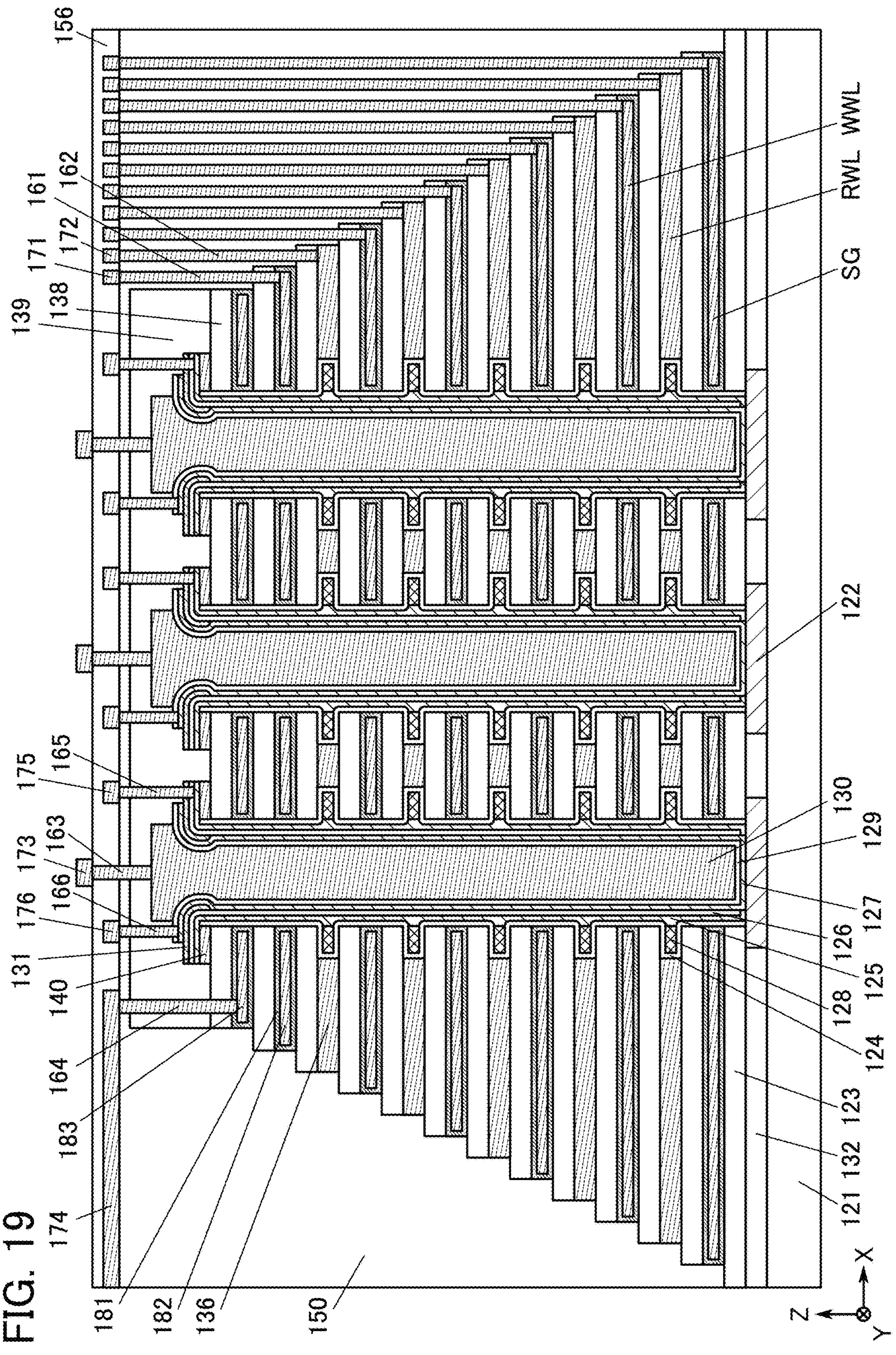
FIG. 19 is a cross-sectional view illustrating manufacturing steps of the semiconductor device of one embodiment of the present invention.

Next, conductors 161 electrically connected to the conductors 182, conductors 162 electrically connected to the conductors 136, a conductor 164 electrically connected to the conductor 183, conductors 165 electrically connected to the semiconductors 125, and conductors 166 electrically connected to the semiconductors 127 are formed so as to fill the second openings (see FIG. 19). The conductors 161, the conductors 162, the conductor 164, the conductors 165, and the conductors 166 can be formed by a CVD method or an ALD method. It is particularly preferable to employ an ALD method, in which case a film with a uniform thickness can be formed even in a groove or an opening having a high aspect ratio. Alternatively, the conductors may be formed by a combination of an ALD method and a CVD method. The conductors 161, the conductors 162, the conductor 164, the conductors 165, and the conductors 166 may have a stacked-layer structure composed of a plurality of layers. The conductors 161, the conductors 162, the conductor 164, the conductors 165, and the conductors 166 can be formed in such a manner that a conductive film is formed over the insulator 150 and inside the second openings and unnecessary part of the conductive film is removed by CMP or the like.

Next, conductors 171 electrically connected to the conductors 161, conductors 172 electrically connected to the conductors 162, a conductor 174 electrically connected to the conductor 164, conductors 175 electrically connected to the conductors 165, and conductors 176 electrically connected to the conductors 166 are formed (see FIG. 19). The conductors 171, the conductors 172, the conductor 174, the conductors 175, and the conductors 176 can be formed in such a manner that a conductive film is formed over the insulator 150 and processed by a lithography method. For the processing, a dry etching method or a wet etching method can be employed. Processing by a dry etching method is suitable for microfabrication.

The conductors 171, the conductors 161, and the conductors 182 function as the conductor SG or the conductor WWL. The conductors 172, the conductors 162, and the conductors 136 function as the conductor RWL. The conductor 174, the conductor 164, and the conductor 183 function as the conductor SEL. The conductors 175 and the conductors 165 function as a conductor WBL. The conductors 176 and the conductors 166 function as a conductor RBL.

Next, an insulator 156 is formed so as to cover the insulator 150, the insulator formed so as to fill the slits, the conductors 171, the conductors 172, the conductor 174, the conductors 175, and the conductors 176 (see FIG. 19). The insulator 156 can be formed by a CVD method, an ALD method, a sputtering method, or the like.

Then, the insulator 156, the insulator 150, and the insulator 139 are processed by a lithography method, whereby third openings are formed so as to expose the conductors 130 (see FIG. 19).

Next, conductors 163 electrically connected to the conductors 130 are formed so as to fill the third openings (see FIG. 19). The conductors 163 can be formed by a CVD method or an ALD method. It is particularly preferable to employ an ALD method, in which case a film with a uniform thickness can be formed even in a groove or an opening having a high aspect ratio. Alternatively, the conductors may be formed by a combination of an ALD method and a CVD method. The conductors 163 may have a stacked-layer structure composed of a plurality of layers. The conductors 163 can be formed in such a manner that a conductive film is formed over the insulator 156 and inside the third openings and unnecessary part of the conductive film is removed by CMP or the like.

Next, conductors 173 electrically connected to the conductors 163 are formed (see FIG. 19). The conductors 173 can be formed in such a manner that a conductive film is formed over the insulator 156 and is processed by a lithography method. For the processing, a dry etching method or a wet etching method can be employed. Processing by a dry etching method is suitable for microfabrication.

The conductors 173, the conductors 163, and the conductors 130 function as a conductor BG. Through the above-described steps, the transistor STr1 that includes the semiconductor 127 functioning as a channel formation region and the conductor 182 functioning as a gate; the transistor STr2 that includes the semiconductor 125 and the semiconductor 127 functioning as a channel formation region and the conductor 183 functioning as a gate; the transistor WTr that includes the semiconductor 125 functioning as a channel formation region and the conductor 182 functioning as a gate; and the transistor RTr that includes the semiconductor 127 functioning as a channel formation region, the conductor 136 functioning as a gate, the conductor 130 functioning as a back gate, and the conductor 128 between the semiconductor 127 and the conductor 136 can be manufactured. Furthermore, the memory device including the transistor STr1, the transistor STr2, the transistor WTr, and the transistor RTr can be manufactured.

<Structure Example of Deposition Apparatus>

Figure 20A:
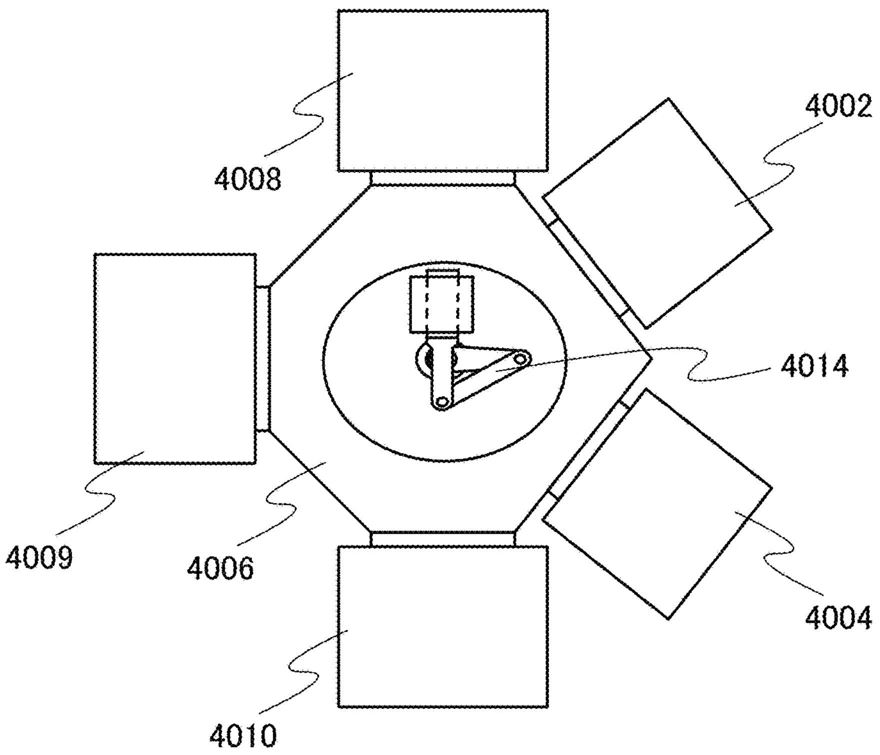
FIG. 20A is a top view illustrating a deposition apparatus of one embodiment of the present invention.
Figure 20B:
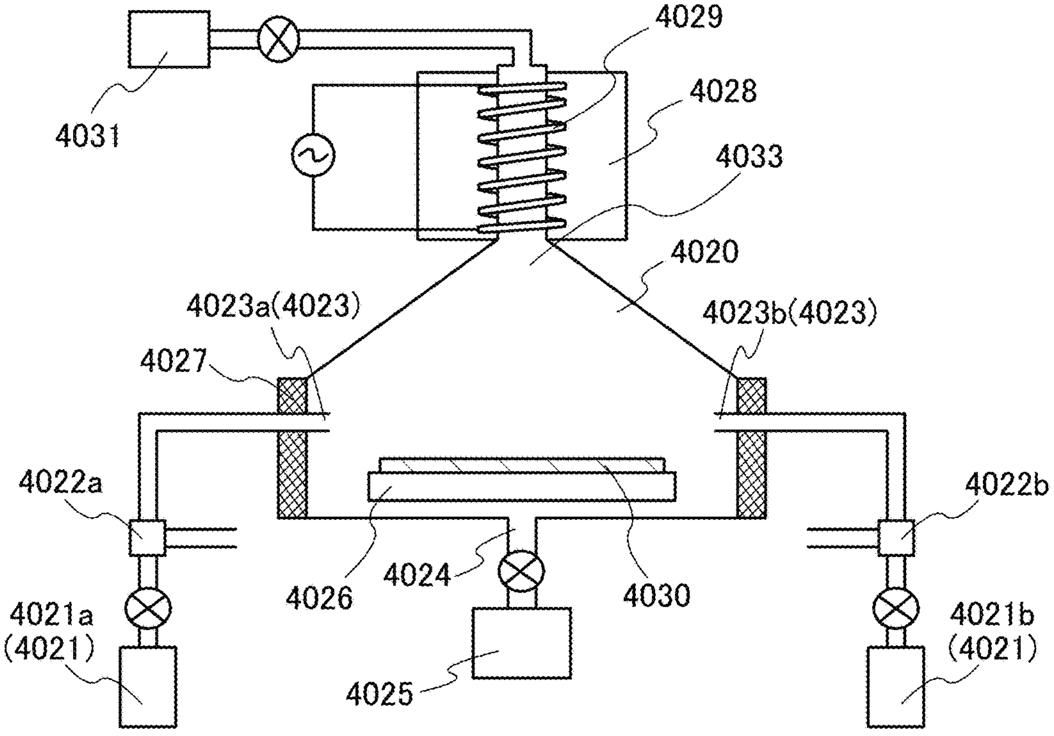
FIG. 20B is a cross-sectional view illustrating a deposition apparatus of one embodiment of the present invention.

A structure of a deposition apparatus 4000, which is an example of the apparatus capable of deposition by an ALD method, is described with reference to FIG. 20A and FIG. 20B. FIG. 20A is a schematic view of the multi-chamber type deposition apparatus 4000, and FIG. 20B is a cross-sectional view of an ALD apparatus that can be used for the deposition apparatus 4000.

The deposition apparatus 4000 includes a carrying-in/out chamber 4002, a carrying-in/out chamber 4004, a transfer chamber 4006, a deposition chamber 4008, a deposition chamber 4009, a deposition chamber 4010, and a transfer arm 4014. Here, the carrying-in/out chamber 4002, the carrying-in/out chamber 4004, and the deposition chambers 4008 to 4010 are each independently connected to the transfer chamber 4006. This enables successive deposition in the deposition chambers 4008 to 4010 without exposure to the air, preventing the entry of impurities into a film. Moreover, contamination of an interface between a substrate and a film and interfaces between films can be reduced, so that clean interfaces can be obtained.

Note that in order to prevent attachment of moisture and the like, the carrying-in/out chamber 4002, the carrying-in/out chamber 4004, the transfer chamber 4006, and the deposition chambers 4008 to 4010 are preferably filled with an inert gas (e.g., a nitrogen gas) whose dew point is controlled, and reduced pressure is desirably maintained.

An ALD apparatus can be used in the deposition chambers 4008 to 4010. Alternatively, a structure may be employed in which a deposition apparatus other than an ALD apparatus is used in any of the deposition chambers 4008 to 4010. Examples of the deposition apparatus that can be used in the deposition chambers 4008 to 4010 include a sputtering apparatus, a plasma CVD (PECVD: Plasma Enhanced CVD) apparatus, a thermal CVD (TCVD) apparatus, a photo CVD apparatus, a metal CVD (MCVD) apparatus, and a metal organic CVD (MOCVD) apparatus. An apparatus having a function other than a deposition apparatus may be provided in one or more of the deposition chambers 4008 to 4010. Examples of the apparatus include a heating apparatus (typically, a vacuum heating apparatus) and a plasma generation apparatus (typically, a μ-wave plasma generation apparatus).

For example, in the case where an ALD apparatus is used in the deposition chamber 4008, a PECVD apparatus is used in the deposition chamber 4009, and a metal CVD apparatus is used in the deposition chamber 4010, a metal oxide can be formed in the deposition chamber 4008, an insulating film functioning as a gate insulating film can be formed in the deposition chamber 4009, and a conductive film functioning as a gate electrode can be formed in the deposition chamber 4010. At this time, the metal oxide, the insulating film thereover, and the conductive film thereover can be formed successively without exposure to the air.

Although the deposition apparatus 4000 includes the carrying-in/out chamber 4002, the carrying-in/out chamber 4004, and the deposition chambers 4008 to 4010, the present invention is not limited thereto. The number of the deposition chambers in the deposition apparatus 4000 may be four or more. The deposition apparatus 4000 may be of a single-wafer type or may be of a batch type, in which case deposition is performed on a plurality of substrates at a time.

<ALD Apparatus>

Next, a structure of an ALD apparatus that can be used for the deposition apparatus 4000 is described with reference to FIG. 20B. The ALD apparatus includes a deposition chamber (a chamber 4020), a source material supply portion 4021 (source material supply portions 4021*a* and 4021*b*), a source material supply portion 4031, high-speed valves 4022*a* and 4022*b* that are introduction amount controllers, a source material introduction port 4023 (source material introduction ports 4023*a* and 4023*b*), a source material introduction port 4033, a source material exhaust port 4024, and an evacuation unit 4025. The source material introduction ports 4023*a*, 4023*b*, and 4033 provided in the chamber 4020 are connected to the source material supply portions 4021*a*, 4021*b*, and 4031, respectively, through supply tubes and valves, and the source material exhaust port 4024 is connected to the evacuation unit 4025 through an exhaust tube, a valve, and a pressure controller.

A plasma generation apparatus 4028 is connected to the chamber 4020 as illustrated in FIG. 20B, whereby deposition can be performed by a plasma ALD method as well as a thermal ALD method. It is preferable that the plasma generation apparatus 4028 be an ICP-type plasma generation apparatus using a coil 4029 connected to a high frequency power source. The high frequency power source is capable of outputting power with a frequency higher than or equal to 10 kHz and lower than or equal to 100 MHz, preferably higher than or equal to 1 MHz and lower than or equal to 60 MHz, further preferably higher than or equal to 10 MHz and lower than or equal to 60 MHz. For example, power with a frequency of 13.56 MHz or 60 MHz can be output. A plasma ALD method enables deposition without decreasing the deposition rate even at low temperatures, and thus is preferably used for a single-wafer type deposition apparatus with low deposition efficiency.

A substrate holder 4026 is positioned in the chamber, and a substrate 4030 is placed on the substrate holder 4026. The substrate holder 4026 may be provided with a mechanism to which a constant potential or a high-frequency wave is applied. Alternatively, the substrate holder 4026 may be floating or grounded. A heater 4027, which is provided on an outside wall of the chamber, can control the temperature inside the chamber 4020 and the temperatures of the substrate holder 4026, the surface of the substrate 4030, and the like. The heater 4027 is preferably capable of controlling the temperature of the surface of the substrate 4030 to higher than or equal to 100° C. and lower than or equal to 500° C., preferably higher than or equal to 200° C. and lower than or equal to 400° C., and is capable of setting the temperature of the heater 4027 itself to higher than or equal to 100° C. and lower than or equal to 500° C.

In the source material supply portions 4021*a*, 4021*b*, and 4031, a source gas is formed from a solid source material or a liquid source material using a vaporizer, a heating unit, or the like. Alternatively, the source material supply portions 4021*a*, 4021*b*, and 4031 may supply a source gas.

Although FIG. 20B illustrates the example in which two source material supply portions 4021 and one source material supply portion 4031 are provided, this embodiment is not limited thereto. One or three or more source material supply portions 4021 may be provided. In addition, two or more source material supply portions 4031 may be provided. The high-speed valves 4022*a* and 4022*b* can be precisely controlled by time and are configured to control supply of a source gas from the source material supply portion 4021*a* and supply of a source gas from the source material supply portion 4021*b*.

In the deposition apparatus illustrated in FIG. 20B, a thin film is formed over a substrate surface in such a manner that after the substrate 4030 is transferred onto the substrate holder 4026 and the chamber 4020 is sealed, the substrate 4030 is set to a desired temperature (e.g., higher than or equal to 100° C. and lower than or equal to 500° C., preferably higher than or equal to 200° C. and lower than or equal to 400° C.) by the heater 4027, and supply of a source gas from the source material supply portion 4021*a*, evacuation with the evacuation unit 4025, supply of a source gas from the source material supply portion 4031, and evacuation with the evacuation unit 4025 are repeated. In the deposition of the thin film, supply of a source gas from the source material supply portion 4021*b* and evacuation with the evacuation unit 4025 may further be performed. The temperature of the heater 4027 is determined as appropriate depending on the type of film to be formed, the source gas, the desired film quality, and the heat resistance of a substrate and a film and an element that are provided thereover. For example, the deposition may be performed by setting the temperature of the heater 4027 to higher than or equal to 200° C. and lower than or equal to 300° C. or higher than or equal to 300° C. and lower than or equal to 500° C.

By performing deposition while the substrate 4030 is heated by the heater 4027, heat treatment for the substrate 4030 that is necessary in a later step can be omitted. In other words, with the use of the deposition apparatus 4000 or the chamber 4020 provided with the heater 4027, formation of a film over the substrate 4030 can also serve as heat treatment for the substrate 4030.

In the deposition apparatus illustrated in FIG. 20B, a metal oxide can be formed by appropriate selection of source materials (e.g., a volatile organometallic compound) used in the source material supply portion 4021 and the source material supply portion 4031.

In the case where an In—Ga—Zn oxide, which contains indium, gallium, and zinc, is formed as the metal oxide, it is preferable to use a deposition apparatus provided with at least three source material supply portions 4021 besides the source material supply portion 4031. Specifically, it is preferable that a precursor containing indium be supplied from the first source material supply portion 4021, a precursor containing gallium be supplied from the second source material supply portion 4021, and a precursor containing zinc be supplied from the third source material supply portion 4021.

In the case where the metal oxide is formed using precursors containing gallium and zinc, at least two source material supply portions 4021 are provided. Any of the above-described precursors can be used as the precursor containing indium, the precursor containing gallium, and the precursor containing zinc.

A reactant is supplied from the source material supply portion 4031. An oxidizer containing at least one of ozone, oxygen, and water can be used as the reactant.

By appropriate selection of source materials (e.g., a volatile organometallic compound) used in the source material supply portions 4021*a*, 4021*b*, and 4031, an insulating layer formed using an oxide (including a composite oxide) containing one or more kinds of elements selected from hafnium, aluminum, tantalum, zirconium, and the like can be formed. Specifically, an insulating layer formed using hafnium oxide, an insulating layer formed using aluminum oxide, an insulating layer formed using hafnium silicate, an insulating layer formed using aluminum silicate, or the like can be formed. Alternatively, a thin film, e.g., a metal layer such as a tungsten layer or a titanium layer, or a nitride layer such as a titanium nitride layer can be formed by appropriate selection of source materials (e.g., a volatile organometallic compound) used for the source material supply portions 4021*a*, 4021*b*, and 4031.

For example, in the case where a hafnium oxide layer is formed by an ALD apparatus, the first source gas which is obtained by vaporizing liquid containing a solvent and a hafnium precursor compound (hafnium alkoxide amide such as or hafnium tetrakis(dimethylamide) hafnium (TDMAHf)), and the second source gas of ozone ($O_3$) and oxygen ($O_2$) as an oxidizer are used. In this case, the first source gas supplied from the source material supply portion 4021*a* is TDMAHf, and the second source gas supplied from the source material supply portion 4031 is ozone and oxygen. Note that the chemical formula of tetrakis(dimethylamide) hafnium is $Hf[N(CH_3)_2]_4$. Furthermore, examples of another material liquid include tetrakis(ethylmethylamide) hafnium. Alternatively, water can be used as the second source gas.

In the case where an aluminum oxide layer is formed by an ALD apparatus, the first source gas which is obtained by vaporizing a liquid containing a solvent and an aluminum precursor compound (e.g., TMA: trimethylaluminum) and the second source gas containing ozone ($O_3$) and oxygen ($O_2$) as an oxidizer are used. In this case, the first source gas supplied from the source material supply portion 4021*a* is TMA, and the second source gas supplied from the source material supply portion 4031 is ozone and oxygen. Note that the chemical formula of trimethylaluminum is $Al(CH_3)_3$. Examples of another material liquid include tris(dimethylamide)aluminum, triisobutylaluminum, and aluminum tris (2,2,6,6-tetramethyl-3,5-heptanedionate). Alternatively, water can be used as the second source gas.

FIG. 21 illustrates ALD apparatuses with different structures that can be used for the deposition apparatus 4000. Note that detailed description of structures and functions similar to those of the ALD apparatus illustrated in FIG. 20B is omitted in some cases.

Figure 21A:
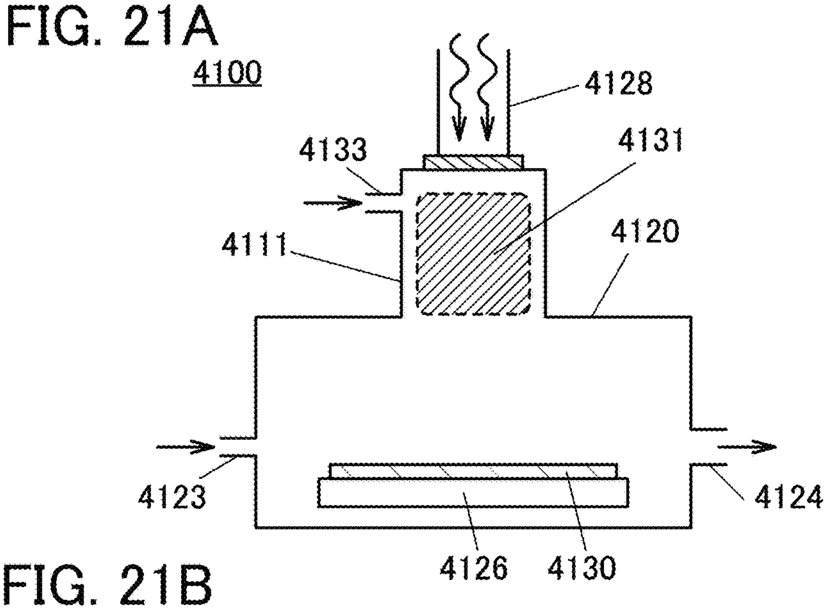
FIG. 21A to FIG. 21C are each a cross-sectional view illustrating a deposition apparatus of one embodiment of the present invention.

FIG. 21A is a schematic view illustrating one embodiment of a plasma ALD apparatus. A plasma ALD apparatus 4100 is provided with a reaction chamber 4120 and a plasma generation chamber 4111 above the reaction chamber 4120.

The reaction chamber 4120 can be referred to as a chamber. Alternatively, the reaction chamber 4120 and the plasma generation chamber 4111 can be collectively referred to as a chamber. The reaction chamber 4120 includes a source material introduction port 4123 and a source material exhaust port 4124, and the plasma generation chamber 4111 includes a source material introduction port 4133. Furthermore, a plasma generation apparatus 4128 enables a high-frequency wave such as RF or a microwave to be applied to a gas introduced to the plasma generation chamber 4111, thereby generating plasma 4131 in the plasma generation chamber 4111. In the case where the plasma 4131 is generated using a microwave, a microwave with a frequency of 2.45 GHz is typically used. Such plasma generated by the microwave is referred to as ECR (Electron Cyclotron Resonance) plasma in some cases. A substrate holder 4126 is provided in the reaction chamber 4120, and a substrate 4130 is positioned thereover. A source gas introduced from the source material introduction port 4123 is decomposed by heat from a heater provided in the reaction chamber 4120 and is deposited over the substrate 4130. A source gas introduced from the source material introduction port 4133 turns into plasma by the plasma generation apparatus 4128. The source gas in the plasma state is recombined with electrons and other molecules to be in a radical state before it reaches the surface of the substrate 4130, and reaches the substrate 4130. An ALD apparatus that performs deposition using a radical in such a manner may also be referred to as a radical ALD (Radical-Enhanced ALD) apparatus. The structure of the plasma ALD apparatus 4100, in which the plasma generation chamber 4111 is provided above the reaction chamber 4120, is illustrated; however, this embodiment is not limited to this structure. The plasma generation chamber 4111 may be provided adjacent to a side surface of the reaction chamber 4120.

Figure 21B:
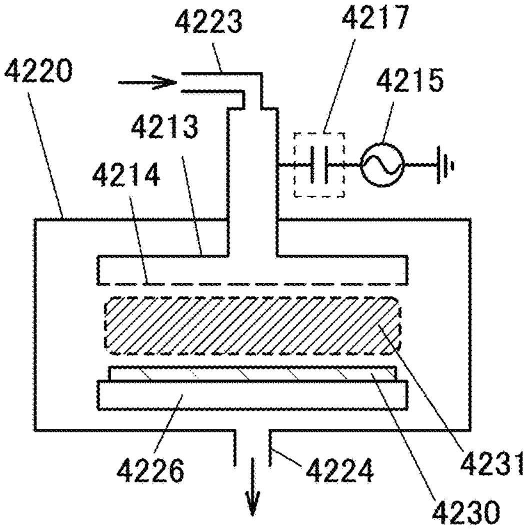

FIG. 21B is a schematic view illustrating one embodiment of a plasma ALD apparatus. A plasma ALD apparatus 4200 includes a chamber 4220. The chamber 4220 includes an electrode 4213, a source material exhaust port 4224, and a substrate holder 4226, and a substrate 4230 is positioned thereover. The electrode 4213 includes a source material introduction port 4223 and a shower head 4214 that supplies the introduced source gas into the chamber 4220. A power source 4215 capable of applying a high-frequency wave through a capacitor 4217 is connected to the electrode 4213. The substrate holder 4226 may be provided with a mechanism to which a constant potential or a high-frequency wave is applied. Alternatively, the substrate holder 4226 may be floating or grounded. The electrode 4213 and the substrate holder 4226 function as an upper electrode and a lower electrode for generating plasma 4231, respectively. A source gas introduced from the source material introduction port 4223 is decomposed by heat from a heater provided in the chamber 4220 and is deposited over the substrate 4230. Alternatively, the source gas introduced from the source material introduction port 4223 turns into plasma between the electrode 4213 and the substrate holder 4226. The source gas in the plasma state enters the substrate 4230 owing to a potential difference (also referred to as an ion sheath) generated between the plasma 4231 and the substrate 4230.

Figure 21C:
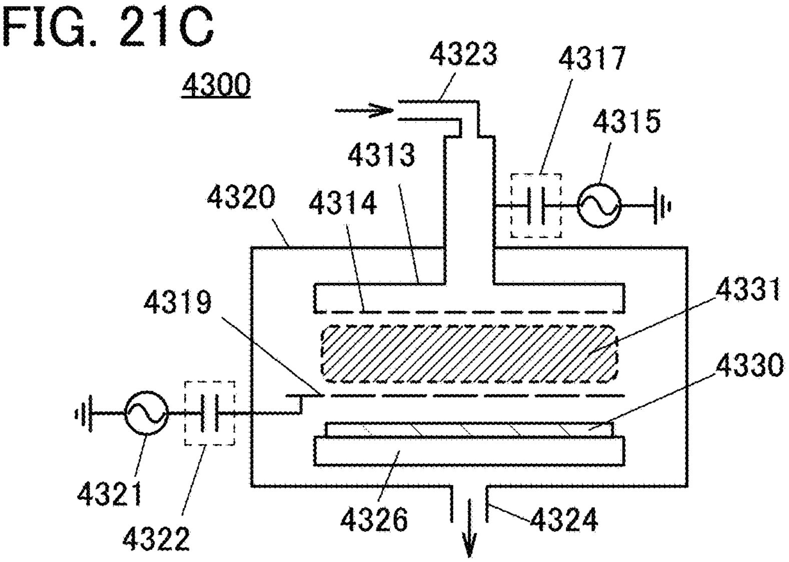

FIG. 21C is a schematic view illustrating one embodiment of a plasma ALD apparatus different form that in FIG. 21B. A plasma ALD apparatus 4300 includes a chamber 4320. The chamber 4320 includes an electrode 4313, a source material exhaust port 4324, and a substrate holder 4326, and a substrate 4330 is positioned thereover. The electrode 4313 includes a source material introduction port 4323 and a shower head 4314 that supplies the introduced source gas into the chamber 4320. A power source 4315 capable of applying a high-frequency wave through a capacitor 4317 is connected to the electrode 4313. The substrate holder 4326 may be provided with a mechanism to which a constant potential or a high-frequency wave is applied. Alternatively, the substrate holder 4326 may be floating or grounded. The electrode 4313 and the substrate holder 4326 function as an upper electrode and a lower electrode for generating plasma 4331, respectively. The plasma ALD apparatus 4300 is different from the plasma ALD apparatus 4200 in that a mesh 4319 to which a power source 4321 capable of applying a high-frequency wave through a capacitor 4322 is connected is provided between the electrode 4313 and the substrate holder 4326. With the mesh 4319, the plasma 4231 can be away from the substrate 4130. A source gas introduced from the source material introduction port 4323 is decomposed by heat from a heater provided in the chamber 4320 and is deposited over the substrate 4330. Alternatively, the source gas introduced from the source material introduction port 4323 turns into plasma between the electrode 4313 and the substrate holder 4326. Charge of the source gas in the plasma state is removed by the mesh 4319 and the source gas reaches the substrate 4130 while being in an electrically neutral state such as a radical. Therefore, it is possible to perform deposition with suppressed damage due to plasma or the entry of ions.

The semiconductor 125 or the semiconductor 127 is formed by an ALD method, whereby a metal oxide having a CAAC structure, in which c-axes are aligned substantially parallel to the direction normal to the surface on which the semiconductor 125 or the semiconductor 127 is formed, can be formed in some cases.

<Microwave Treatment Apparatus>

A microwave treatment apparatus that can be used for the above method for manufacturing the semiconductor device will be described below.

Figure 23:
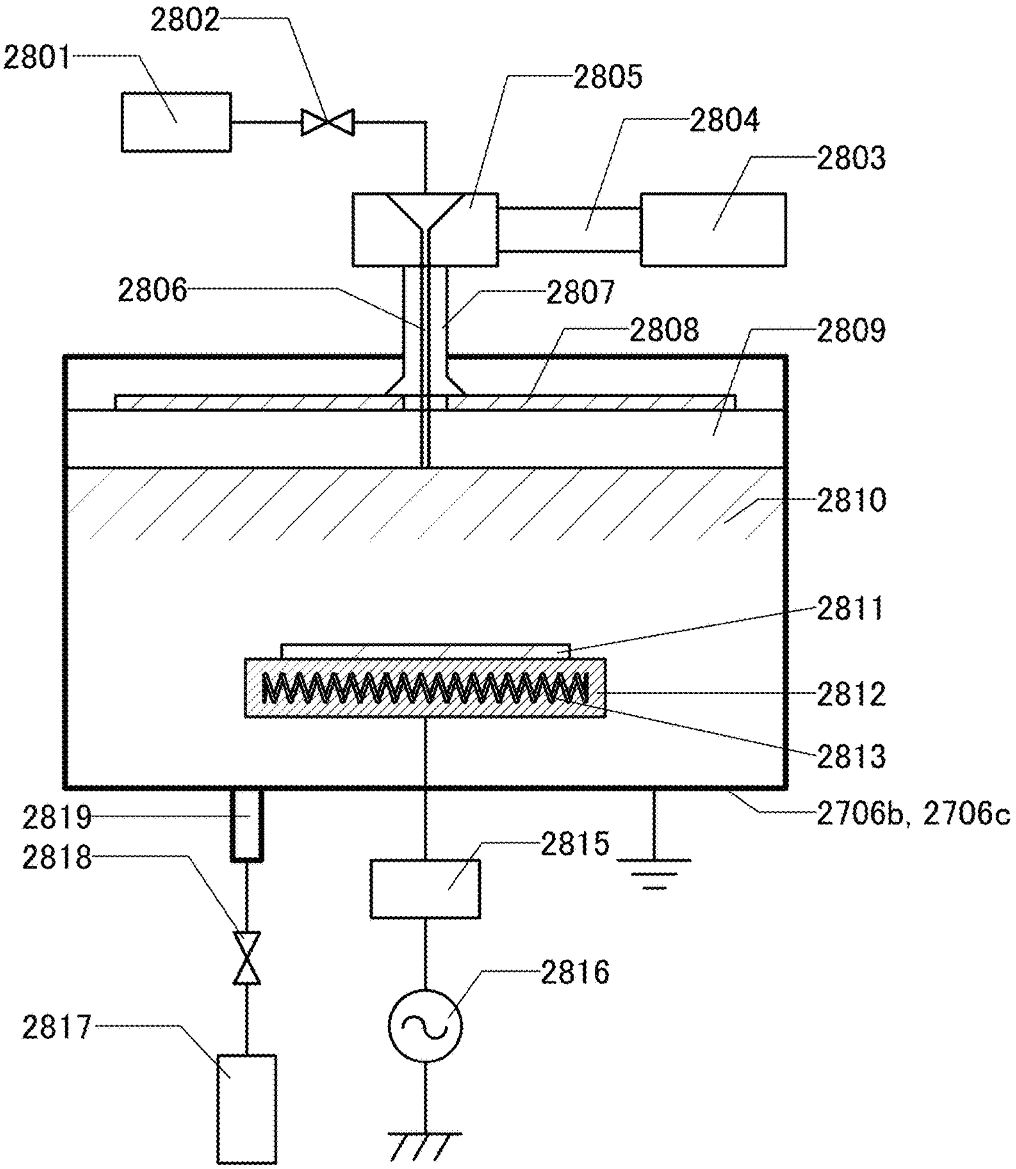
FIG. 23 is a cross-sectional view illustrating a microwave treatment apparatus of one embodiment of the present invention.
Figure 24:
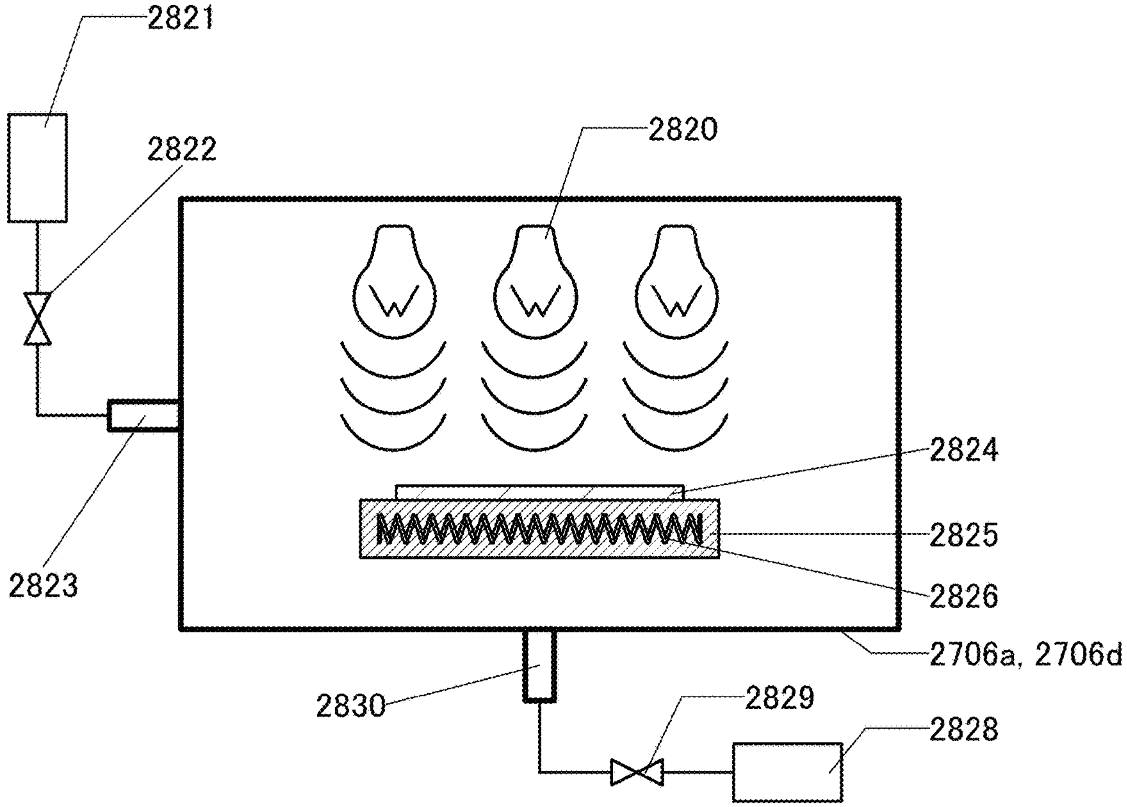
FIG. 24 is a cross-sectional view illustrating a microwave treatment apparatus of one embodiment of the present invention.

First, the structure of a manufacturing apparatus that hardly allows entry of impurities in manufacturing a semiconductor device or the like is described with reference to FIG. 22, FIG. 23, and FIG. 24.

Figure 22:
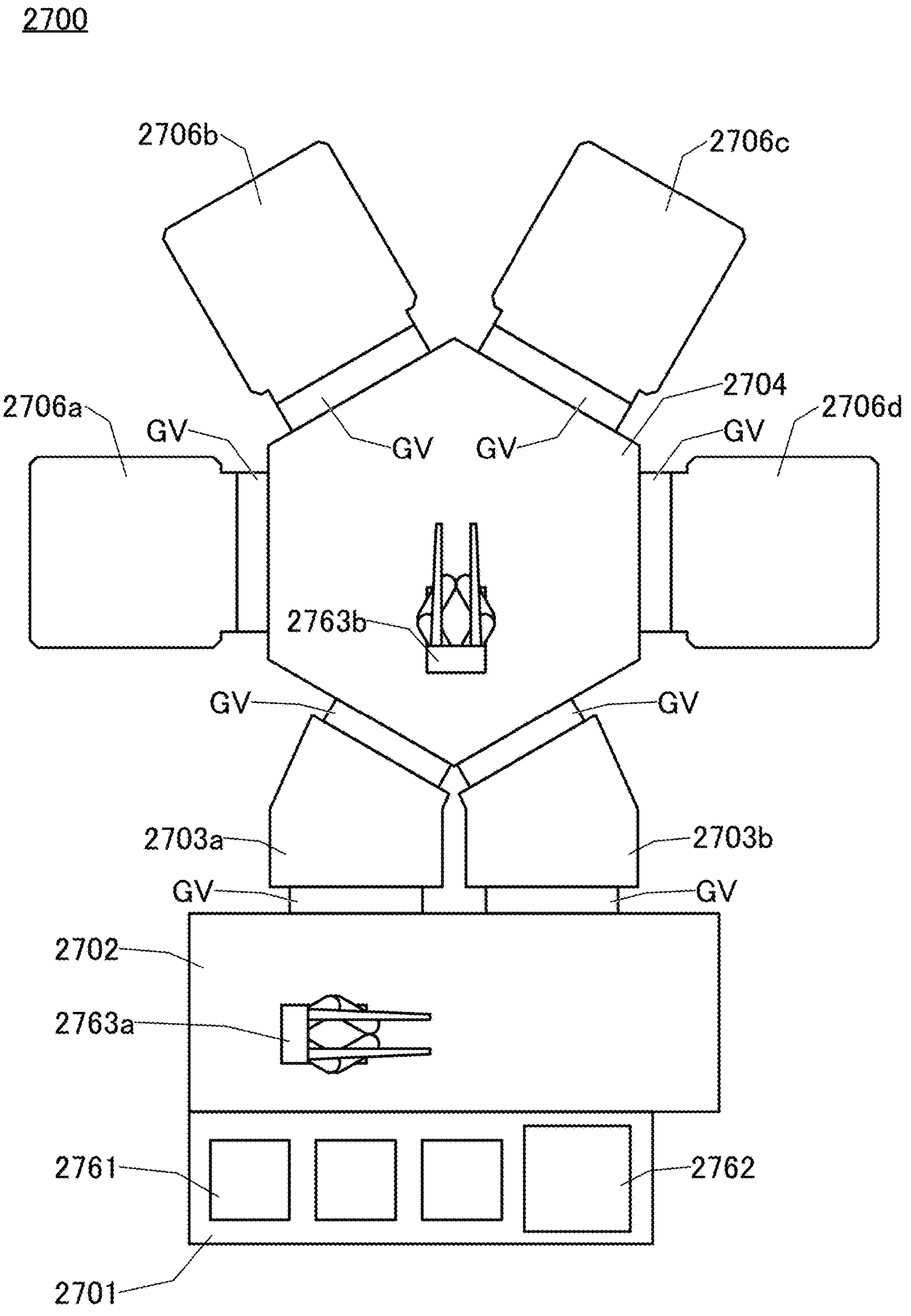
FIG. 22 is a top view illustrating a microwave treatment apparatus of one embodiment of the present invention.

FIG. 22 schematically illustrates a top view of a single wafer multi-chamber manufacturing apparatus 2700. The manufacturing apparatus 2700 includes an atmosphere-side substrate supply chamber 2701 including a cassette port 2761 for storing substrates and an alignment port 2762 for performing alignment of substrates; an atmosphere-side substrate transfer chamber 2702 through which a substrate is transferred from the atmosphere-side substrate supply chamber 2701; a load lock chamber 2703*a* where a substrate is carried in and the pressure inside the chamber is switched from atmospheric pressure to reduced pressure or from reduced pressure to atmospheric pressure; an unload lock chamber 2703*b* where a substrate is carried out and the pressure inside the chamber is switched from reduced pressure to atmospheric pressure or from atmospheric pressure to reduced pressure; a transfer chamber 2704 through which a substrate is transferred in a vacuum; a chamber 2706*a*; a chamber 2706*b*; a chamber 2706*c*; and a chamber 2706*d*.

Furthermore, the atmosphere-side substrate transfer chamber 2702 is connected to the load lock chamber 2703*a* and the unload lock chamber 2703*b*, the load lock chamber 2703*a* and the unload lock chamber 2703*b* are connected to the transfer chamber 2704, and the transfer chamber 2704 is connected to the chamber 2706*a*, the chamber 2706*b*, the chamber 2706*c*, and the chamber 2706*d*.

Note that gate valves GV are provided in connecting portions between the chambers so that each chamber excluding the atmosphere-side substrate supply chamber 2701 and the atmosphere-side substrate transfer chamber 2702 can be independently kept in a vacuum state. Furthermore, the atmosphere-side substrate transfer chamber 2702 is provided with a transfer robot 2763*a*, and the transfer chamber 2704 is provided with a transfer robot 2763*b*. With the transfer robot 2763*a* and the transfer robot 2763*b*, a substrate can be transferred inside the manufacturing apparatus 2700.

The back pressure (total pressure) in the transfer chamber 2704 and each of the chambers is, for example, lower than or equal to $1\times10^{-4}$ Pa, preferably lower than or equal to $3\times10^{-5}$ Pa, further preferably lower than or equal to $1\times10^{-5}$ Pa. Furthermore, the partial pressure of a gas molecule (atom) having a mass-to-charge ratio (m/z) of 18 in the transfer chamber 2704 and each of the chambers is, for example, lower than or equal to $3\times10^{-5}$ Pa, preferably lower than or equal to $1\times10^{-5}$ Pa, further preferably lower than or equal to $3\times10^{-6}$ Pa. Furthermore, the partial pressure of a gas molecule (atom) having m/z of 28 in the transfer chamber 2704 and each of the chambers is, for example, lower than or equal to $3\times10^{-5}$ Pa, preferably lower than or equal to $1\times10^{-5}$ Pa, further preferably lower than or equal to $3\times10^{-6}$ Pa. Furthermore, the partial pressure of a gas molecule (atom) having m/z of 44 in the transfer chamber 2704 and each of the chambers is, for example, lower than or equal to $3\times10^{-5}$ Pa, preferably lower than or equal to $1\times10^{-5}$ Pa, further preferably lower than or equal to $3\times10^{-6}$ Pa.

Note that the total pressure and the partial pressure in the transfer chamber 2704 and each of the chambers can be measured using a mass analyzer. For example, Qulee CGM-051, a quadrupole mass analyzer (also referred to as Q-mass) produced by ULVAC, Inc. can be used.

Furthermore, the transfer chamber 2704 and the chambers each desirably have a structure in which the amount of external leakage or internal leakage is small. For example, the leakage rate in the transfer chamber 2704 and each of the chambers is less than or equal to $3\times10^{-6}$ Pa·m$^3$/s, preferably less than or equal to $1\times10^{-6}$ Pa·m$^3$/s. Furthermore, for example, the leakage rate of a gas molecule (atom) having m/z of 18 is less than or equal to $1\times10^{-7}$ Pa·m$^3$/s, preferably less than or equal to $3\times10^{-8}$ Pa·m$^3$/s. Furthermore, for example, the leakage rate of a gas molecule (atom) having m/z of 28 is less than or equal to $1\times10^{-5}$ Pa·m$^3$/s, preferably less than or equal to $1\times10^{-6}$ Pa·m$^3$/s. Furthermore, for example, the leakage rate of a gas molecule (atom) having m/z of 44 is less than or equal to $3\times10^{-6}$ Pa·m$^3$/s, preferably less than or equal to $1\times10^{-6}$ Pa·m$^3$/s.

Note that a leakage rate can be derived from the total pressure and partial pressure measured using the above-described mass analyzer. The leakage rate depends on external leakage and internal leakage. The external leakage refers to inflow of gas from the outside of a vacuum system through a minute hole, a sealing defect, or the like. The internal leakage is due to leakage through a partition, such as a valve, in a vacuum system or released gas from an internal member. Measures need to be taken from both aspects of external leakage and internal leakage in order that the leakage rate can be less than or equal to the above-described value.

For example, open/close portions of the transfer chamber 2704 and each of the chambers are preferably sealed with a metal gasket. For the metal gasket, metal covered with iron fluoride, aluminum oxide, or chromium oxide is preferably used. The metal gasket achieves higher adhesion than an O-ring and can reduce the external leakage. Furthermore, with the use of the metal covered with iron fluoride, aluminum oxide, chromium oxide, or the like, which is in the passive state, the release of gas containing impurities released from the metal gasket is inhibited, so that the internal leakage can be reduced.

Furthermore, for a member of the manufacturing apparatus 2700, aluminum, chromium, titanium, zirconium, nickel, or vanadium, which releases a small amount of gas containing impurities, is used. Furthermore, an alloy containing iron, chromium, nickel, and the like covered with the above-described metal, which releases a small amount of gas containing impurities, may be used. The alloy containing iron, chromium, nickel, and the like is rigid, resistant to heat, and suitable for processing. Here, when surface unevenness of the member is reduced by polishing or the like to reduce the surface area, the release of gas can be reduced.

Alternatively, the above-described member of the manufacturing apparatus 2700 may be covered with iron fluoride, aluminum oxide, chromium oxide, or the like.

The member of the manufacturing apparatus 2700 is preferably formed using only metal when possible, and in the case where a viewing window formed of quartz or the like is provided, for example, the surface is preferably thinly covered with iron fluoride, aluminum oxide, chromium oxide, or the like to inhibit release of gas.

An adsorbed substance present in the transfer chamber 2704 and each of the chambers does not affect the pressure in the transfer chamber 2704 and each of the chambers because it is adsorbed onto an inner wall or the like; however, it causes a release of gas when the transfer chamber 2704 and each of the chambers are evacuated. Thus, although there is no correlation between the leakage rate and the exhaust rate, it is important that the adsorbed substance present in the transfer chamber 2704 and each of the chambers be desorbed as much as possible and evacuation be performed in advance with the use of a pump with high exhaust capability. Note that the transfer chamber 2704 and each of the chambers may be subjected to baking to promote desorption of the adsorbed substance. By the baking, the desorption rate of the adsorbed substance can be increased about tenfold. The baking is performed at higher than or equal to 100° C. and lower than or equal to 450° C. At this time, when the adsorbed substance is removed while an inert gas is introduced into the transfer chamber 2704 and each of the chambers, the desorption rate of water or the like, which is difficult to desorb simply by evacuation, can be further increased. Note that when the inert gas to be introduced is heated to substantially the same temperature as the baking temperature, the desorption rate of the adsorbed substance can be further increased. Here, a rare gas is preferably used as the inert gas.

Alternatively, treatment for evacuating the transfer chamber 2704 and each of the chambers is preferably performed a certain period of time after a heated inert gas such as a rare gas, heated oxygen, or the like is introduced to increase the pressure in the transfer chamber 2704 and each of the chambers. The introduction of the heated gas can desorb the adsorbed substance in the transfer chamber 2704 and each of the chambers, and impurities present in the transfer chamber 2704 and each of the chambers can be reduced. Note that this treatment is effective when repeated more than or equal to 2 times and less than or equal to 30 times, preferably more than or equal to 5 times and less than or equal to 15 times. Specifically, an inert gas, oxygen, or the like at a temperature higher than or equal to 40° C. and lower than or equal to 400° C., preferably higher than or equal to 50° C. and lower than or equal to 200° C. is introduced, so that the pressure in the transfer chamber 2704 and each of the chambers can be kept at higher than or equal to 0.1 Pa and lower than or equal to 10 kPa, preferably higher than or equal to 1 Pa and lower than or equal to 1 kPa, further preferably higher than or equal to 5 Pa and lower than or equal to 100 Pa in the time range of 1 minute to 300 minutes, preferably 5 minutes to 120 minutes. After that, the transfer chamber 2704 and each of the chambers are evacuated in the time range of 5 minutes to 300 minutes, preferably 10 minutes to 120 minutes.

Next, the chamber **2706*b* and the chamber 2706*c* are described with reference to a schematic cross-sectional view illustrated in FIG. 23**.

The chamber **2706*b* and the chamber 2706*c* are chambers in which microwave treatment can be performed on an object, for example. Note that the chamber 2706*b* is different from the chamber 2706*c*** only in the atmosphere in performing the microwave treatment. The other structures are common and thus collectively described below.

The chamber **2706*b* and the chamber 2706*c* each include a slot antenna plate 2808, a dielectric plate 2809, a substrate holder 2812, and an exhaust port 2819. Furthermore, a gas supply source 2801, a valve 2802, a high-frequency generator 2803, a waveguide 2804, a mode converter 2805, a gas pipe 2806, a waveguide 2807, a matching box 2815, a high-frequency power source 2816, a vacuum pump 2817, and a valve 2818 are provided outside the chamber 2706*b* and the chamber 2706*c***, for example.

The high-frequency generator 2803 is connected to the mode converter 2805 through the waveguide 2804. The mode converter 2805 is connected to the slot antenna plate 2808 through the waveguide 2807. The slot antenna plate 2808 is placed in contact with the dielectric plate 2809. Furthermore, the gas supply source 2801 is connected to the mode converter 2805 through the valve 2802. Then, gas is transferred to the chamber **2706*b* and the chamber 2706*c* through the gas pipe 2806 that runs through the mode converter 2805, the waveguide 2807, and the dielectric plate 2809. Furthermore, the vacuum pump 2817 has a function of exhausting gas or the like from the chamber 2706*b* and the chamber 2706*c* through the valve 2818 and the exhaust port 2819. Furthermore, the high-frequency power source 2816 is connected to the substrate holder 2812 through the matching box 2815**.

The substrate holder 2812 has a function of holding a substrate 2811. For example, the substrate holder 2812 has a function of an electrostatic chuck or a mechanical chuck for holding the substrate 2811. Furthermore, the substrate holder 2812 has a function of an electrode to which electric power is supplied from the high-frequency power source 2816. Furthermore, the substrate holder 2812 includes a heating mechanism 2813 therein and has a function of heating the substrate 2811.

As the vacuum pump 2817, a dry pump, a mechanical booster pump, an ion pump, a titanium sublimation pump, a cryopump, or a turbomolecular pump can be used, for example. Furthermore, in addition to the vacuum pump 2817, a cryotrap may be used. The use of the cryopump and the cryotrap is particularly preferable because water can be efficiently exhausted.

Furthermore, for example, the heating mechanism 2813 is a heating mechanism that uses a resistance heater or the like for heating. Alternatively, a heating mechanism that uses heat conduction or heat radiation from a medium such as a heated gas for heating may be used. For example, RTA (Rapid Thermal Annealing) such as GRTA (Gas Rapid Thermal Annealing) or LRTA (Lamp Rapid Thermal Annealing) can be used. In GRTA, heat treatment is performed using a high-temperature gas. An inert gas is used as the gas.

Furthermore, the gas supply source 2801 may be connected to a purifier through a mass flow controller. As the gas, a gas whose dew point is −80° C. or lower, preferably −100° C. or lower is preferably used. For example, an oxygen gas, a nitrogen gas, or a rare gas (an argon gas or the like) is used.

As the dielectric plate 2809, silicon oxide (quartz), aluminum oxide (alumina), or yttrium oxide (yttria) is used, for example. Furthermore, another protective layer may be further formed on a surface of the dielectric plate 2809. For the protective layer, magnesium oxide, titanium oxide, chromium oxide, zirconium oxide, hafnium oxide, tantalum oxide, silicon oxide, aluminum oxide, yttrium oxide, or the like is used. The dielectric plate 2809 is exposed to an especially high-density region of high-density plasma 2810 described later; thus, providing the protective layer can reduce the damage. Consequently, an increase in the number of particles or the like during the treatment can be inhibited.

The high-frequency generator 2803 has a function of generating microwaves at, for example, higher than or equal to 0.3 GHz and lower than or equal to 6.0 GHz. For example, the high-frequency generator 2803 can generate microwaves at higher than or equal to 0.7 GHZ and lower than or equal to 1.1 GHZ, higher than or equal to 2.2 GHz and lower than or equal to 2.8 GHz, or higher than or equal to 5.0 GHz and lower than or equal to 6.0 GHz. The microwaves generated by the high-frequency generator 2803 are propagated to the mode converter 2805 through the waveguide 2804. The mode converter 2805 converts the microwaves propagated in the TE mode into microwaves in the TEM mode. Then, the microwaves propagate to the slot antenna plate 2808 through the waveguide 2807. The slot antenna plate 2808 is provided with a plurality of slot holes, and the microwaves pass through the slot holes and the dielectric plate 2809. Then, an electric field is generated below the dielectric plate 2809, and the high-density plasma 2810 can be generated. In the high-density plasma 2810, ions and radicals based on the gas species supplied from the gas supply source 2801 are present. For example, oxygen radicals are present.

At this time, the quality of a film or the like over the substrate 2811 can be modified by the ions and radicals generated in the high-density plasma 2810. Note that it is preferable in some cases to apply a bias to the substrate 2811 side using the high-frequency power source 2816. As the high-frequency power source 2816, an RF (Radio Frequency) power source with a frequency of 13.56 MHz, 27.12 MHz, or the like is used, for example. The application of a bias to the substrate side allows ions in the high-density plasma 2810 to efficiently reach a deep portion of an opening of the film or the like over the substrate 2811.

For example, in the chamber **2706*b* or the chamber 2706*c*, oxygen radical treatment using the high-density plasma 2810 can be performed by introducing oxygen from the gas supply source 2801**.

Next, the chamber **2706*a* and the chamber 2706*d* are described with reference to a schematic cross-sectional view illustrated in FIG. 24**.

The chamber **2706*a* and the chamber 2706*d* are chambers in which an object can be irradiated with electromagnetic waves, for example. Note that the chamber 2706*a* is different from the chamber 2706*d*** only in the kind of the electromagnetic waves. The other structures have many common portions and thus are collectively described below.

The chamber 2706*a* and the chamber 2706*d* each include one or a plurality of lamps 2820, a substrate holder 2825, a gas inlet 2823, and an exhaust port 2830. Furthermore, a gas supply source 2821, a valve 2822, a vacuum pump 2828, and a valve 2829 are provided outside the chamber 2706*a* and the chamber 2706*d*, for example.

The gas supply source 2821 is connected to the gas inlet 2823 through the valve 2822. The vacuum pump 2828 is connected to the exhaust port 2830 through the valve 2829. The lamp 2820 is provided to face the substrate holder 2825. The substrate holder 2825 has a function of holding a substrate 2824. Furthermore, the substrate holder 2825 includes a heating mechanism 2826 therein and has a function of heating the substrate 2824.

As the lamp 2820, a light source having a function of emitting electromagnetic waves such as visible light or ultraviolet light is used, for example. For example, a light source having a function of emitting electromagnetic waves which have a peak in a wavelength region of longer than or equal to 10 nm and shorter than or equal to 2500 nm, longer than or equal to 500 nm and shorter than or equal to 2000 nm, or longer than or equal to 40 nm and shorter than or equal to 340 nm is used.

As the lamp 2820, a light source such as a halogen lamp, a metal halide lamp, a xenon arc lamp, a carbon arc lamp, a high-pressure sodium lamp, or a high-pressure mercury lamp is used, for example.

For example, part or the whole of electromagnetic waves emitted from the lamp 2820 is absorbed by the substrate 2824, so that the quality of a film or the like over the substrate 2824 can be modified. For example, generation or reduction of defects or removal of impurities can be performed. Note that generation or reduction of defects, removal of impurities, or the like can be efficiently performed while the substrate 2824 is heated.

Alternatively, for example, the electromagnetic waves emitted from the lamp 2820 may generate heat in the substrate holder 2825 to heat the substrate 2824. In that case, the substrate holder 2825 does not need to include the heating mechanism 2826 therein.

For the vacuum pump 2828, refer to the description of the vacuum pump 2817. Furthermore, for the heating mechanism 2826, refer to the description of the heating mechanism 2813. Furthermore, for the gas supply source 2821, refer to the description of the gas supply source 2801.

Figure 25:
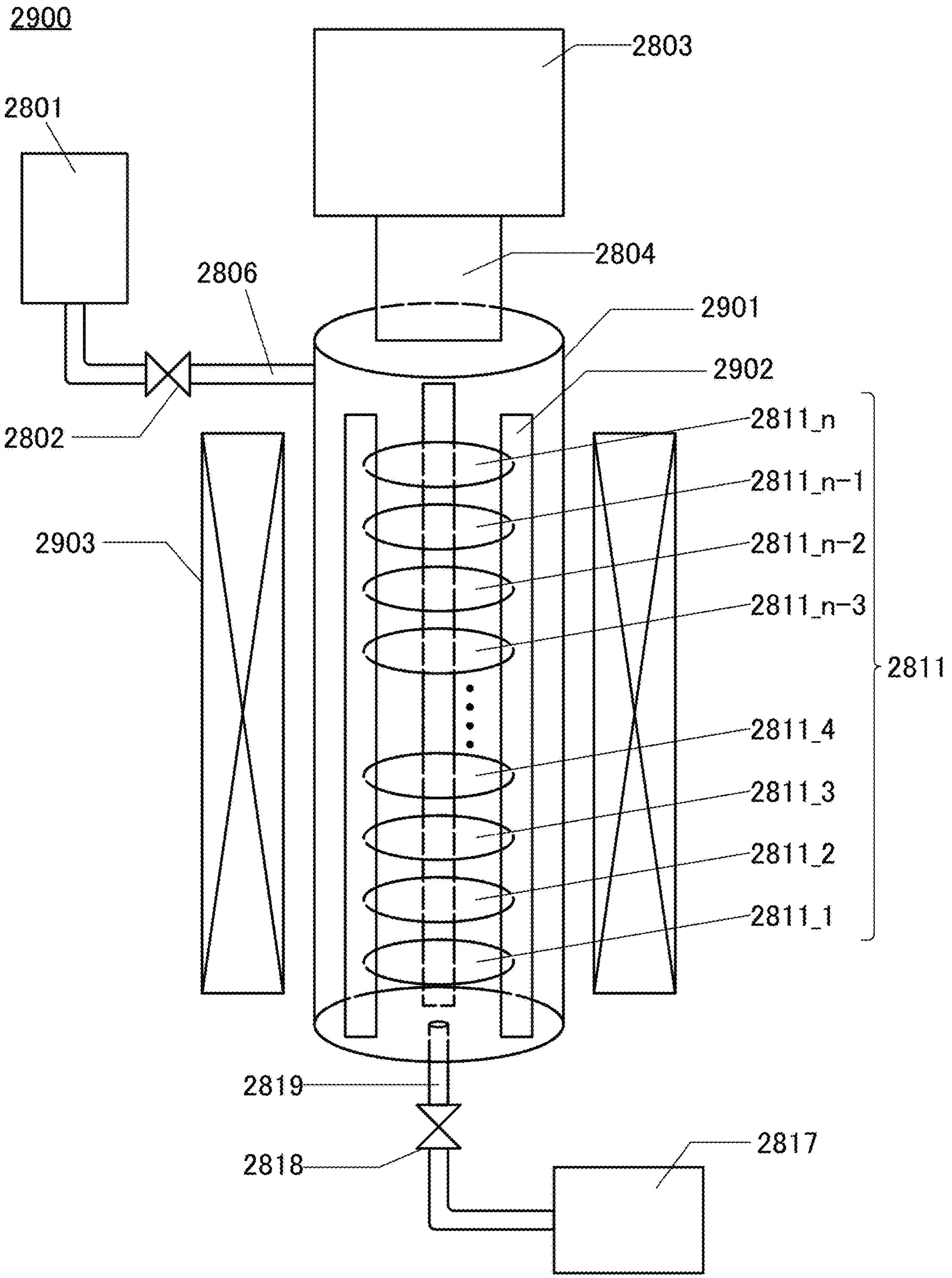
FIG. 25 is a cross-sectional view illustrating a microwave treatment apparatus of one embodiment of the present invention.

A microwave treatment apparatus that can be used in this embodiment is not limited to the above. It is possible to use a microwave treatment apparatus 2900 illustrated in FIG. 25. The microwave treatment apparatus 2900 includes a quartz tube 2901, the exhaust port 2819, the gas supply source 2801, the valve 2802, the high-frequency generator 2803, the waveguide 2804, the gas pipe 2806, the vacuum pump 2817, and the valve 2818. Furthermore, the microwave treatment apparatus 2900 includes a substrate holder 2902 that holds a plurality of substrates 2811 (2811_1 to 2811_*n*, n is an integer greater than or equal to 2) in the quartz tube 2901. The microwave treatment apparatus 2900 may further include a heating means 2903 outside the quartz tube 2901.

The substrate placed in the quartz tube 2901 is irradiated with the microwaves generated by the high-frequency generator 2803 and passing through the waveguide 2804. The vacuum pump 2817 is connected to the exhaust port 2819 through the valve 2818 and can adjust the pressure inside the quartz tube 2901. The gas supply source 2801 is connected to the gas pipe 2806 through the valve 2802 and can introduce a desired gas into the quartz tube 2901. The heating means 2903 can heat the substrate 2811 in the quartz tube 2901 to a desired temperature. Alternatively, the heating means 2903 may heat the gas which is supplied from the gas supply source 2801. With the use of the microwave treatment apparatus 2900, the substrate 2811 can be subjected to heat treatment and microwave treatment at the same time. Alternatively, the substrate 2811 can be heated and then subjected to microwave treatment. Alternatively, the substrate 2811 can be subjected to microwave treatment and then heat treatment.

All of the substrate 2811_1 to the substrate 2811_*n* may be substrates to be treated where a semiconductor device or a memory device is to be formed, or some of the substrates may be dummy substrates. For example, the substrate 2811_1 and the substrate 2811_*n* may be dummy substrates and the substrate 2811_2 to the substrate 2811_*n*−1 may be substrates to be treated. Alternatively, the substrate 2811_1, the substrate 2811_2, the substrate 2811_*n*−1, and the substrate 2811_*n* may be dummy substrates and the substrate 2811_3 to the substrate 2811_*n*−2 may be substrates to be treated. A dummy substrate is preferably used, in which case a plurality of substrates to be treated can be uniformly treated at the time of microwave treatment or heat treatment and a variation between the substrates to be treated can be reduced. For example, a dummy substrate is preferably placed over the substrate to be treated which is the closest to the high-frequency generator 2803 and the waveguide 2804, in which case the substrate to be treated is inhibited from being directly exposed to microwaves.

With the use of the above-described manufacturing apparatus, the quality of a film or the like can be modified while the entry of impurities into an object is inhibited.

This embodiment can be implemented in an appropriate combination with the structures described in the other embodiments and the like.

Embodiment 2

Figure 26:
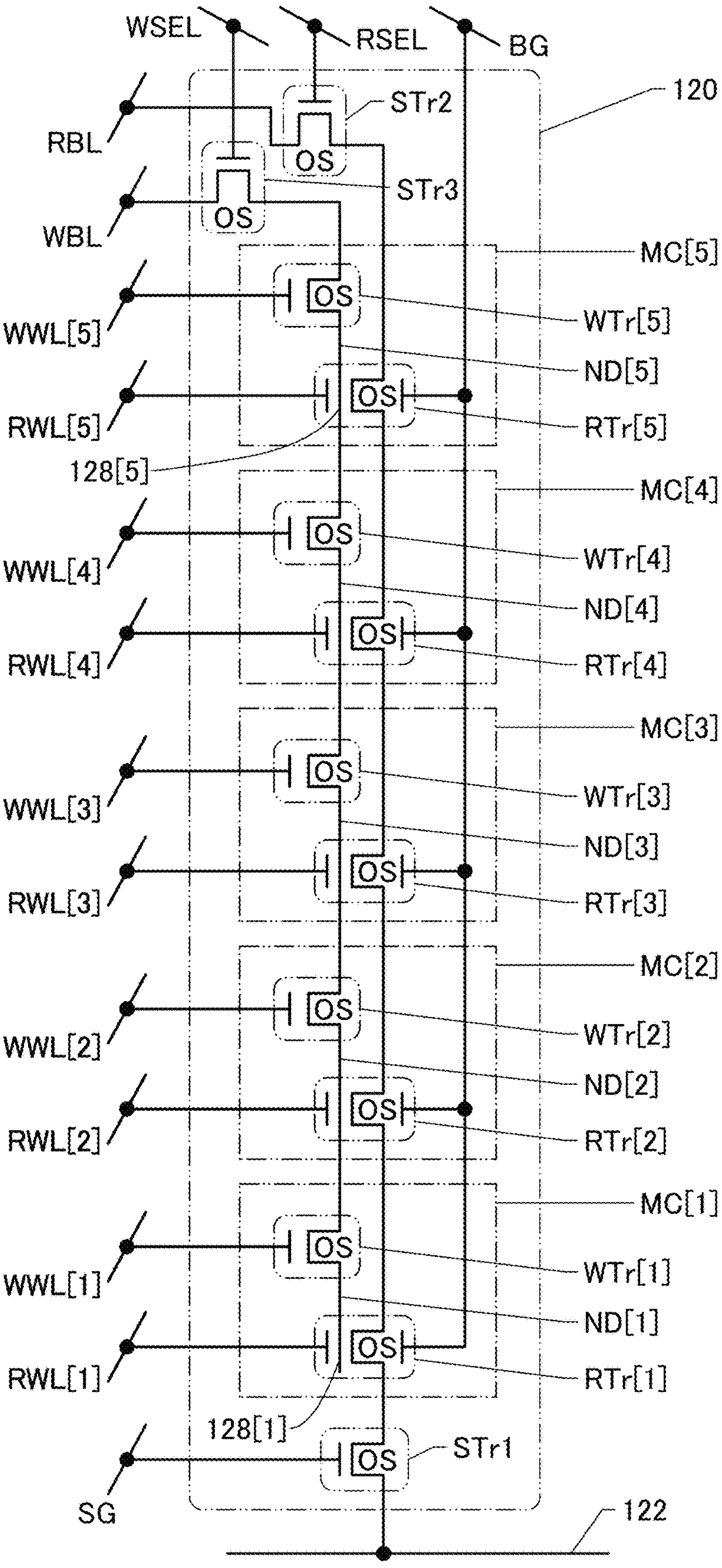
FIG. 26 illustrates a circuit structure example of a memory string.
Figure 27:
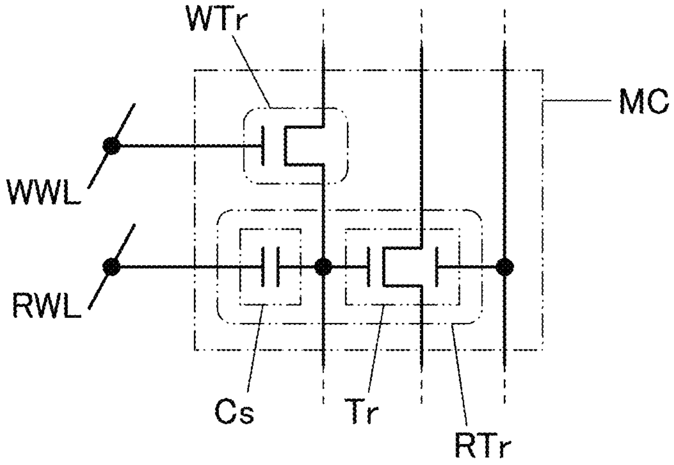
FIG. 27 illustrates a circuit structure example of a memory string.

In this embodiment, a circuit structure and operations of the memory string 120 that is a memory device will be described. FIG. 26 illustrates a circuit structure example of the memory string 120. FIG. 27 is an equivalent circuit diagram of a memory element MC.

In the drawings and the like, for easy understanding of the potential of a wiring, an electrode, a conductor, or the like, "H" representing an H potential or "L" representing an L potential is sometimes written near the wiring, the electrode, the conductor, or the like. In addition, enclosed "H" or "L" is sometimes written near a wiring, an electrode, a conductor, or the like whose potential has changed. Moreover, a symbol "x" is sometimes written on a transistor in an off state.

<Circuit Structure Example of Memory String>

FIG. 26 illustrates a circuit structure example of the memory string 120 including five memory elements MC. The memory elements MC each include a transistor WTr and a transistor RTr. In FIG. 26, the transistor WTr included in a memory element MC[1] is denoted as a transistor WTr[1], and the transistor RTr included in the memory element MC[1] is denoted as a transistor RTr[1]. Thus, the memory string 120 illustrated in FIG. 26 includes the transistor WTr[1] to a transistor WTr[5] and the transistor RTr[1] to a transistor RTr[5]. Furthermore, the memory string 120 illustrated in FIG. 26 includes a transistor STr1, a transistor STr2, and a transistor STr3. The memory string 120 is a NAND memory device.

To clarify that a transistor is an OS transistor in an equivalent circuit diagram and the like, "OS" is sometimes written beside a circuit symbol of the transistor. Similarly, to clarify that a transistor is a Si transistor (a transistor using silicon in a semiconductor layer where a channel is formed), "Si" is sometimes written beside a circuit symbol of the transistor. FIG. 26 illustrates that the transistors WTr and the transistors RTr are OS transistors.

A NAND memory device including an OS memory is referred to as an "OS NAND type" or an "OS NAND memory device." An OS NAND memory device in which a plurality of OS memories are stacked in the Z direction is referred to as a "3D OS NAND type" or a "3D OS NAND memory device."

The transistor WTr is a normally-off transistor. The transistor RTr is a normally-on transistor. As described in the above embodiment, the transistor RTr includes the conductor 128 between the gate and the semiconductor layer. The conductor 128 can function as a floating gate of the transistor RTr. For example, the conductor 128 included in the transistor RTr[1] is referred to as a conductor 128[1].

A contact where the conductor 128 and one of a source and a drain of the transistor WTr are electrically connected to each other is referred to as a node ND. For example, a contact where the conductor 128[1] and one of a source and a drain of the transistor WTr[1] are electrically connected to each other is referred to as a node ND[1].

One of a source and a drain of the transistor RTr[1] is electrically connected to one of a source and a drain of the transistor STr1, and the other is electrically connected to one of a source and a drain of the transistor RTr[2]. A gate of the transistor RTr[1] is electrically connected to the conductor RWL[1]. A back gate of the transistor RTr[1] is electrically connected to the conductor BG. The one of the source and the drain of the transistor WTr[1] is electrically connected to the conductor 128[1] and the other is electrically connected to a conductor 128[2]. A gate of the transistor WTr[1] is electrically connected to the conductor WWL[1]. Furthermore, the other of the source and the drain of the transistor STr1 is electrically connected to the conductor 122, and a gate of the transistor STr1 is electrically connected to the conductor SG.

Here, as illustrated in FIG. 27, the transistor RTr can be represented by being replaced with a capacitor Cs and a transistor Tr. A gate of the transistor Tr is electrically connected to the conductor RWL through the capacitor Cs.

One of a source and a drain of the transistor RTr[5] is electrically connected to the other of a source and a drain of a transistor RTr[4], and the other is electrically connected to one of a source and a drain of the transistor STr2. A gate of the transistor RTr[5] is electrically connected to the conductor RWL[5]. A back gate of the transistor RTr[5] is electrically connected to the conductor BG. One of a source and a drain of the transistor WTr[5] is electrically connected to a conductor 128[5], and the other is electrically connected to one of a source and a drain of the transistor STr3. A gate of the transistor WTr[5] is electrically connected to the conductor WWL[5]. The other of the source and the drain of the transistor STr2 is electrically connected to the conductor RBL, and a gate of the transistor STr2 is electrically connected to the conductor RSEL. The other of the source and the drain of the transistor STr3 is electrically connected to the conductor WBL, and the gate of the transistor STr3 is electrically connected to the conductor WSEL.

In the case where the memory string 120 includes n memory elements MC (nis an integer greater than or equal to 1), in an i-th (i is an integer greater than or equal to 1 and less than or equal to n) memory element MC[i] except the first and n-th memory elements MC, one of a source and a drain of a transistor RTr[i] is electrically connected to the other of a source and a drain of a transistor RTr[i−1], and the other is electrically connected to one of a source and a drain of a transistor RTr[i+1]. A gate of the transistor RTr[i] is electrically connected to a conductor RWL[i]. A back gate of the transistor RTr[i] is electrically connected to the conductor BG. One of a source and a drain of a transistor WTr[i] is electrically connected to a conductor 128[i] and the other is electrically connected to a conductor 128[i−1]. A gate of the transistor WTr[i] is electrically connected to a conductor WWL[i].

The transistor STr1 and the transistor STr2 may be OS transistors or Si transistors, for example. One of the transistor STr1 and the transistor STr2 may be an OS transistor, and the other may be a Si transistor. Note that in the case where both the transistors WTr and the transistors RTr are formed of OS transistors, the transistor STr1 and the transistor STr2 are preferably also formed of OS transistors. By using the same semiconductor material for the transistors, the productivity of the semiconductor device can be increased.

Figure 28:
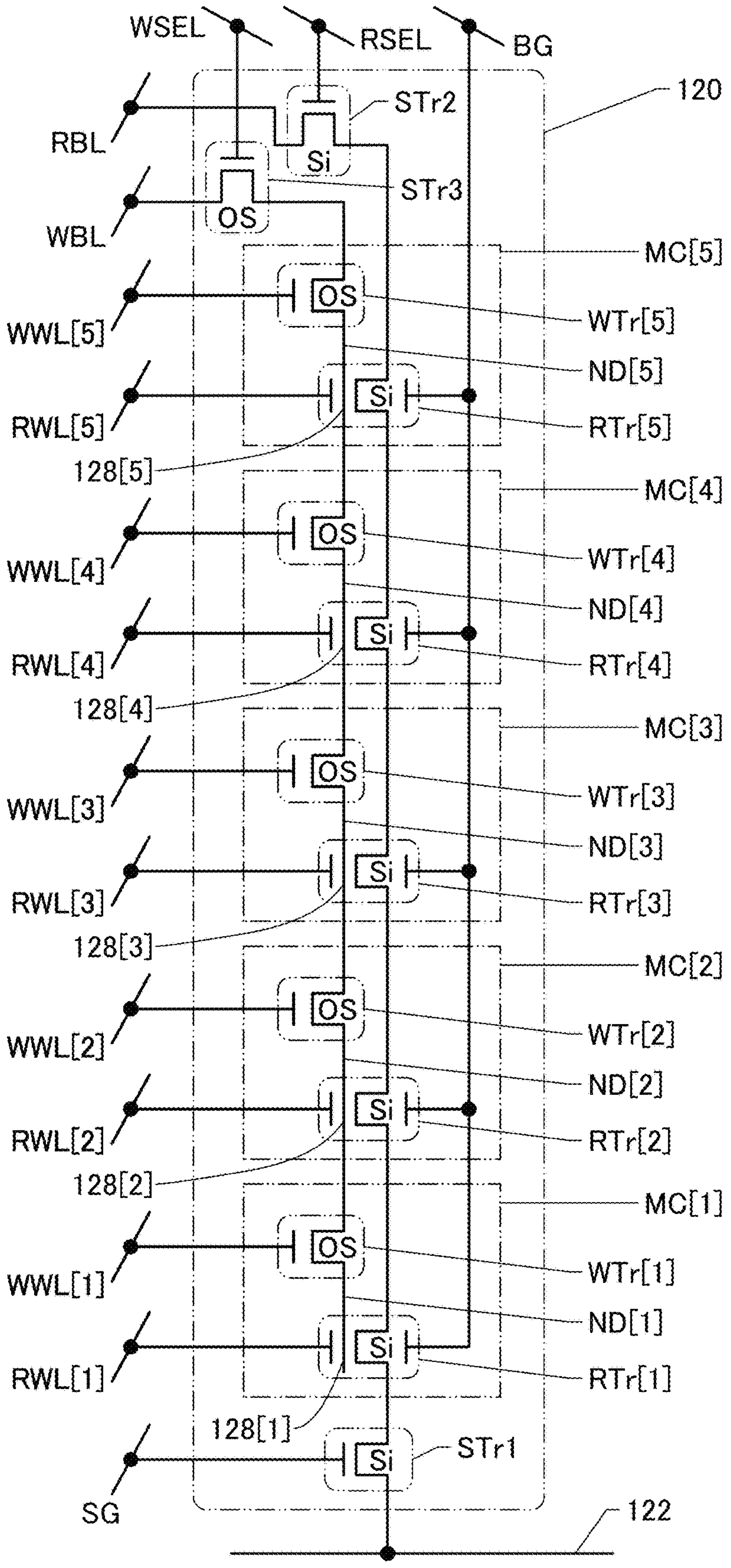
FIG. 28 illustrates a circuit structure example of a memory string.

Alternatively, OS transistors may be used as the transistors WTr, and Si transistors may be used as the transistors RTr. FIG. 28 is an equivalent circuit diagram of the memory string 120 in the case where OS transistors are used as the transistors WTr and Si transistors are used as the transistors RTr.

In the case where the transistors RTr are formed of Si transistors, polycrystalline silicon is used as the semiconductor 125, for example. In the case where the transistors WTr are formed of OS transistors, CAAC-IGZO is used as the semiconductor 127, for example.

Figure 29:
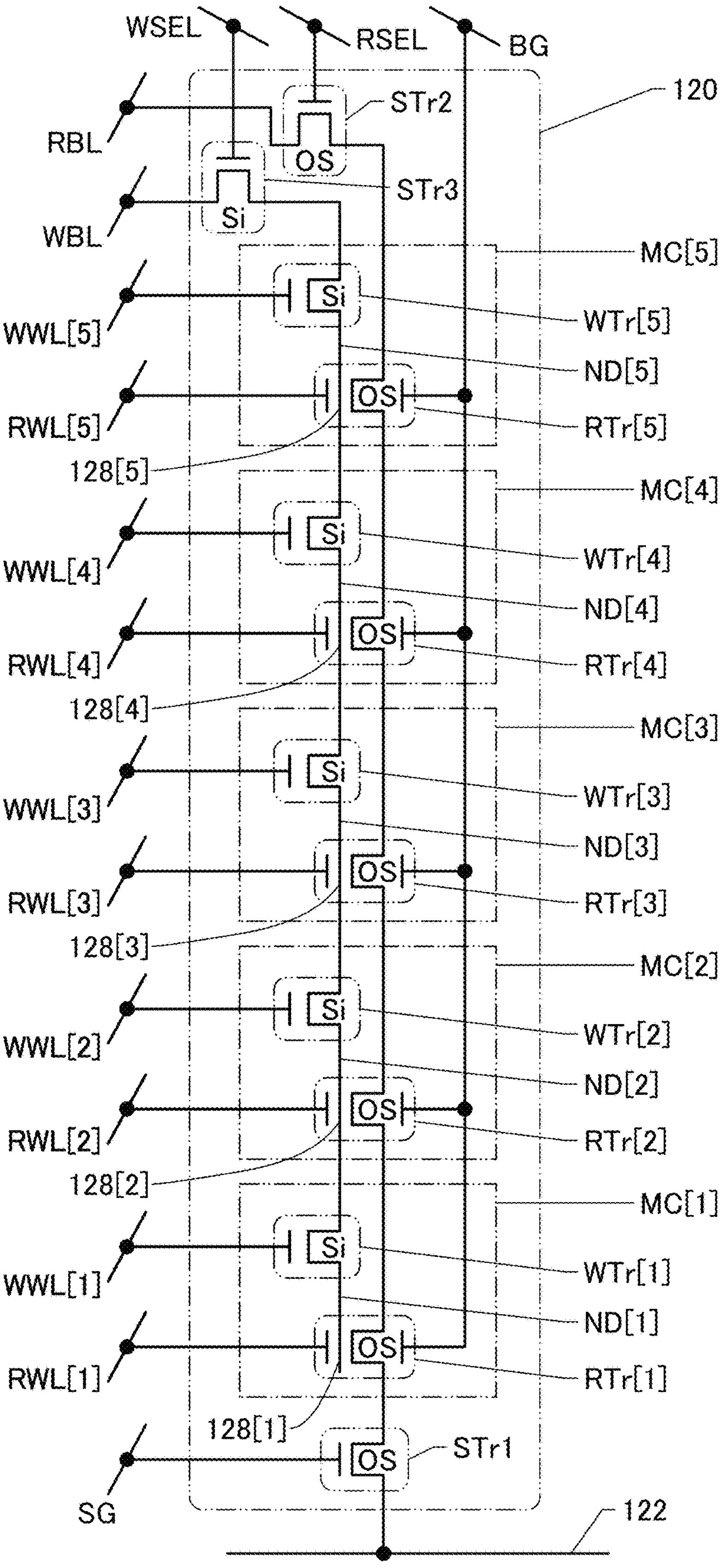
FIG. 29 illustrates a circuit structure example of a memory string.
Figure 30:
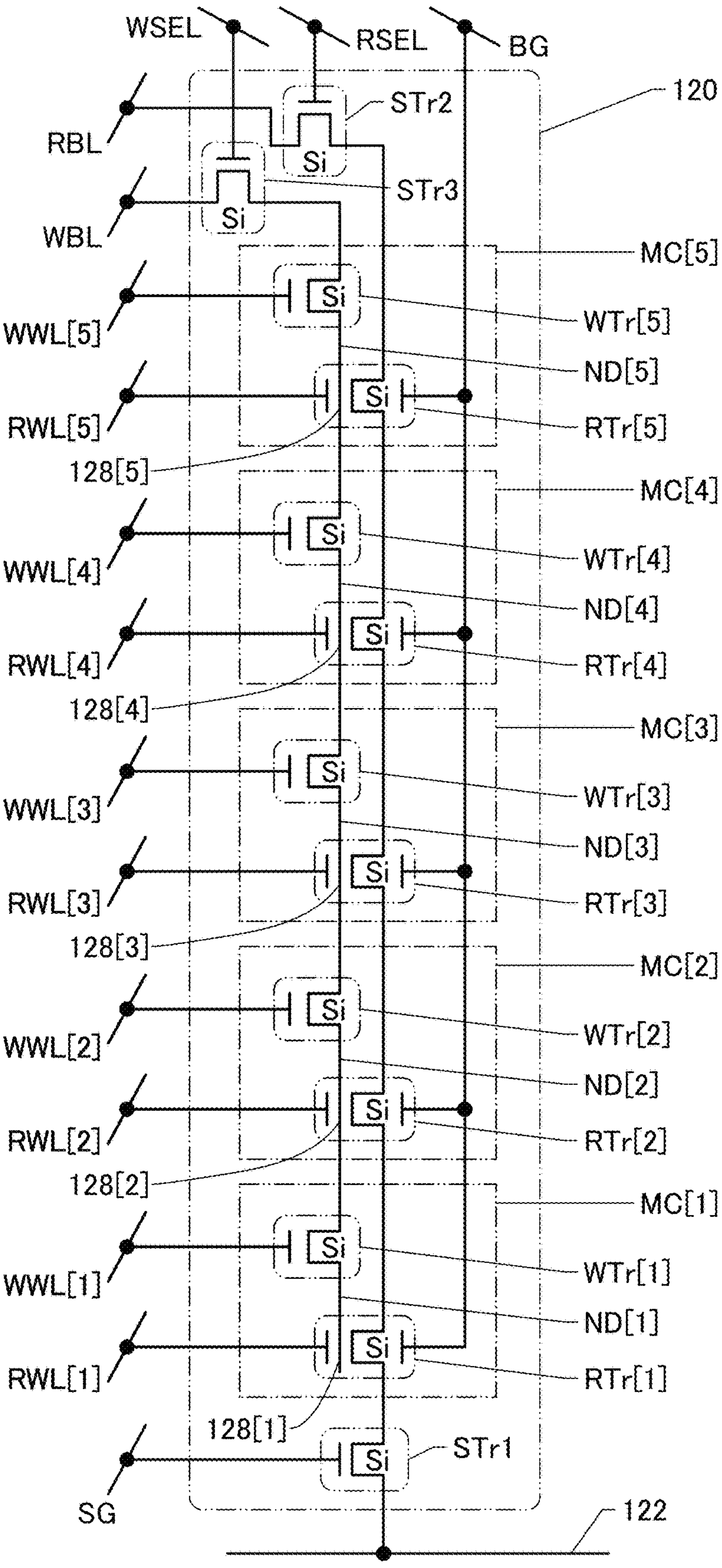
FIG. 30 illustrates a circuit structure example of a memory string.

As illustrated in FIG. 29, Si transistors may be used as the transistors WTr and OS transistors may be used as the transistors RTr depending on the purpose, application, or the like. As illustrated in FIG. 30, Si transistors may be used as both the transistors WTr and the transistors RTr depending on the purpose, application, or the like. In the case where Si transistors are used as both the transistors WTr and the transistors RTr, Si transistors are preferably also used as the transistor STr1 and the transistor STr2.

<Operation Example of Memory String>

Next, an operation example of the memory string 120 illustrated in FIG. 26 is described.

[Writing Operation]

Figure 31:
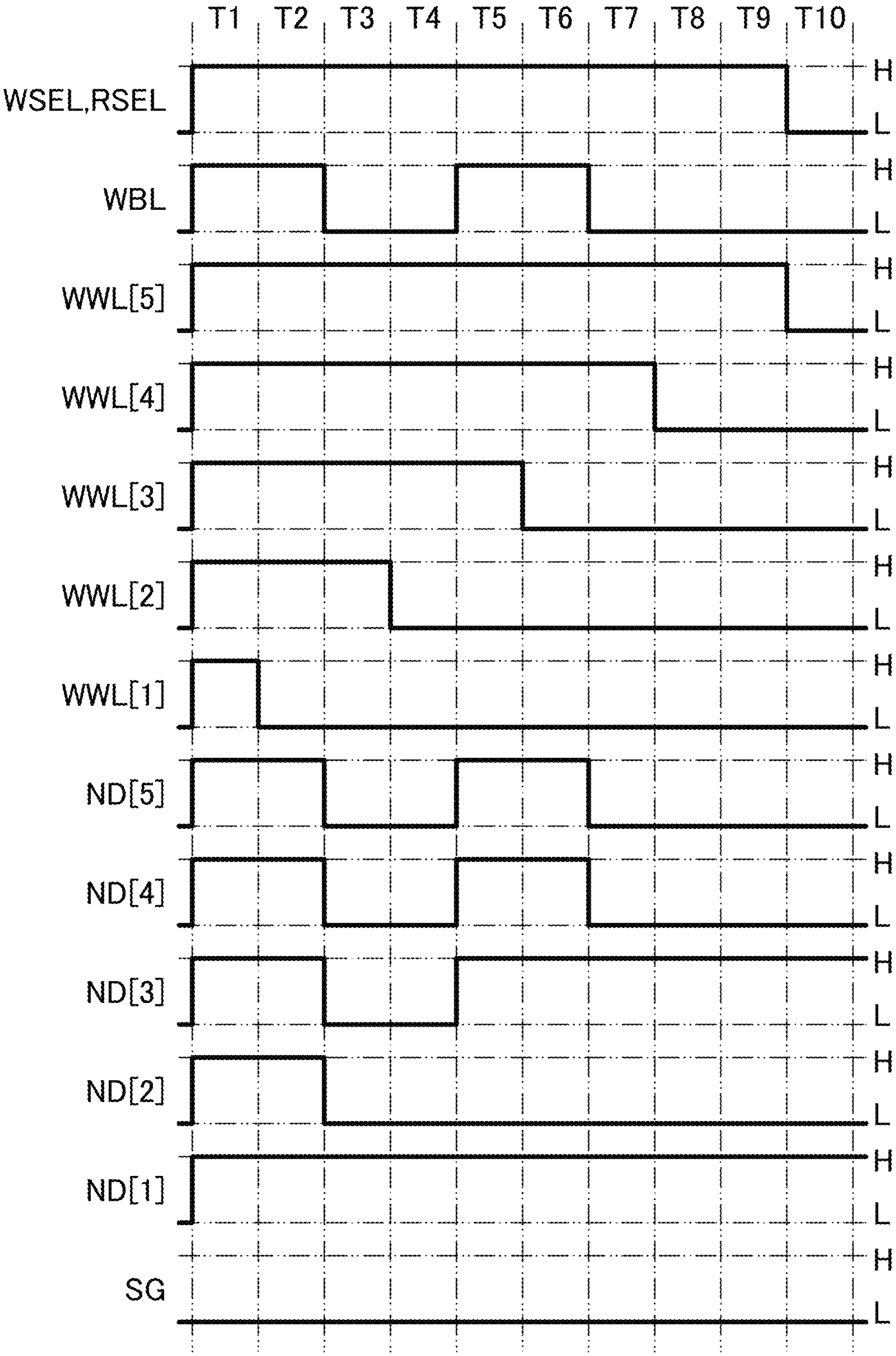
FIG. 31 is a timing chart showing a writing operation example of a memory string.

In this embodiment, an operation example of the case where the H potential is written to the memory element MC[1] and a memory element MC[3] and the L potential is written to the other memory elements MC is described. FIG. 31 is a timing chart showing a writing operation. FIG. 32A to FIG. 36B are circuit diagrams for explaining the writing operation.

In an initial state, it is assumed that the L potential is written to the memory element MC[1] to the memory element MC[5]. Furthermore, it is assumed that the L potential is supplied to the conductor WWL[1] to the conductor WWL[5], the conductor RWL[1] to the conductor RWL[5], the conductor WSEL, the conductor RSEL, the conductor BG, the conductor WBL, the conductor RBL, the conductor SG, and the conductor 122. Note that the conductor BG can control the threshold of the transistor RTr. The potential to be supplied to the conductor BG may be adjusted appropriately so that the transistor RTr can be a desired normally-on transistor. Although description is made assuming that the conductor WSEL and the conductor RSEL are one conductor, they may be different conductors.

[Period T1]

Figure 32A:
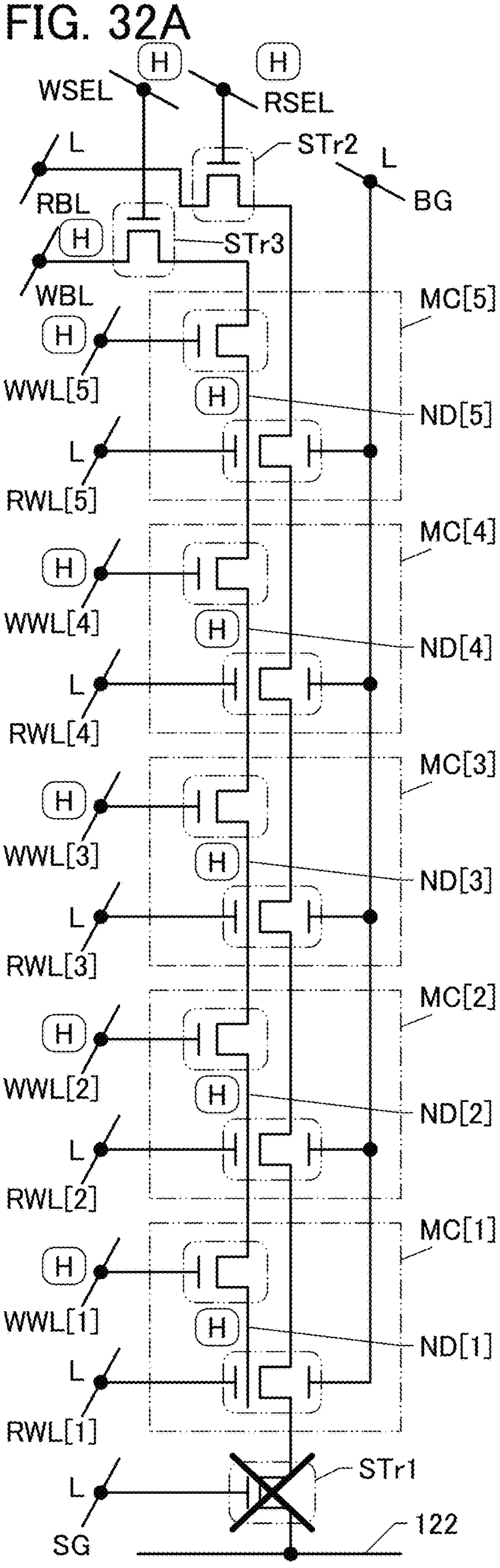
FIG. 32A and FIG. 32B are circuit diagrams each illustrating a writing operation example of a memory string.

In Period T1, the H potential is supplied to the conductor WWL[1] to the conductor WWL[5], the conductor WBL, and the conductor WSEL (and the conductor RSEL) (see FIG. 32A). Then, the node ND[1] to a node ND[5] have the H potential.

[Period T2]

Figure 32B:
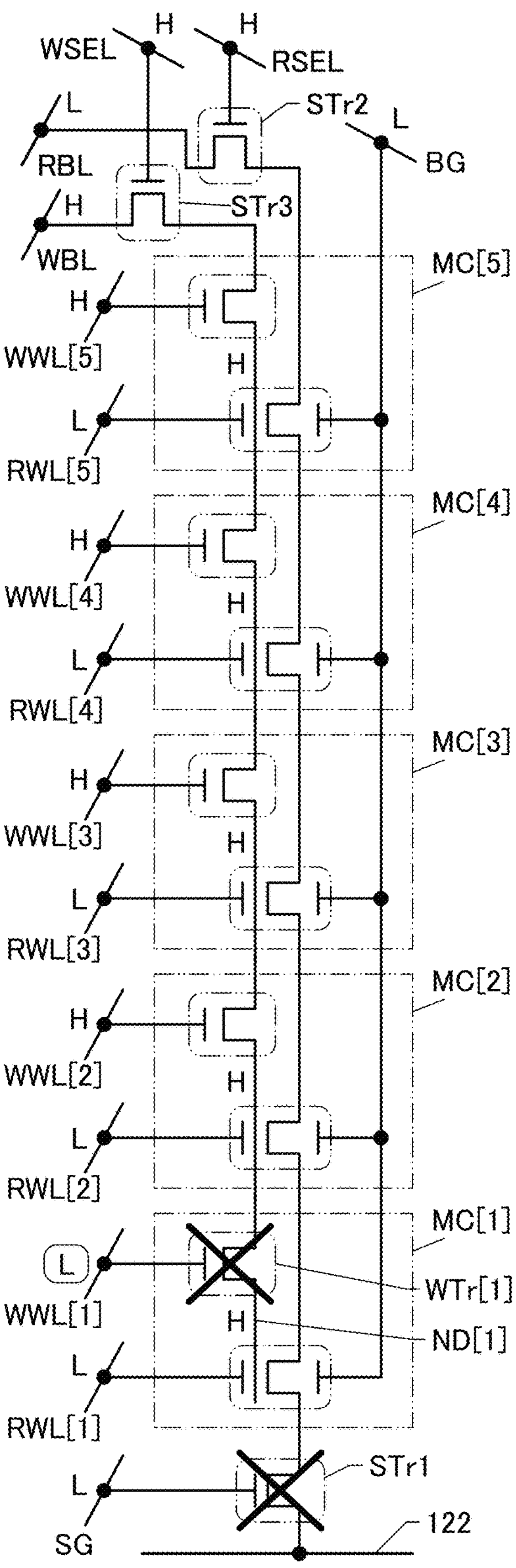

In Period T2, the L potential is supplied to the conductor WWL[1] (see FIG. 32B). This brings the transistor WTr[1] into an off state, and charge written to the node ND[1] is retained. Here, the charge corresponding to the H potential is retained.

[Period T3]

Figure 33A:
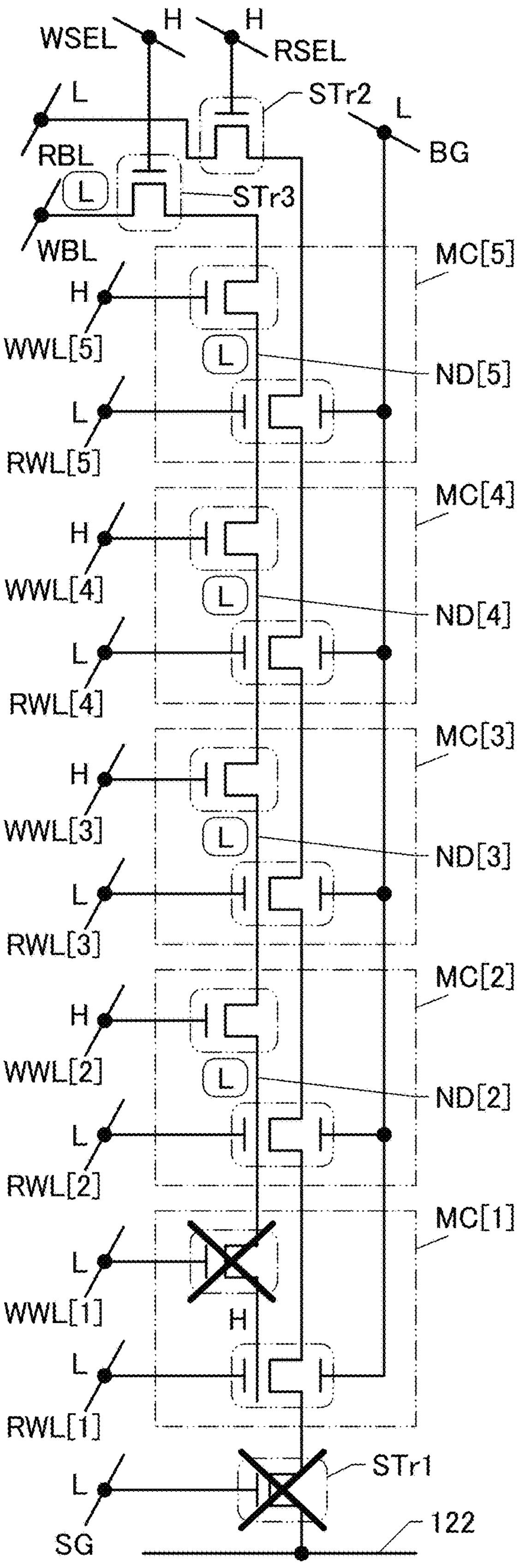
FIG. 33A and FIG. 33B are circuit diagrams each illustrating a writing operation example of a memory string.

In Period T3, the L potential is supplied to the conductor WBL (see FIG. 33A). This brings the potentials of the node ND[2] to the node ND[5] into the L potential. In this case, the conductor 128[2] to the conductor 128[5] are also brought into the L potential; however, since the transistors RTr are normally-on transistors, the transistor RTr[2] to the transistor RTr[5] are not brought into an off state.

[Period T4]

Figure 33B:
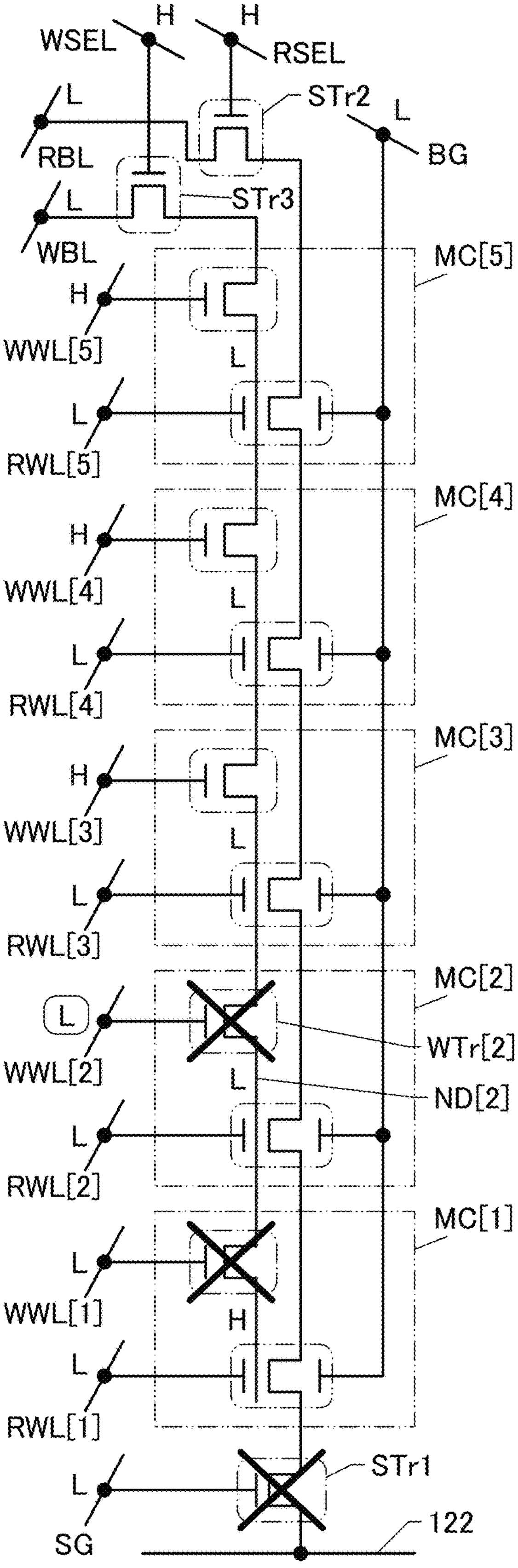

In Period T4, the L potential is supplied to the conductor WWL[2] (see FIG. 33B). This brings the transistor WTr[2] into an off state, and charge written to the node ND[2] is retained.

Here, the charge corresponding to the L potential is retained.

[Period T5]

Figure 34A:
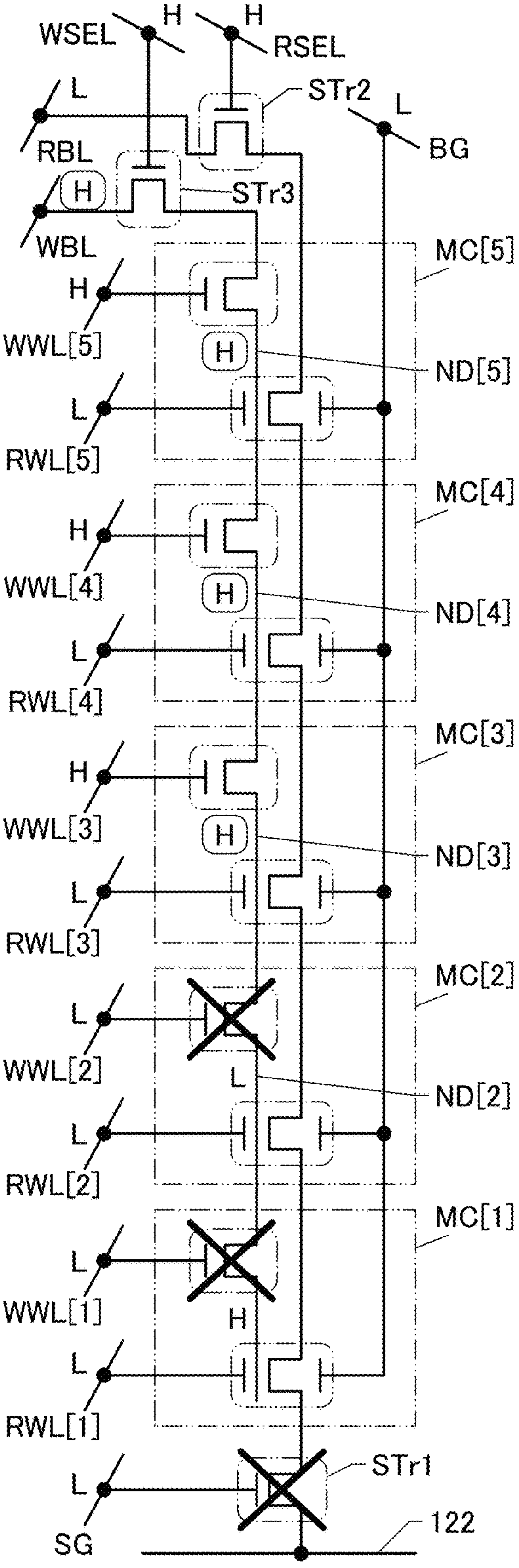
FIG. 34A and FIG. 34B are circuit diagrams each illustrating a writing operation example of a memory string.

In Period T5, the H potential is supplied to the conductor WBL (see FIG. 34A). This brings the potentials of the node [3] to the node [5] into the H potential.

[Period T6]

Figure 34B:
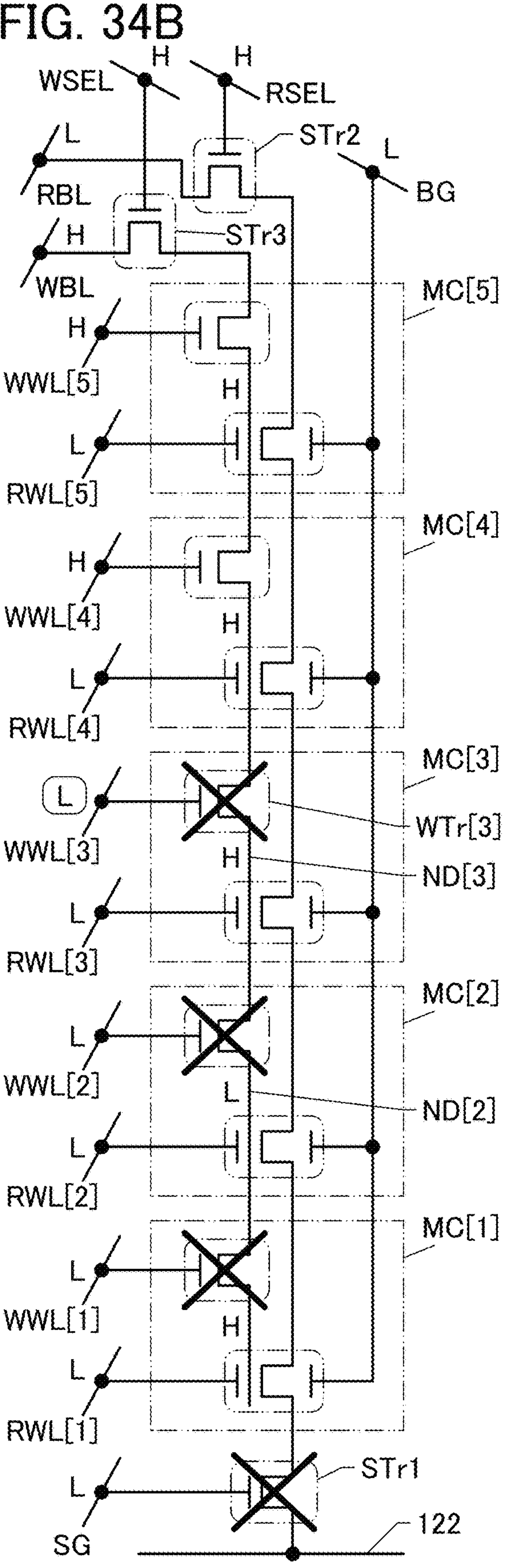

In Period T6, the L potential is supplied to the conductor WWL[3] (see FIG. 34B). This brings the transistor WTr[3] into an off state, and charge written to the node ND[3] is retained.

Here, the charge corresponding to the H potential is retained.

[Period T7]

Figure 35A:
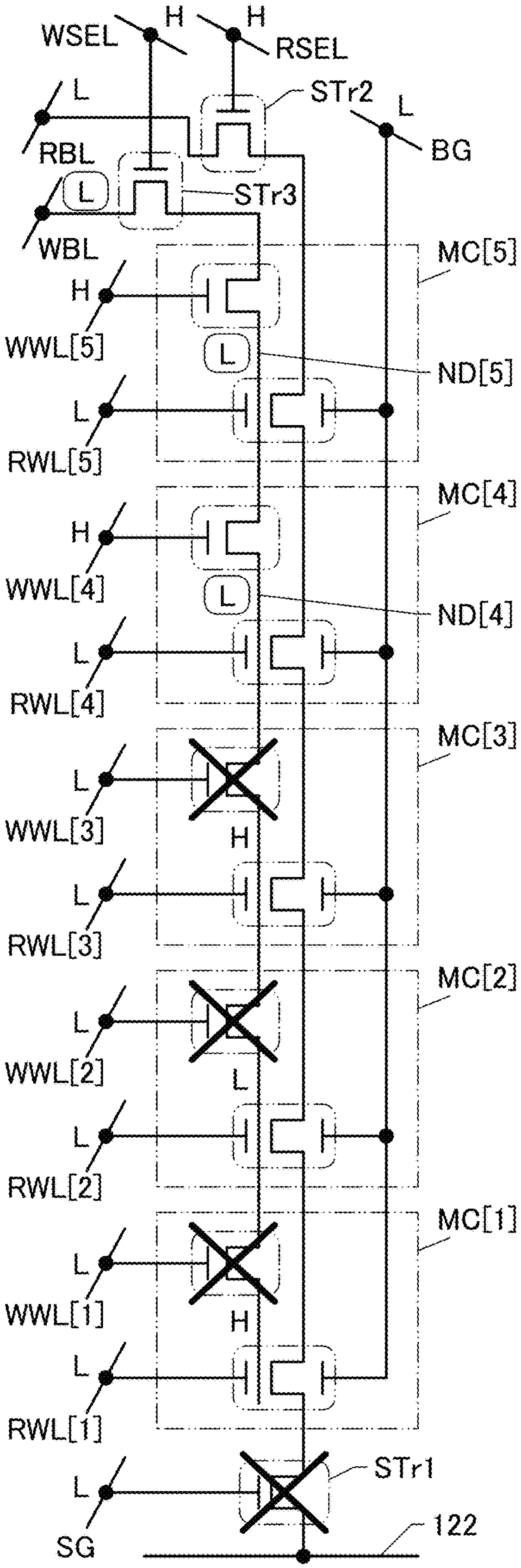
FIG. 35A and FIG. 35B are circuit diagrams each illustrating a writing operation example of a memory string.

In Period T7, the L potential is supplied to the conductor WBL (see FIG. 35A). This brings the potentials of the node ND[4] and the node ND[5] into the L potential.

[Period T8]

Figure 35B:
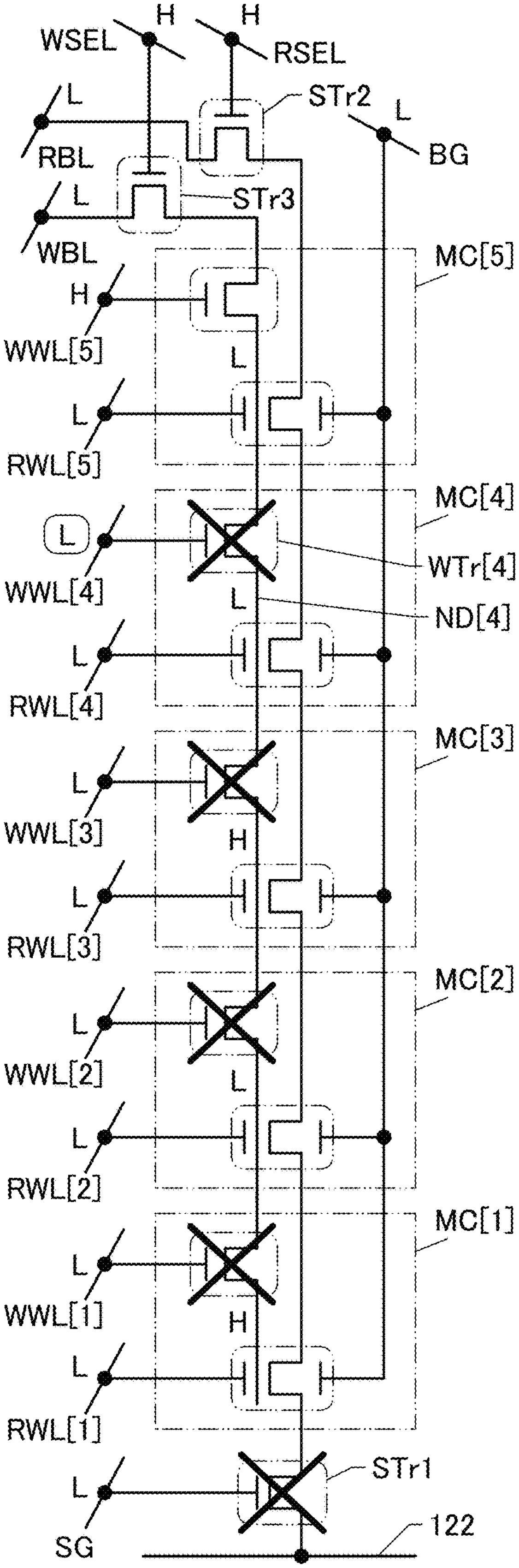

In Period T8, the L potential is supplied to the conductor WWL[4] (see FIG. 35B). This brings the transistor WTr[4] into an off state, and charge written to the node ND[4] is retained. Here, the charge corresponding to the L potential is retained.

[Period T9]

Figure 36A:
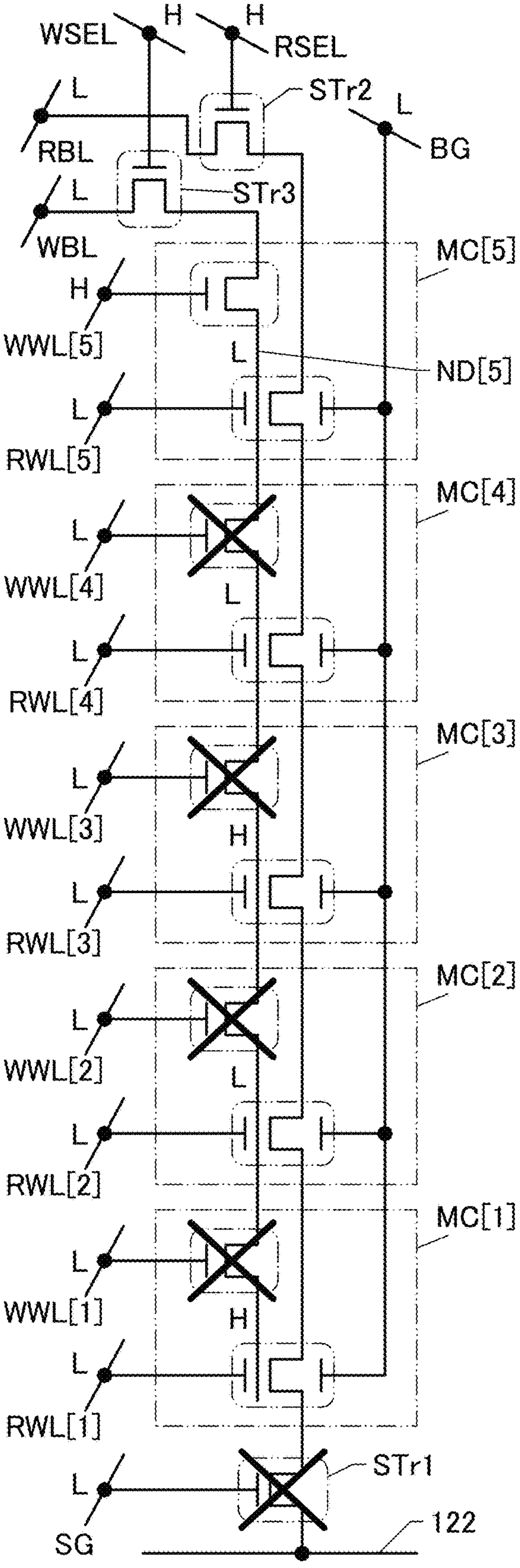
FIG. 36A and FIG. 36B are circuit diagrams each illustrating a writing operation example of a memory string.

In Period T9, the conductor WBL remains at the L potential (see FIG. 36A). Thus, the potential of the node ND[5] also remains at the L potential.

[Period T10]

Figure 36B:
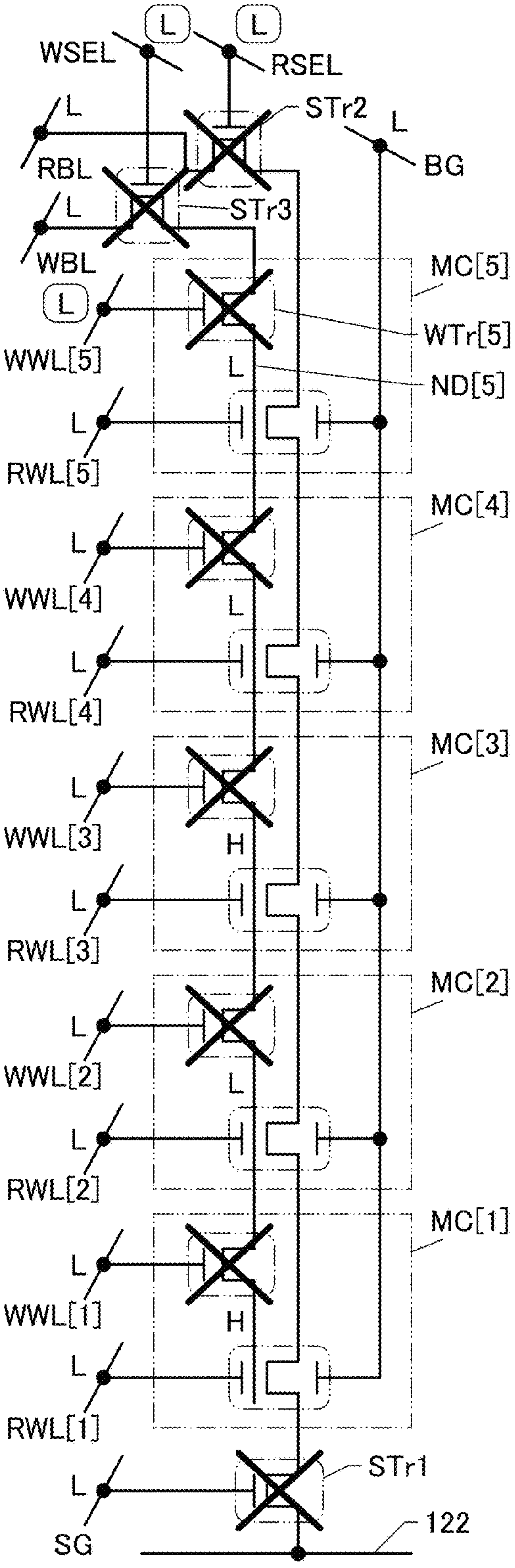

In Period T10, the L potential is supplied to the conductor WWL[5] (see FIG. 36B). This brings the transistor WTr[5] into an off state, and charge written to the node ND[5] is retained. Here, the charge corresponding to the L potential is retained. Furthermore, the L potential is supplied to the conductor WSEL (and the conductor RSEL).

In this manner, data can be written to the memory elements MC.

Note that in the case where data is written to the i-th (except for i=1) memory element MC among the plurality of memory elements MC, a data writing operation for the memory elements MC up to the (i−1)-th memory element can be omitted. For example, in the case where data is written to the memory element MC[4], a data writing operation for the memory element MC[1] to the memory element MC[3] may be omitted. In other words, the writing operation from Period T1 to Period T6 described in this embodiment can be omitted. Therefore, the time and power consumption for the writing operation of the memory device can be reduced.

[Reading Operation]

Figure 37A:
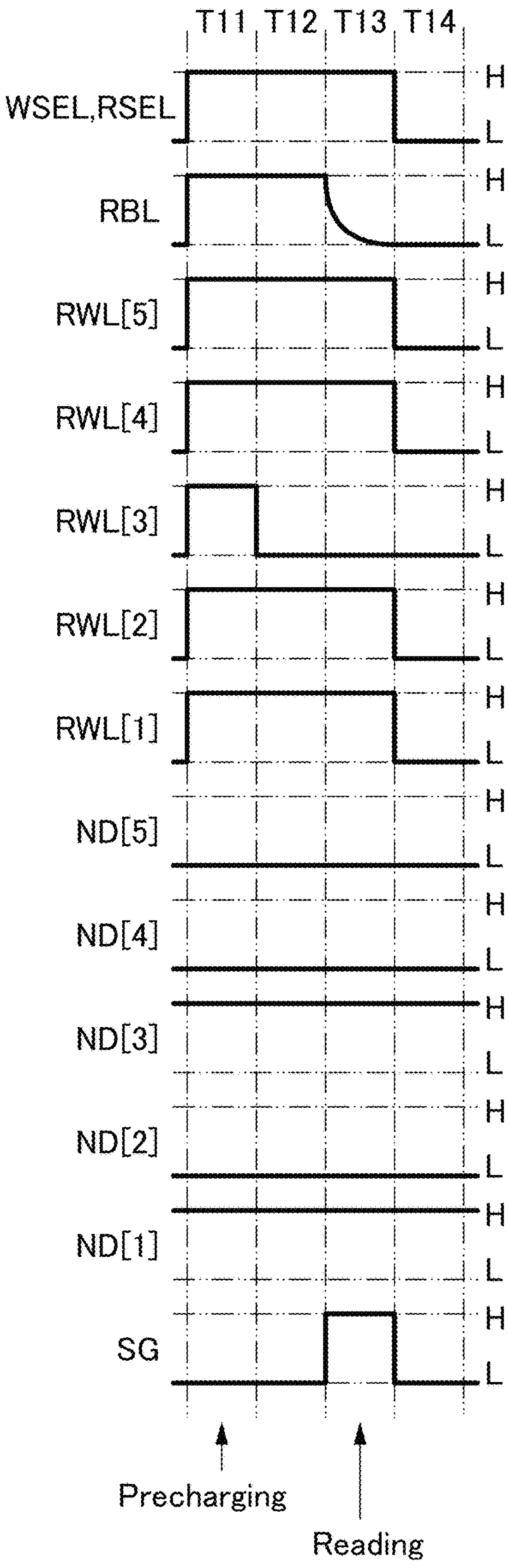
FIG. 37A and FIG. 37B are timing charts each showing a reading operation example of a memory string.
Figure 37B:
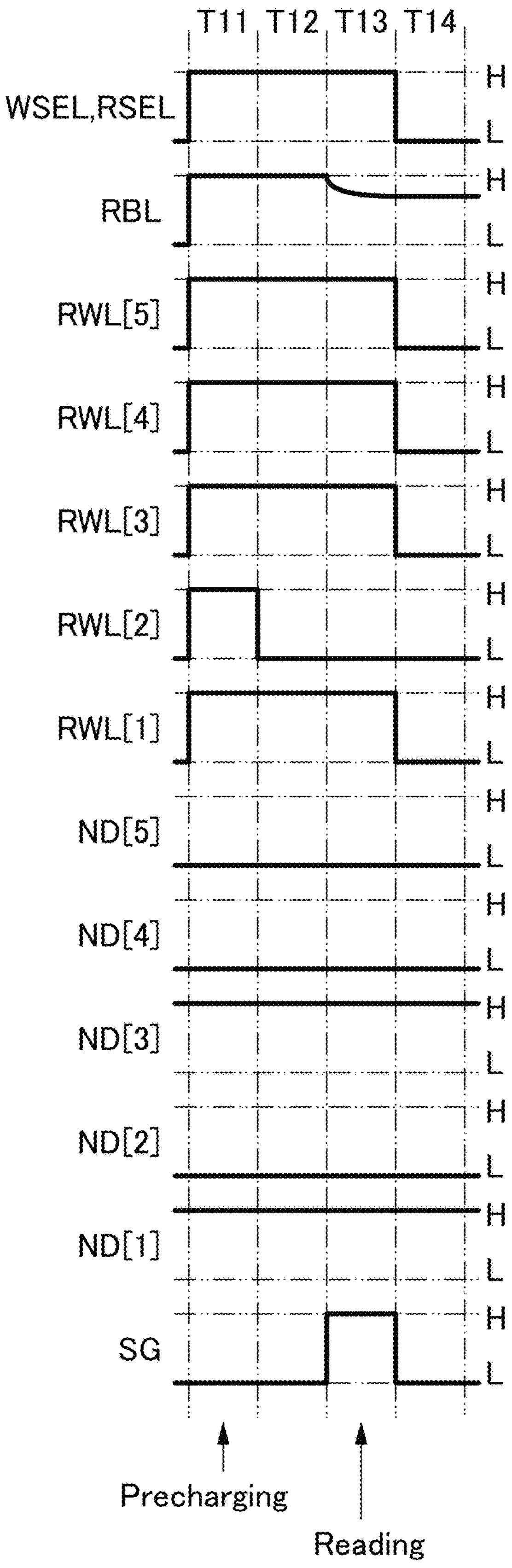

A reading operation example of the memory string 120 with the above-described circuit structure is described. It is assumed that in an initial state, the H potential is retained in the memory element MC[1] and the memory element MC[3]. Furthermore, it is assumed that the L potential is supplied to the conductor WWL[1] to the conductor WWL[5], the conductor RWL[1] to the conductor RWL[5], the conductor WSEL, the conductor RSEL, the conductor BG, the conductor WBL, the conductor RBL, the conductor SG, and the conductor 122. FIG. 37A and FIG. 37B are timing charts showing a reading operation. FIG. 38A to FIG. 39B are circuit diagrams for explaining the reading operation.

<When Retained Potential is H Potential>

First, a reading operation for the memory element MC[3] where the H potential is retained is described.

[Period T11]

Figure 38A:
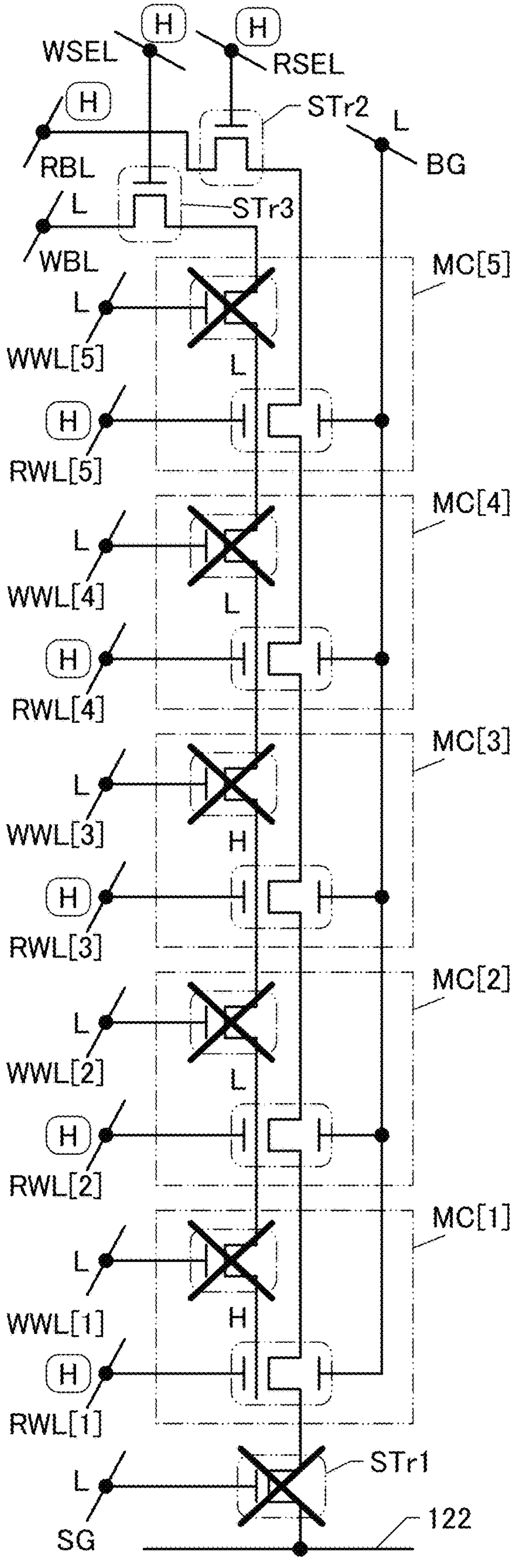
FIG. 38A and FIG. 38B are circuit diagrams each illustrating a reading operation example of a memory string.

In Period T11, the H potential is supplied to the conductor RWL[1] to the conductor RWL[5] and the conductor RSEL (and the conductor WSEL) (see FIG. 38A). This brings the transistor STr2 (and the transistor STr3) into an on state, and the semiconductor 127 included in the transistors RTr and the conductor RBL are brought into conduction. In this state, the conductor RBL and the semiconductor 127 are pre-charged with the H potential and both brought into a floating state.

Figure 40A:
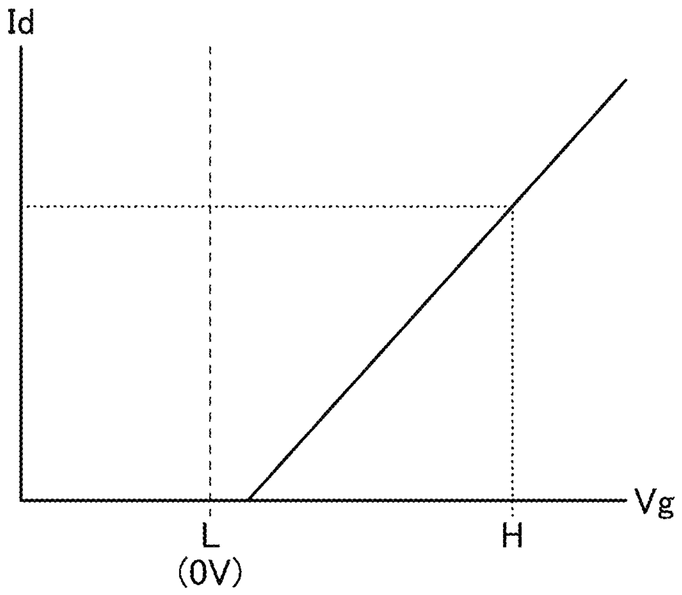
FIG. 40A and FIG. 40B are diagrams each showing Id-Vg characteristics of a transistor.
Figure 40B:
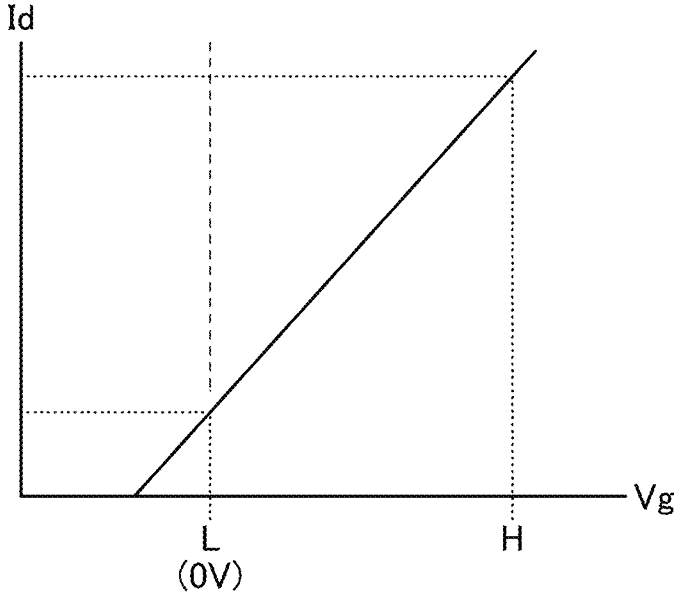

Here, Id-Vg characteristics of transistors are described. FIG. 40A and FIG. 40B are diagrams showing the Id-Vg characteristics of transistors. In FIG. 40A and FIG. 40B, the horizontal axis represents the gate voltage (Vg) and the vertical axis represents the drain current (Id). FIG. 40A shows the Id-Vg characteristics of a normally-off transistor, and FIG. 40B shows the Id-Vg characteristics of a normally-on transistor.

The H potential is higher than the L potential. When the L potential is 0 V, the H potential is a positive voltage. In a normally-off transistor, the channel resistance (channel resistance between the source and the drain) at the time when Vg is the L potential (0 V) is extremely high and Id hardly flows. Furthermore, when Vg becomes the H potential, the channel resistance decreases and Id increases (see FIG. 40A).

In a normally-on transistor, even when Vg is the L potential, the channel resistance is low and a large amount of Id flows compared with the case of the normally-off transistor. Furthermore, when Vg becomes the H potential, the channel resistance further decreases and Id further increases (see FIG. 40B).

Since the transistors RTr are normally-on transistors, even with the potential of the conductors RWL kept at the L potential, precharging of the semiconductor 127 is possible. However, supplying the H potential to the conductors RWL decreases the on resistance of the transistors RTr, and therefore, the time and power consumption necessary for precharging can be reduced.

[Period T12]

Figure 38B:
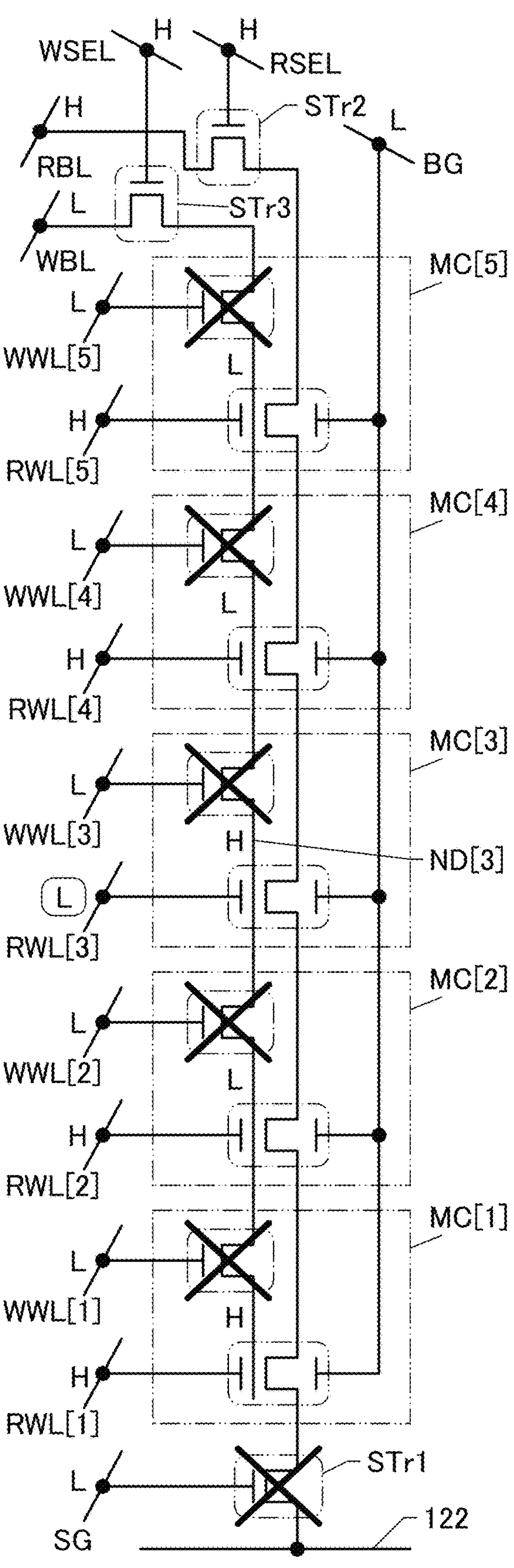

In Period T12, the L potential is supplied to the conductor RWL[3] (see FIG. 38B). Since the H potential is retained in the node ND[3], even when the potential of the conductor RWL[3] becomes the L potential, the channel resistance of the transistor RTr[3] remains low.

[Period T13]

Figure 39A:
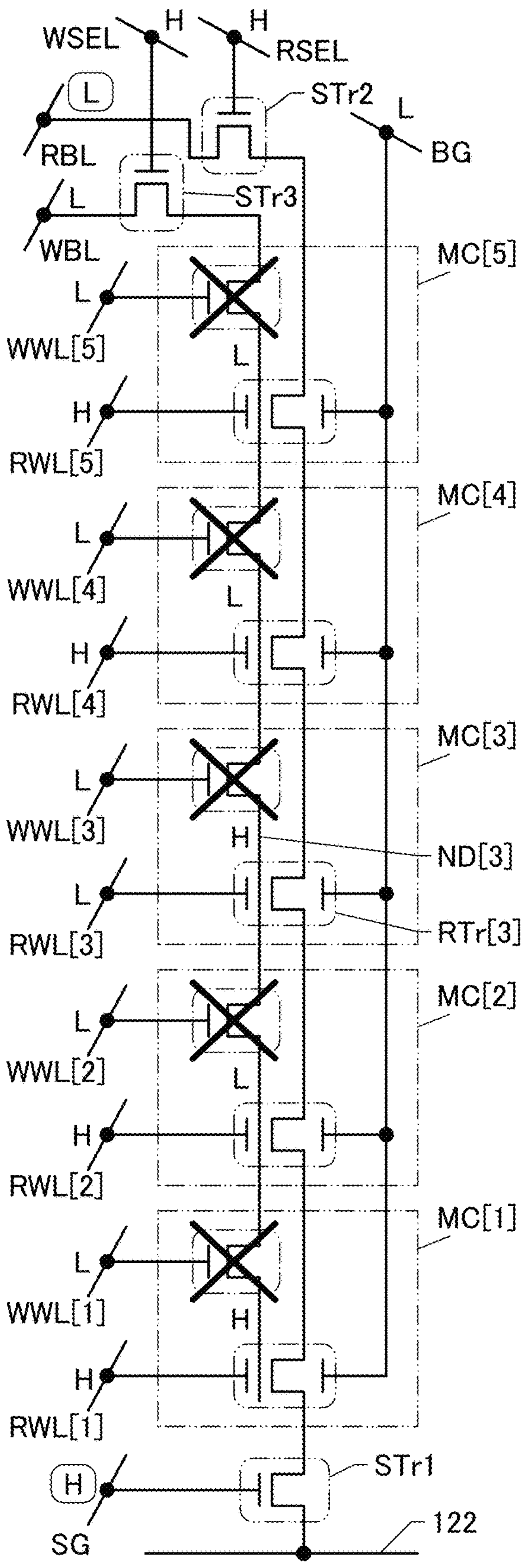
FIG. 39A and FIG. 39B are circuit diagrams each illustrating a reading operation example of a memory string.

In Period T13, the H potential is supplied to the conductor SG to bring the transistor STr1 into an on state (see FIG. 39A). This brings the conductor RBL and the conductor 122 into conduction. In this case, since the H potential is supplied to the conductor RWL[1], the conductor RWL[2], the conductor RWL[4], and the conductor RWL[5], the channel resistances of the transistor RTr[1], the transistor RTr[2], the transistor RTr[4], and the transistor RTr[5] are low regardless of the potentials of the nodes ND. Although the L potential is supplied to the conductor RWL[3], the H potential is retained in the node ND[3] and thus the channel resistance of the transistor RTr[3] is also low. Hence, the potential of the conductor RBL in a floating state changes abruptly from the H potential to the L potential (see FIG. 37A).

[Period T14]

Figure 39B:
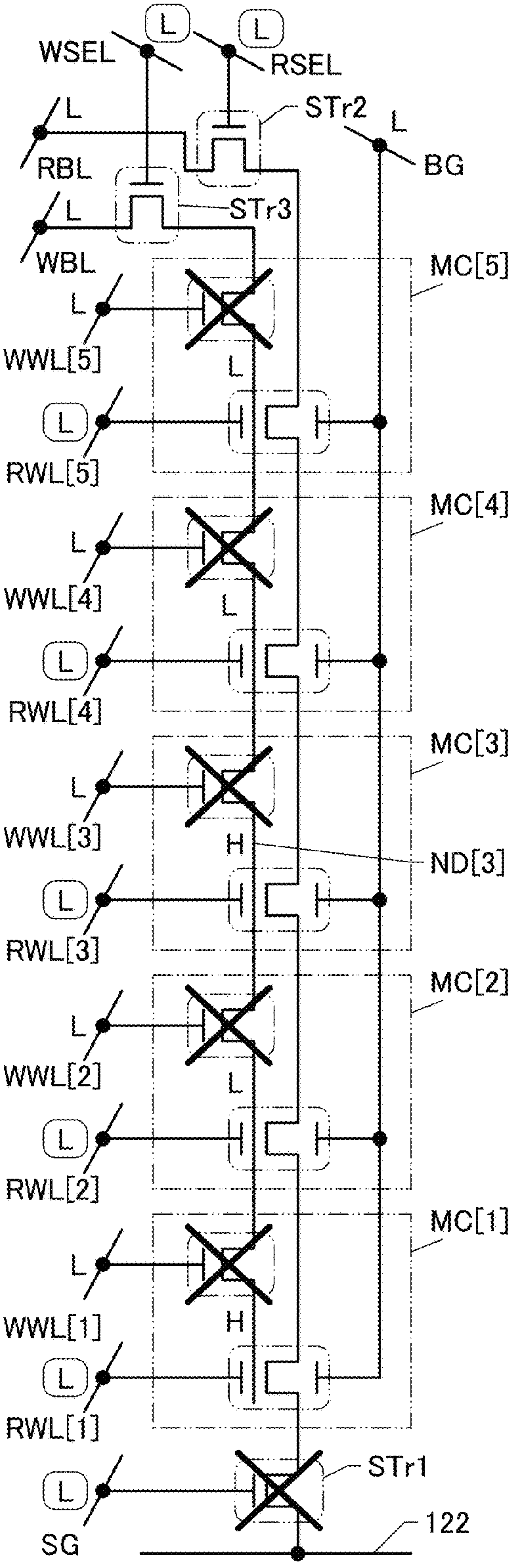

In Period T14, the L potential is supplied to the conductor RSEL (and the conductor WSEL), the conductors RWL, and the conductor SG (see FIG. 39B).

<When Retained Potential is L Potential>

First, a reading operation for the memory element MC[2] where the L potential is retained is described. In the case where the data (potential) retained in the memory element MC[2] is read, the potential of the conductor RWL[2] is set at the L potential in Period T12 (see FIG. 37B). In this case, since the L potential is retained in the node ND[2], the channel resistance of the transistor RTr[2] remains high.

Next, in Period T13, the H potential is supplied to the conductor SG to bring the conductor RBL and the conductor 122 into conduction. In this case, since the channel resistance of the transistor RTr[2] is high, the potential of the conductor RBL gently changes from the H potential to the L potential.

In this manner, by setting the potential of the conductor RWL corresponding to the memory element MC of a reading target at the L potential in Period T13, data retained in the memory element MC can be found.

<Variation>

Figure 41:
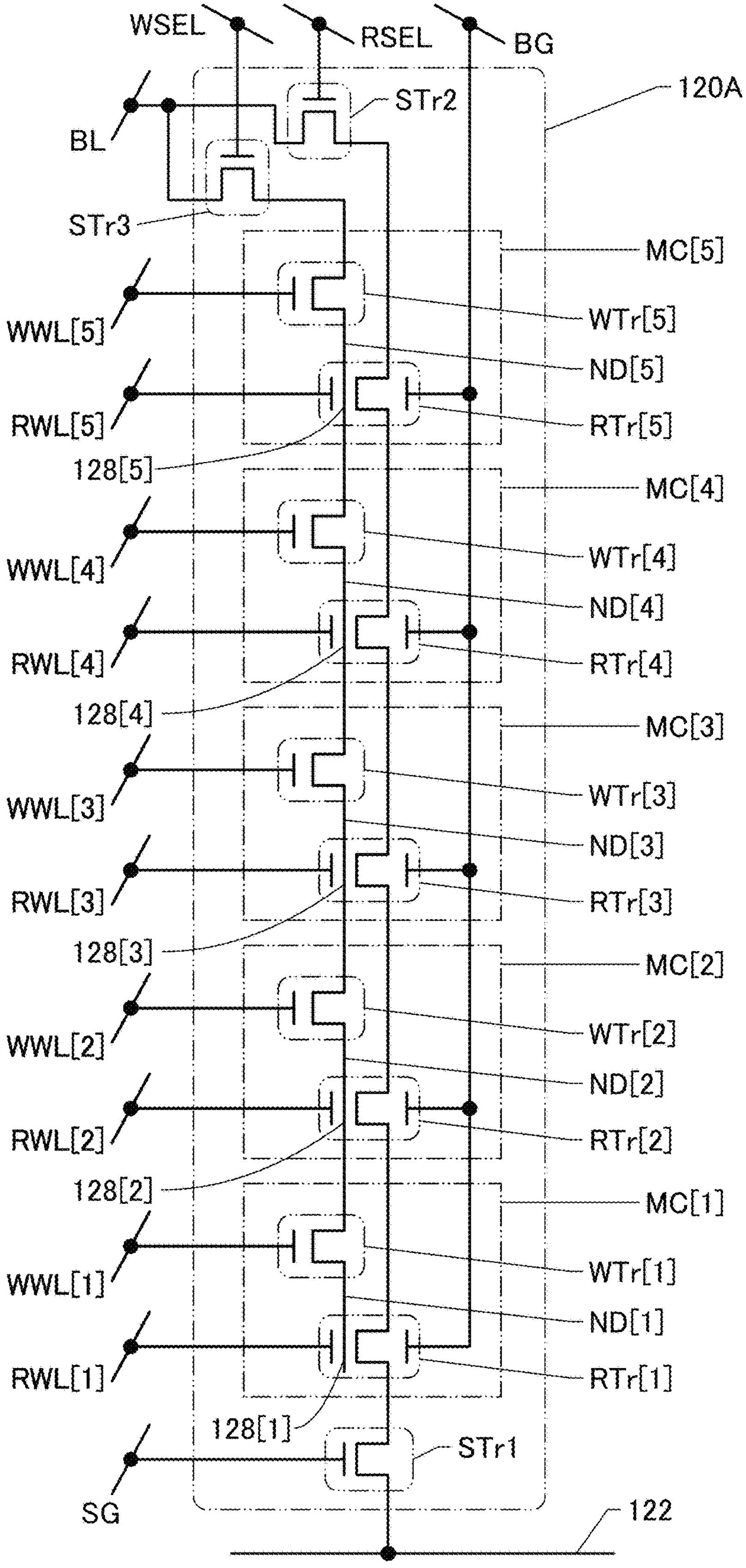
FIG. 41 illustrates a circuit structure example of a memory string.

FIG. 41 illustrates a circuit structure example of a memory string 120A, which is a variation of the memory string 120. The memory string 120A has a circuit structure of the memory string 120 to which a transistor STr3 is added.

In the memory string 120A illustrated in FIG. 41, the other of the source and the drain of the transistor WTr[5] is electrically connected to not the one of the source and the drain of the transistor STr2 but one of a source and a drain the transistor STr3. Furthermore, the other of the source and the drain of the transistor STr3 is electrically connected to the conductor BL. In addition, a gate of the transistor STr2 is electrically connected to the conductor RSEL, and a gate of the transistor STr3 is electrically connected to the conductor WSEL.

In the writing operation, the transistor STr3 is in an on state and the transistor STr2 is in an off state. In the reading operation, the transistor STr3 is in an off state and the transistor STr2 is in an on state. To perform writing or reading of data through the conductor BL, the data transmission paths can be switched with the dedicated transistors. Thus, the operation of the memory device is stabilized and the reliability of the memory device can be increased.

Figure 42:
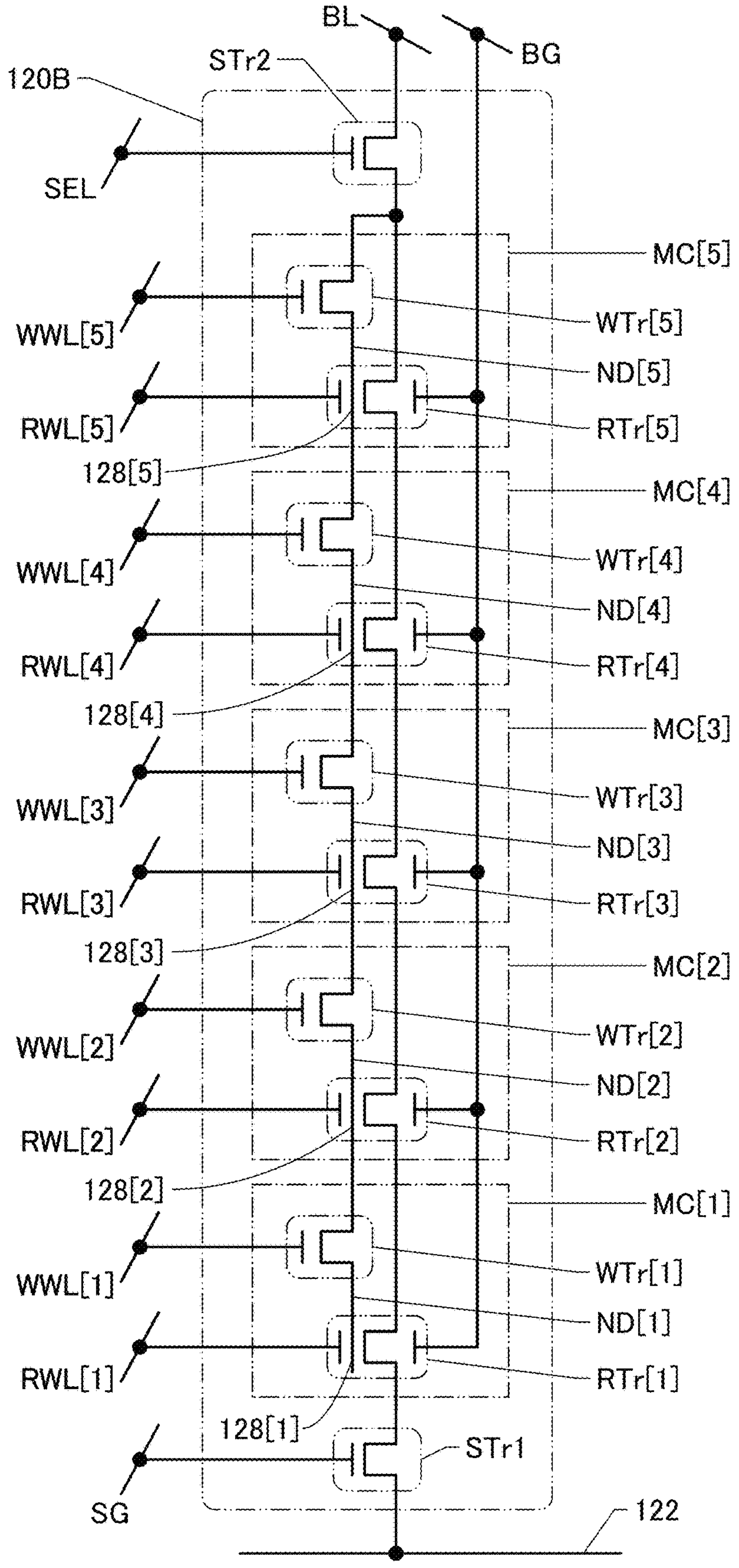
FIG. 42 illustrates a circuit structure example of a memory string.

As in a memory string 120B illustrated in FIG. 42, the transistor STr2 and the transistor STr3 may be used in common. In that case, the other of the source and the drain of the transistor STr2 is electrically connected to the conductor BL. In the writing operation and the reading operation, data is read and written through the conductor BL. By providing the common conductor BL for the writing operation and the reading operation, the number of wirings can be reduced.

Figure 43:
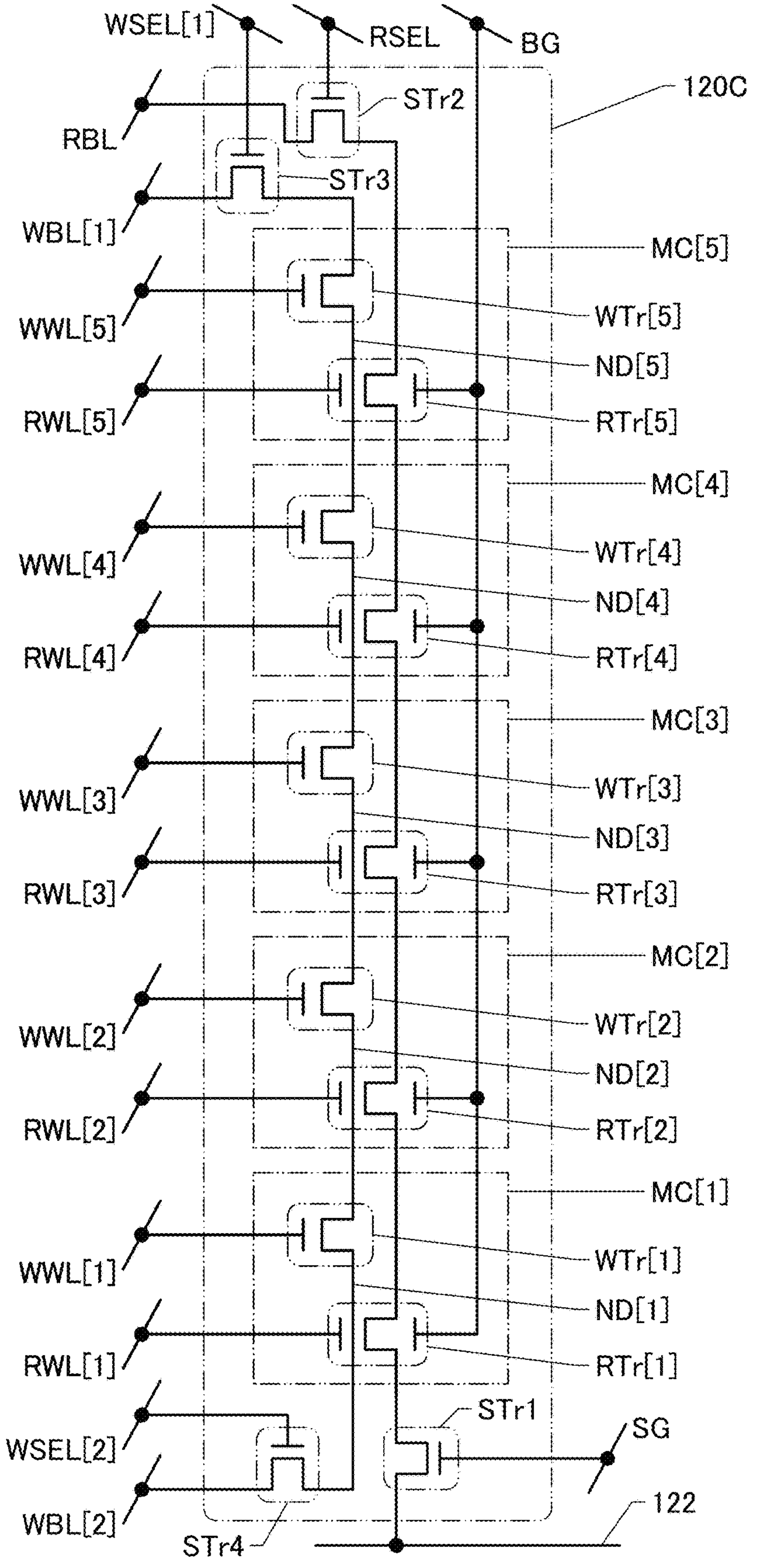
FIG. 43 illustrates a circuit structure example of a memory string.

A memory string 120C illustrated in FIG. 43 has a circuit structure of the memory string 120 to which a transistor STr4 is added. One of a source and a drain of the transistor STr4 is electrically connected to the one of the source and the drain of the transistor WTr[1], and the other is electrically connected to the conductor WBL[2]. A gate of the transistor STr4 is electrically connected to a conductor WSEL[2].

Furthermore, in the memory string 120B, the gate of the transistor STr3 is electrically connected to a conductor WSEL[1], and the other of the source and the drain of the transistor STr3 is electrically connected to a conductor WBL[1]. The circuit structure where the transistor STr2 and the transistor STr3 are electrically connected to the conductor BL as illustrated in FIG. 41 may also be employed.

In the memory string 120B, data can be written from both the conductor WBL[1] and the conductor WBL[2]. Thus, the data writing speed can be increased. Moreover, charge corresponding to data to be written can be supplied more reliably.

Furthermore, in the case where data is written to the i-th memory element MC, when i is close to n, data is written from the conductor WBL[1] side, so that the data writing operation for the first to (i−1)-th memory elements MC can be omitted. When i is close to 1, data is written from the conductor WBL[2] side, so that the data writing operation for the (i+1)-th to n-th memory elements MC can be omitted. The memory string 120B can further reduce the time and power consumption for the writing operation.

This embodiment can be implemented in an appropriate combination with the structures described in the other embodiments and the like.

Embodiment 3

In this embodiment, a structure example of a semiconductor device 200 including the memory device 100 will be described.

Figure 44:
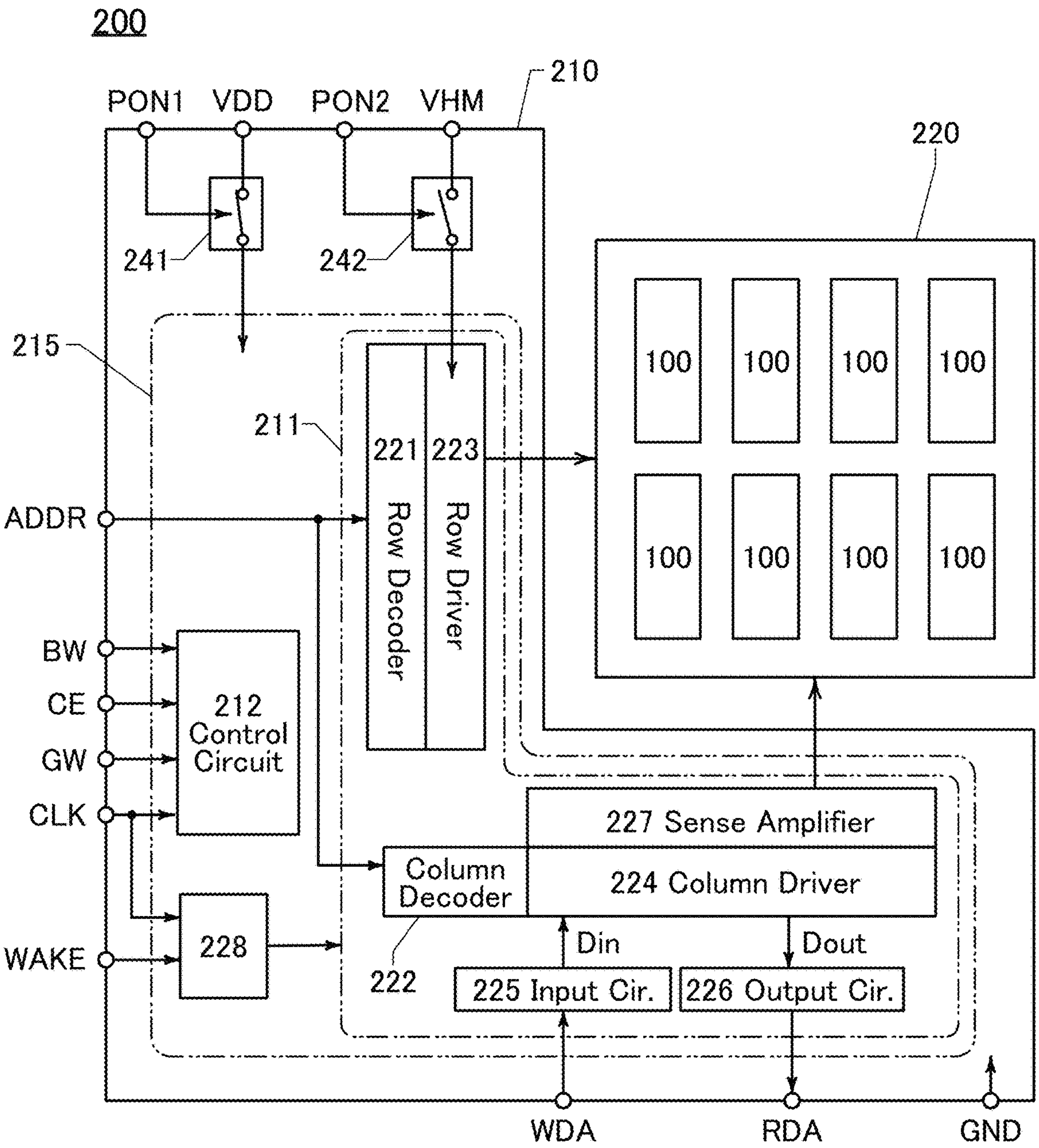
FIG. 44 is a block diagram illustrating a structure example of a semiconductor device.

FIG. 44 is a block diagram illustrating a structure example of the semiconductor device 200 of one embodiment of the present invention. The semiconductor device 200 illustrated in FIG. 44 includes a driver circuit 210 and a memory array 220. The memory array 220 includes one or more memory devices 100. FIG. 44 illustrates an example in which the memory array 220 includes a plurality of memory devices 100 arranged in a matrix.

The driver circuit 210 includes a PSW 241 (power switch), a PSW 242, and a peripheral circuit 215. The peripheral circuit 215 includes a peripheral circuit 211, a control circuit 212, and a voltage generation circuit 228. Note that the semiconductor device 200 includes elements, circuits, or the like having a variety of functions such as the memory array 220, the PSW 241, the PSW 242, the peripheral circuit 211, the control circuit 212, and the voltage generation circuit 228. Thus, the semiconductor device 200 may be referred to as a system or a subsystem.

In the semiconductor device 200, each circuit, each signal, and each voltage can be appropriately selected as needed. Alternatively, another circuit or another signal may be added. A signal BW, a signal CE, a signal GW, a signal CLK, a signal WAKE, a signal ADDR, a signal WDA, a signal PON1, and a signal PON2 are signals input from the outside, and a signal RDA is a signal output to the outside. The signal CLK is a clock signal.

The signal BW, the signal CE, and the signal GW are control signals. The signal CE is a chip enable signal, the signal GW is a global write enable signal, and the signal BW is a byte write enable signal. The signal ADDR is an address signal. The signal WDA is write data, and the signal RDA is read data. The signal PON1 and the signal PON2 are power gating control signals. Note that the signal PON1 and the signal PON2 may be generated in the control circuit 212.

The control circuit 212 is a logic circuit having a function of controlling the overall operation of the semiconductor device 200. For example, the control circuit performs a logical operation on the signal CE, the signal GW, and the signal BW to determine an operation mode of the semiconductor device 200 (e.g., a writing operation or a reading operation). Alternatively, the control circuit 212 generates a control signal for the peripheral circuit 211 so that the operation mode is executed.

The voltage generation circuit 228 has a function of generating a negative voltage. The signal WAKE has a function of controlling the input of the signal CLK to the voltage generation circuit 228. For example, when an H-level signal is supplied as the signal WAKE, the signal CLK is input to the voltage generation circuit 228, and the voltage generation circuit 228 generates a negative voltage.

The peripheral circuit 211 is a circuit for writing and reading data to/from the memory device 100. The peripheral circuit 211 includes a row decoder 221, a column decoder 222, a row driver 223, a column driver 224, an input circuit 225 (Input Cir.), an output circuit 226 (Output Cir.), and a sense amplifier 227.

The row decoder 221 and the column decoder 222 have a function of decoding the signal ADDR. The row decoder 221 is a circuit for specifying a row to be accessed, and the column decoder 222 is a circuit for specifying a column to be accessed. The row driver 223 has a function of selecting the conductor WL specified by the row decoder 221. The column driver 224 has a function of writing data to the memory device 100, a function of reading data from the memory device 100, a function of retaining the read data, and the like.

The input circuit 225 has a function of retaining the signal WDA. Data retained by the input circuit 225 is output to the column driver 224. Data output from the input circuit 225 is data (Din) to be written to the memory device 100. Data (Dout) read from the memory device 100 by the column driver 224 is output to the output circuit 226. The output circuit 226 has a function of retaining Dout. In addition, the output circuit 226 has a function of outputting Dout to the outside of the semiconductor device 200. Data output from the output circuit 226 is the signal RDA.

The PSW 241 has a function of controlling the supply of VDD to the peripheral circuit 215. The PSW 242 has a function of controlling the supply of VHM to the row driver 223. Here, in the semiconductor device 200, a high power supply voltage is VDD and a low power supply voltage is GND (a ground potential). In addition, VHM is a high power supply voltage used to set the word line to the H level and is higher than VDD. The on/off of the PSW 241 is controlled by the signal PON1, and the on/off of the PSW 242 is controlled by the signal PON2. The number of power domains to which VDD is supplied is one in the peripheral circuit 215 in FIG. 44 but can be more than one. In that case, a power switch is provided for each power domain.

Figure 45A:
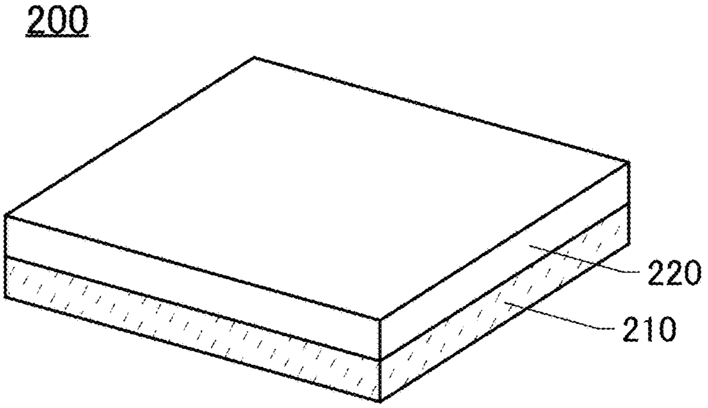
FIG. 45A to FIG. 45C are perspective views each illustrating a structure example of a semiconductor device.
Figure 45B:
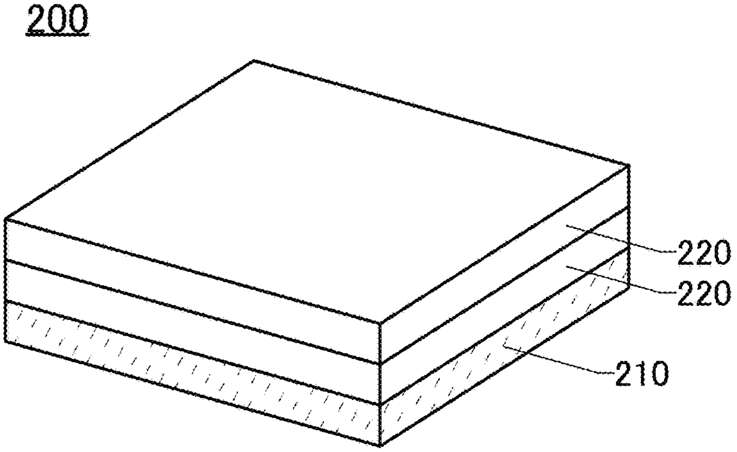

The driver circuit 210 and the memory array 220 may be provided on the same plane. As illustrated in FIG. 45A, the driver circuit 210 and the memory array 220 may be provided so as to overlap with each other. When the driver circuit 210 and the memory array 220 overlap with each other, the signal transmission distance can be shortened. Alternatively, a plurality of memory arrays 220 may be provided over the driver circuit 210 as illustrated in FIG. 45B.

Figure 45C:
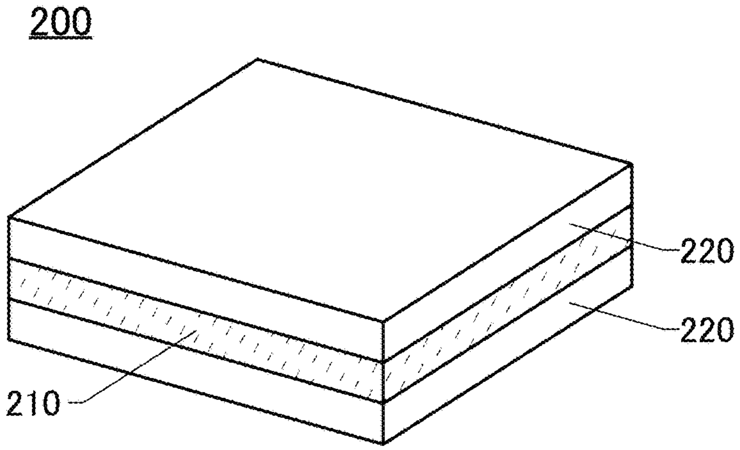

As illustrated in FIG. 45C, the memory arrays 220 may be provided over and under the driver circuit 210. FIG. 45C illustrates an example in which one memory array 220 is provided in each of the layers over and under the driver circuit 210. Providing a plurality of memory arrays 220 such that the driver circuit 210 is sandwiched therebetween can further shorten the signal propagation distance. The number of memory arrays 220 stacked over the driver circuit 210 and the number of memory arrays 220 stacked under the driver circuit 210 may each be one or more. The number of memory arrays 220 stacked over the driver circuit 210 is preferably equal to the number of memory arrays 220 stacked under the driver circuit 210.

<Cross-Sectional Structure Example of Semiconductor Device 200>

Figure 46:
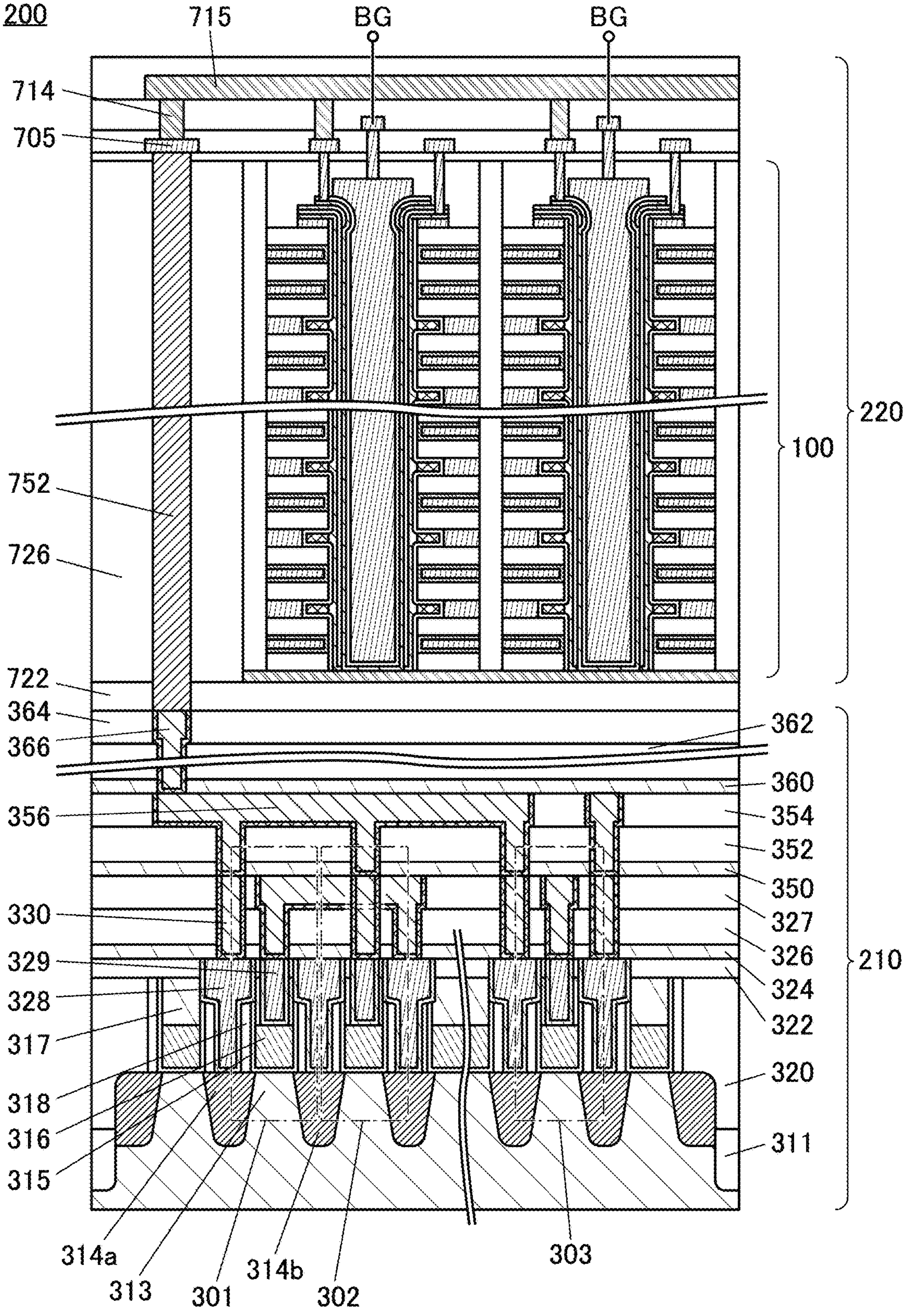
FIG. 46 is a cross-sectional view illustrating a semiconductor device of one embodiment of the present invention.

FIG. 46 illustrates a cross-sectional structure example of the semiconductor device 200 illustrated in FIG. 45A. FIG. 46 illustrates part of the semiconductor device 200 illustrated in FIG. 45A.

FIG. 46 illustrates a transistor 301, a transistor 302, and a transistor 303 included in the driver circuit 210. Note that the transistor 301 and the transistor 302 function as part of the sense amplifier 227. Furthermore, the transistor 303 functions as a column selection switch. Specifically, the conductor BL included in the memory array 220 is electrically connected to one of a source and a drain of the transistor 301, a gate of the transistor 301 is electrically connected to one of a source and a drain of the transistor 302, and a gate of the transistor 302 is electrically connected to the other of the source and the drain of the transistor 301. The one of the source and the drain of the transistor 301 and the other of the source and the drain of the transistor 302 are electrically connected to one of a source and a drain of the transistor 303 functioning as the column selection switch. Accordingly, the layout area of the semiconductor device 200 can be reduced. Note that an example where seven memory elements MC are provided per memory string is illustrated in FIG. 46. However, the number of memory elements MC provided in a memory string is not limited thereto. For example, the number of memory elements MC provided in a memory string may be 32, 64, 128, or 200 or more.

The conductor BL of the memory array 220 is electrically connected to the sense amplifier 227 and the transistor 303 functioning as the column selection switch through a conductor 715, a conductor 714, a conductor 705, and a conductor 752 formed so as to be embedded in an insulator 726, an insulator 722, and the like. Note that circuits and transistors included in the driver circuit 210 are examples, and one embodiment of the present invention is not limited to the circuit structures and the transistor structures. In addition to the above, a transistor or a circuit such as a control circuit, a row decoder, a row driver, a source line driver, or an input-output circuit can be provided as appropriate in accordance with the structure or driving method of the semiconductor device 200.

The transistor 301, the transistor 302, and the transistor 303 are provided on a substrate 311 and each include a conductor 316, an insulator 315, a semiconductor region 313 that is part of the substrate 311, and a low-resistance region 314*a* and a low-resistance region 314*b* serving as a source region and a drain region. Note that as illustrated in FIG. 46, one low-resistance region may be used in common for a source region or a drain region of one of the transistor 301 and the transistor 302 and a source region or a drain region of the other of the transistor 301 and the transistor 302.

In each of the transistor 301, the transistor 302, and the transistor 303, the semiconductor region 313 (part of the substrate 311) in which a channel is formed has a convex shape. In addition, the conductor 316 is provided so as to cover a side surface and the top surface of the semiconductor region 313 with the insulator 315 therebetween. Note that a material adjusting the work function may be used for the conductor 316. The transistor 301, the transistor 302, and the transistor 303 that are described above are also referred to as FIN-type transistors because they utilize convex portions of a semiconductor substrate. Note that an insulator functioning as a mask for forming the convex portion may be included in contact with an upper portion of the convex portion. Although the case where the convex portion is formed by processing part of the semiconductor substrate is described here, a semiconductor film having a convex shape may be formed by processing an SOI substrate.

Although each of the transistor 301, the transistor 302, and the transistor 303 may be either a p-channel transistor or an n-channel transistor, the transistor 301 and the transistor 302 are preferably transistors having different polarities.

A region of the semiconductor region 313 where a channel is formed, a region in the vicinity thereof, the low-resistance region 314*a* and the low-resistance region 314*b* each functioning as a source region or a drain region, and the like preferably contain a semiconductor such as a silicon-based semiconductor, and preferably contain single crystal silicon. Alternatively, the regions may be formed using a material containing Ge (germanium), SiGe (silicon germanium), GaAs (gallium arsenide), GaAlAs (gallium aluminum arsenide), or the like. A structure may be employed in which silicon whose effective mass is controlled by applying stress to the crystal lattice and changing the lattice spacing is used. Alternatively, the transistor 301, the transistor 302, and the transistor 303 may be an HEMT (High Electron Mobility Transistor) with the use of GaAs and GaAlAs, or the like.

The low-resistance region 314*a* and the low-resistance region 314*b* contain an element which imparts n-type conductivity, such as arsenic or phosphorus, or an element which imparts p-type conductivity, such as boron, in addition to the semiconductor material used for the semiconductor region 313.

The insulator 315 functions as a gate insulating film of each of the transistor 301, the transistor 302, and the transistor 303.

For the conductor 316 functioning as a gate electrode, a semiconductor material such as silicon containing the element which imparts n-type conductivity, such as arsenic or phosphorus, or the element which imparts p-type conductivity, such as boron, or a conductive material such as a metal material, an alloy material, or a metal oxide material can be used.

Note that the work function depends on a material of the conductor; thus, the threshold voltage can be adjusted by changing the material of the conductor. Specifically, it is preferable to use a material such as titanium nitride or tantalum nitride for the conductor. Moreover, in order to ensure both conductivity and embeddability, it is preferable to use stacked layers of metal materials such as tungsten and aluminum for the conductor, and it is particularly preferable to use tungsten in terms of heat resistance.

An insulator 317 serving as an etching stopper is preferably provided above the conductor 316. In addition, an insulator 318 functioning as a spacer is preferably provided on a side surface of the insulator 315. When the insulator 317 and the insulator 318 are provided, regions where the low-resistance region 314*a* and the low-resistance region 314*b* and a conductor 328 are electrically connected to each other can be defined in a self-aligned manner. Thus, even when misalignment occurs in forming the openings for exposing part of the low-resistance region 314*a* and the low-resistance region 314*b*, the openings for exposing the intended regions can be formed. The conductor 328 provided in the openings formed in this manner can provide a favorable contact with reduced contact resistance between the low-resistance region 314*a* and the low-resistance region 314*b* and the conductor 328. The contact between the low-resistance region 314*a* and the low-resistance region 314*b* and the conductor 328 which is formed in this manner may be referred to as a self-aligned contact. Furthermore, a conductor 329 electrically connected to the conductor 316 may be provided so as to be embedded in the insulator 317 and an insulator 322.

An insulator 320, the insulator 322, an insulator 324, an insulator 326, and an insulator 327 are stacked in this order so as to cover the transistor 301, the transistor 302, and the transistor 303.

The insulator 320, the insulator 322, the insulator 324, the insulator 326, and the insulator 327 can be formed using, for example, silicon oxide, silicon oxynitride, silicon nitride oxide, silicon nitride, aluminum oxide, aluminum oxynitride, aluminum nitride oxide, or aluminum nitride.

The insulator 322 may function as a planarization film for eliminating a level difference caused by the transistor 301 or the like provided below the insulator 322. For example, the top surface of the insulator 322 may be planarized by planarization treatment using a chemical mechanical polishing (CMP) method or the like to increase the planarity.

For the insulator 324, a film having a barrier property that prevents diffusion of hydrogen or impurities from the substrate 311, the transistor 301, or the like into the region where the memory array 220 is provided is preferably used.

For the film having a barrier property against hydrogen, silicon nitride formed by a PEALD method or a CVD method can be used, for example. Here, diffusion of hydrogen into a semiconductor element including an oxide semiconductor, such as the memory elements MC, degrades the characteristics of the semiconductor element in some cases. Therefore, a film that inhibits hydrogen diffusion is preferably used between the memory elements MC and the transistor 301 and the like. The film that inhibits hydrogen diffusion is specifically a film from which a small amount of hydrogen is released.

The amount of released hydrogen can be analyzed by thermal desorption spectroscopy (TDS) or the like, for example. The amount of hydrogen released from the insulator 324 that is converted into hydrogen atoms per area of the insulator 324 is less than or equal to $10\times10^{15}$ atoms/$cm^2$, preferably less than or equal to $5\times10^{15}$ atoms/$cm^2$, in the TDS analysis in a film-surface temperature range of 50° C. to 500° C., for example.

Note that the permittivity of each of the insulator 326 and the insulator 327 is preferably lower than that of the insulator 324. For example, the relative permittivity of each of the insulator 326 and the insulator 327 is preferably lower than 4, further preferably lower than 3. The relative permittivity of each of the insulator 326 and the insulator 327 is, for example, preferably less than or equal to 0.7 times, further preferably less than or equal to 0.6 times the relative permittivity of the insulator 324. When a material with a low permittivity is used for an interlayer film, the parasitic capacitance generated between wirings can be reduced.

The conductor 328, the conductor 329, a conductor 330, and the like that are electrically connected to the memory array 220 are embedded in the insulator 320, the insulator 322, the insulator 324, the insulator 326, and the insulator 327. Note that the conductor 328, the conductor 329, and the conductor 330 function as plugs or wirings. A plurality of conductors functioning as plugs or wirings are collectively denoted by the same reference numeral in some cases. Furthermore, in this specification and the like, a wiring and a plug electrically connected to the wiring may be a single component. That is, part of a conductor functions as a wiring in some cases and part of a conductor functions as a plug in other cases.

As a material for each of the plugs and wirings (the conductor 328, the conductor 329, the conductor 330, and the like), a single layer or a stacked layer of a conductive material such as a metal material, an alloy material, a metal nitride material, or a metal oxide material can be used. It is preferable to use a high-melting-point material that has both heat resistance and conductivity, such as tungsten or molybdenum, and it is preferable to use tungsten. Alternatively, it is preferable to form the plugs and wirings with a low-resistance conductive material such as aluminum or copper. The use of a low-resistance conductive material can reduce wiring resistance.

A wiring layer may be provided over the insulator 327 and the conductor 330. For example, in FIG. 46, an insulator 350, an insulator 352, and an insulator 354 are stacked in this order. Furthermore, a conductor 356 is formed in the insulator 350, the insulator 352, and the insulator 354. The conductor 356 functions as a plug or a wiring. Note that the conductor 356 can be provided using a material similar to those for the conductor 328, the conductor 329, and the conductor 330.

Note that for example, as the insulator 350, like the insulator 324, an insulator having a barrier property against hydrogen is preferably used. Furthermore, the conductor 356 preferably contains a conductor having a barrier property against hydrogen. In particular, the conductor having a barrier property against hydrogen is formed in an opening of the insulator 350 having a barrier property against hydrogen. With this structure, the transistor 301 and the like and the memory elements MC can be separated by the barrier layer, so that the diffusion of hydrogen from the transistor 301 and the like into the memory elements MC can be inhibited.

Note that for the conductor having a barrier property against hydrogen, tantalum nitride is preferably used, for example. In addition, the use of a stack including tantalum nitride and tungsten, which has high conductivity, can inhibit the diffusion of hydrogen from the transistor 301 and the like while the conductivity of a wiring is maintained. In that case, a structure is preferable in which a tantalum nitride layer having a barrier property against hydrogen is in contact with the insulator 350 having a barrier property against hydrogen.

A wiring layer may be provided over the insulator 354 and the conductor 356. For example, in FIG. 46, an insulator 360, an insulator 362, and an insulator 364 are stacked in this order. Furthermore, a conductor 366 is formed in the insulator 360, the insulator 362, and the insulator 364. The conductor 366 functions as a plug or a wiring. Note that the conductor 366 can be provided using a material similar to those for the conductor 328, the conductor 329, and the conductor 330.

Note that for example, as the insulator 360, like the insulator 324, an insulator having a barrier property against hydrogen is preferably used. Furthermore, the conductor 366 preferably contains a conductor having a barrier property against hydrogen. In particular, the conductor having a barrier property against hydrogen is formed in an opening of the insulator 360 having a barrier property against hydrogen. With this structure, the transistor 301 and the like and the memory elements MC can be separated by the barrier layer, so that the diffusion of hydrogen from the transistor 301 and the like into the memory elements MC can be inhibited.

The insulator 722 is provided over the insulator 364 and the conductor 366, and the memory array 220 is provided above the insulator 722. A barrier film formed using a material similar to that for the insulator 324 may be provided between the insulator 364 and the insulator 722.

This embodiment can be implemented in an appropriate combination with the structures described in the other embodiments and the like.

Embodiment 4

In this embodiment, an example of application of the semiconductor device of one embodiment of the present invention to a data processing device will be described.

A computer generally includes, as its components, a processor, a main memory, storage, and the like on a motherboard, which are electrically connected to one another through a bus line, for example. Thus, the parasitic capacitance increases as the bus line lengthens, resulting in increased power consumption required for signal transmission.

Figure 47A:
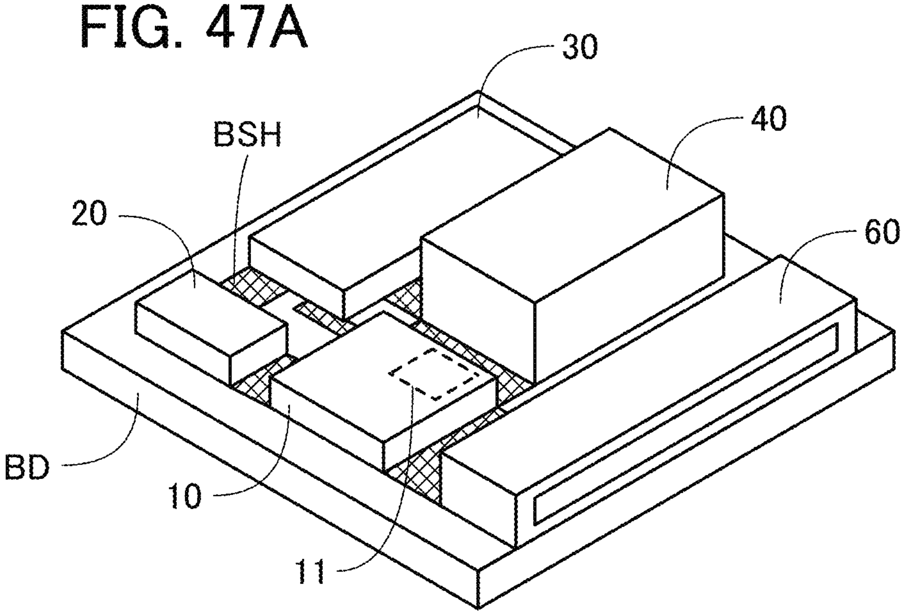
FIG. 47A is a perspective view illustrating a structure example of a computer.

Specifically, the computer has a structure illustrated in FIG. 47A, for example. The computer includes a motherboard BD, and an arithmetic processing device (e.g., a processor and a CPU) 10, a main memory (e.g., a DRAM (Dynamic Random Access Memory)) 30, storage (e.g., a three-dimensional NAND memory device or a 3D OS NAND memory device) 40, an interface 60, and the like are provided on the motherboard BD. Although an SRAM (Static Random Access Memory) 20 that also functions as a main memory is illustrated in FIG. 47A, it is not necessarily provided on the motherboard BD.

Note that FIG. 47 illustrates a structure in which the arithmetic processing device 10 includes a register 11.

In FIG. 47A, the arithmetic processing device 10 is electrically connected to the SRAM 20, the main memory 30, the storage 40, and the interface 60. The main memory 30 is electrically connected to the SRAM 20 and the storage 40.

Note that the components of the computer in FIG. 47A are electrically connected to one another through a bus line BSH. This means that as the number of components of the computer increases or the motherboard BD increases in size, the bus line BSH to be routed lengthens; thus, the power consumption required for signal transmission increases.

The components of the computer in FIG. 47A may be integrated into one chip to form a monolithic IC (Integrated Circuit). In this case, the data processing device described in the above embodiment can be used as the main memory 30 and the storage 40. The case where the computer in FIG. 47A is made as a monolithic IC in this manner is illustrated in FIG. 47B.

Figure 47B:
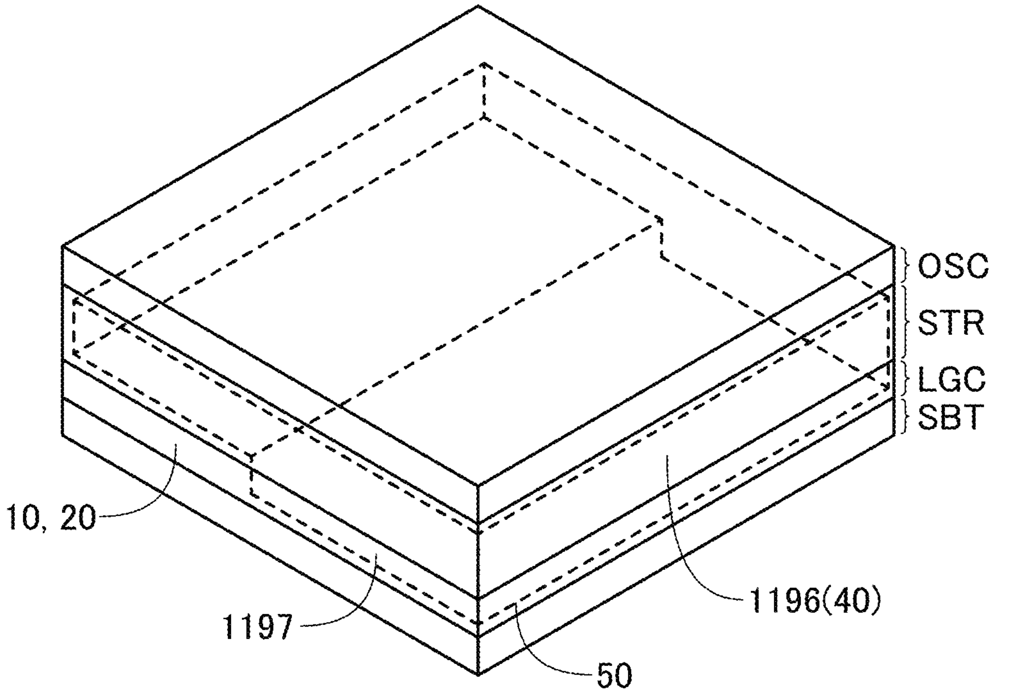
FIG. 47B is a perspective view illustrating a monolithic IC.

The monolithic IC in FIG. 47B includes a circuit layer LGC over a semiconductor substrate containing Si. The monolithic IC also includes a memory layer STR over the circuit layer LGC and a circuit layer OSC over the memory layer STR.

The circuit layer LGC includes a plurality of circuits including Si transistors formed on a semiconductor substrate SBT containing Si, for example. As part of the plurality of circuits, the arithmetic processing device 10, the SRAM 20, and the like in FIG. 47A can be used, for example. In the case where the data processing device is used as the main memory 30 and the storage 40, part of the plurality of circuits can be a controller 1197 included in a data processing device 50 that will be described later.

In particular, by using a Si transistor for the SRAM 20, for example, the drive frequency of the SRAM can be increased.

The memory layer STR functions as a memory unit including a Si transistor and/or an OS transistor. The memory layer STR can be, for example, a three-dimensional NAND memory circuit, a 3D OS NAND memory circuit, or the like. Thus, the memory layer STR includes a memory unit 1196 in the data processing device, the storage 40 in FIG. 47A, and the like.

The use of the 3D OS NAND memory circuit can reduce the power consumption of the monolithic IC in FIG. 47B.

The circuit layer OSC includes a plurality of circuits including OS transistors, for example. As part of the plurality of circuits, for example, a circuit that is different from the circuits included in the circuit layer LGC, such as the arithmetic processing device 10 and the SRAM 20, can be used.

In the monolithic IC in FIG. 47B, the bus line BSH to be routed on the motherboard is not provided, resulting in short lines electrically connecting the components. Accordingly, the power consumption required for signal transmission can be reduced.

The monolithic IC in FIG. 47B also includes the data processing device 50. Thus, the data processing device 50 functions as both the storage 40 and the main memory 30 in FIG. 47A. Therefore, in the monolithic IC in FIG. 47B, the memory unit 1196 of the memory layer STR can function as the main memory 30.

The bus line BSH is not provided and the memory unit 1196 is used as an alternative to the main memory 30, whereby the circuit area in the monolithic IC in FIG. 47B can be smaller than that in the computer in FIG. 47A.

Figure 48A:
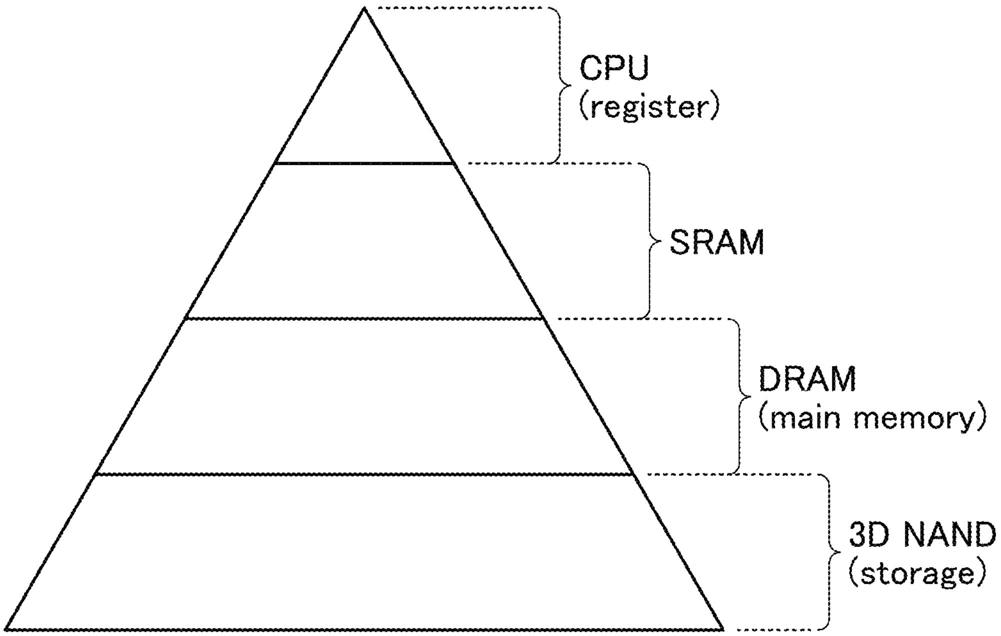
FIG. 48A and FIG. 48B illustrate memory hierarchies of a computer and a monolithic IC, respectively.
Figure 48B:
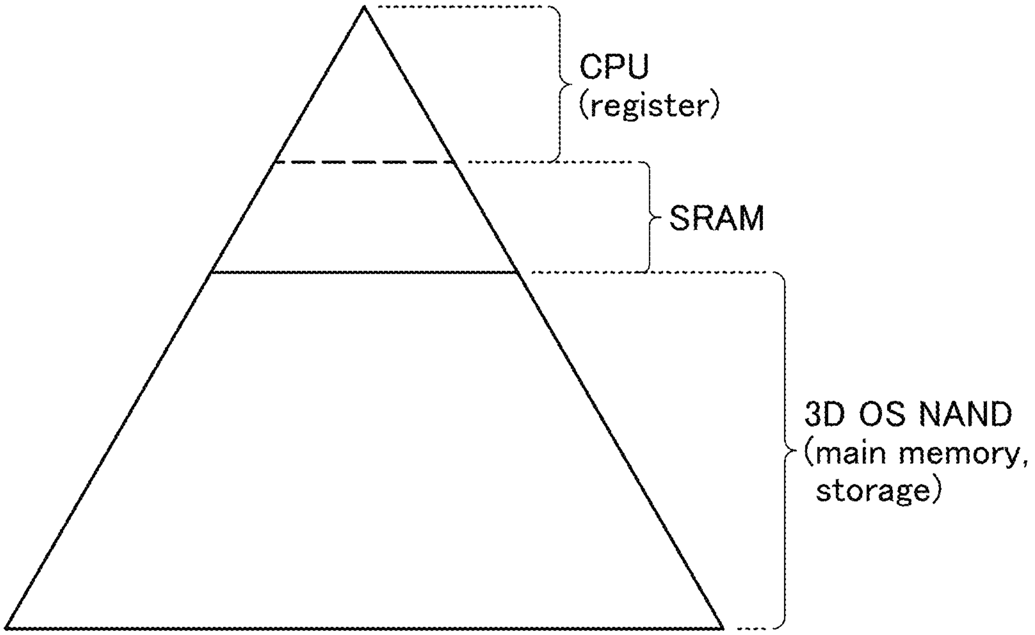

FIG. 48A and FIG. 48B show memory hierarchy examples of the computer in FIG. 47A and the monolithic IC in FIG. 47B, respectively.

In a general memory hierarchy, memory devices at the upper levels require higher operation speed, and memory devices at the lower levels require larger storage capacity and higher record density. For example, FIG. 48A shows, in order from the top, a register included in the CPU (the arithmetic processing device 10), the SRAM, the DRAM included in the main memory 30, the three-dimensional NAND memory circuit included in the storage 40.

The register included in the arithmetic processing device 10 and the SRAM are used for temporary storage of arithmetic operation results, for example, and thus are frequently accessed by the arithmetic processing device 10. Accordingly, high operation speed is required rather than memory capacity. The register also has a function of retaining settings of the arithmetic processing device, for example.

The DRAM included in the main memory 30 has a function of retaining a program or data read from the storage

40, for example. The record density of the DRAM is approximately 0.1 Gbit/mm$^2$ to 0.3 Gbit/mm$^2$.

The storage 40 has a function of retaining data that needs to be stored for a long time and a variety of programs used in the arithmetic processing device, for example. Therefore, the storage 40 needs to have large storage capacity and high record density rather than operation speed. The record density of a memory device used for the storage 40 is approximately 0.6 Gbit/mm$^2$ to 6.0 Gbit/mm$^2$. Thus, a three-dimensional NAND memory circuit, a hard disk drive (HDD), or the like is used as the storage 40.

Since the monolithic IC in FIG. 47B functions as the storage 40 and the main memory 30 in FIG. 47A, the memory hierarchy of the monolithic IC in FIG. 47B is as shown in FIG. 48B.

In other words, in the monolithic IC in FIG. 47B, a memory cell included in the memory unit of the data processing device 50 can be used not only as a cache memory of the memory unit but also as the main memory 30 in the computer in FIG. 47A. Accordingly, the main memory 30 such as a DRAM does not need to be provided in the monolithic IC in FIG. 47B, resulting in a smaller circuit area in the monolithic IC in FIG. 47B and lower power consumption required for the operation of the main memory 30 such as a DRAM.

Note that the structure of the monolithic IC illustrated in FIG. 47B is an example and is not limited to one embodiment of the present invention. The structure of the monolithic IC illustrated in FIG. 47B may be changed depending on the situation. For example, in the case where a high-speed memory of 1 GHz or higher is required as the SRAM in the monolithic IC in FIG. 47B, the SRAM may be included in the arithmetic processing device.

Note that this embodiment can be combined as appropriate with any of the other embodiments in this specification.

Embodiment 5

In this embodiment, an example of a chip 1200 that is a kind of semiconductor device on which the memory device of the present invention is mounted will be described with reference to FIG. 49A and FIG. 49B. A plurality of circuits (systems) are mounted on the chip 1200. The technology for integrating a plurality of circuits (systems) into one chip is referred to as system on chip (SoC) in some cases.

Figure 49A:
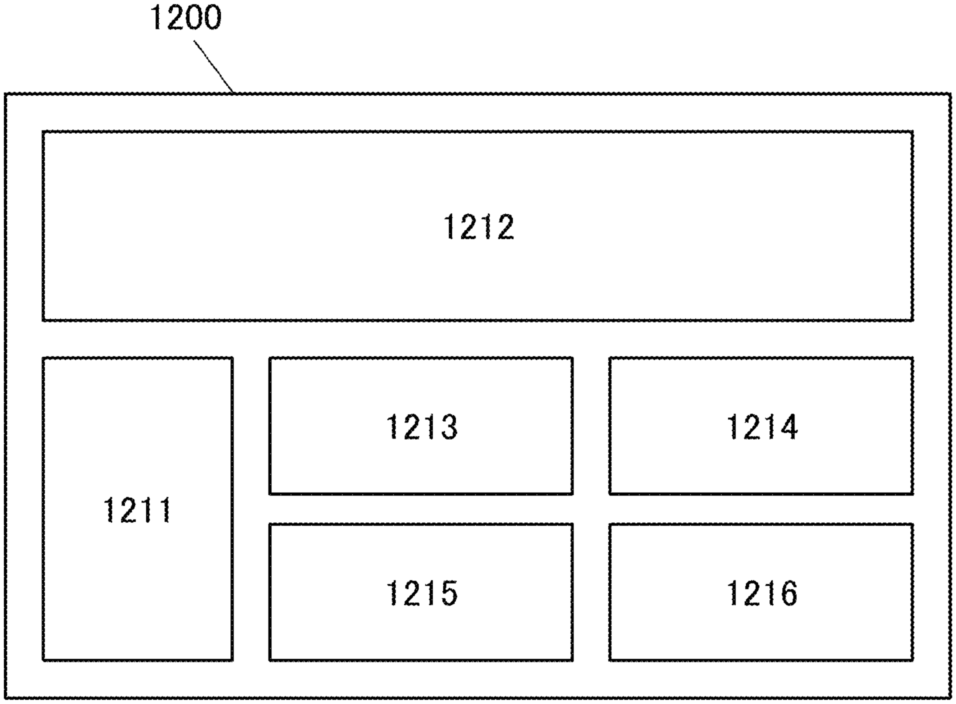
FIG. 49A is a schematic view of a semiconductor device.

As illustrated in FIG. 49A, the chip 1200 includes a CPU 1211, a GPU 1212, one or a plurality of analog arithmetic units 1213, one or a plurality of memory controllers 1214, one or a plurality of interfaces 1215, one or a plurality of network circuits 1216, and the like.

Figure 49B:
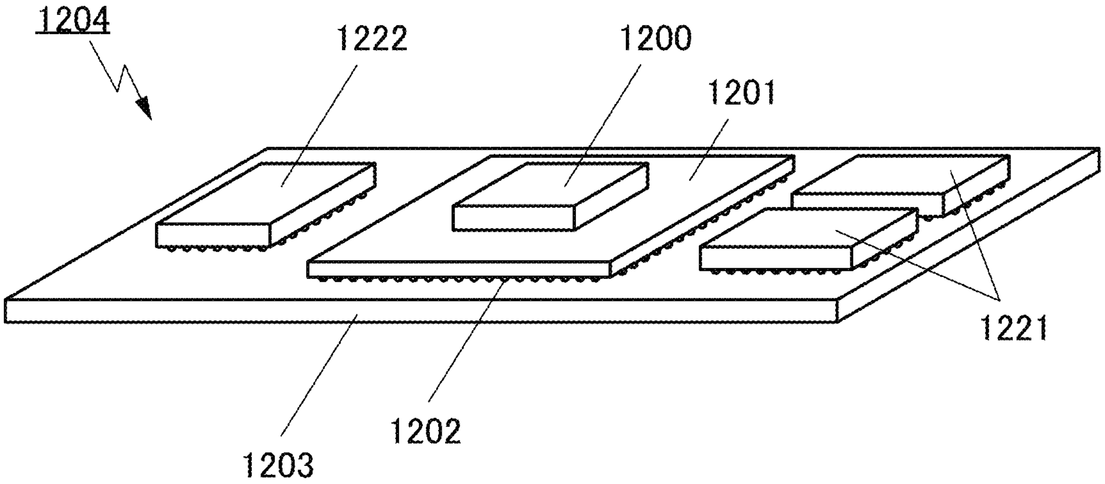
FIG. 49B is a perspective view of a semiconductor device.

A bump (not illustrated) is provided on the chip 1200, and as illustrated in FIG. 49B, the chip 1200 is connected to a first surface of a printed circuit board (PCB) 1201. A plurality of bumps 1202 are provided on the rear side of the first surface of the PCB 1201, whereby the PCB 1201 is connected to a motherboard 1203.

Memory devices such as DRAMs 1221 and a flash memory 1222 may be provided over the motherboard 1203. As the flash memory 1222, any of the semiconductor devices described in the above embodiments is preferably used. When any of the semiconductor devices described in the above embodiments is used as the flash memory 1222, the flash memory 1222 can have large storage capacity.

The CPU 1211 preferably includes a plurality of CPU cores. The GPU 1212 preferably includes a plurality of GPU cores. The CPU 1211 and the GPU 1212 may each include a memory for temporarily storing data. Alternatively, a common memory for the CPU 1211 and the GPU 1212 may be provided on the chip 1200. Moreover, the GPU 1212 is suitable for parallel computation of a number of data and thus can be used for image processing or a product-sum operation. When an image processing circuit or a product-sum operation circuit is provided in the GPU 1212, image processing and a product-sum operation can be performed with low power consumption.

Since the CPU 1211 and the GPU 1212 are provided on the same chip, a wiring between the CPU 1211 and the GPU 1212 can be shortened; accordingly, the data transfer from the CPU 1211 to the GPU 1212, the data transfer between the memories included in the CPU 1211 and the GPU 1212, and the transfer of arithmetic operation results from the GPU 1212 to the CPU 1211 after the arithmetic operation in the GPU 1212 can be performed at high speed.

The analog arithmetic unit 1213 includes one or both of an A/D (analog/digital) converter circuit and a D/A (digital/analog) converter circuit. Furthermore, the product-sum operation circuit may be provided in the analog arithmetic unit 1213.

The memory controller 1214 includes a circuit functioning as a controller of the DRAM 1221 and a circuit functioning as an interface of the flash memory 1222.

The interface 1215 includes an interface circuit for an external connection device such as a display device, a speaker, a microphone, a camera, or a controller. Examples of the controller include a mouse, a keyboard, and a game controller. As such an interface, a USB (Universal Serial Bus), an HDMI (registered trademark) (High-Definition Multimedia Interface), or the like can be used.

The network circuit 1216 includes a network circuit for the connection to a LAN (Local Area Network) or the like. The network circuit 1216 may further include a circuit for network security.

The circuits (systems) can be formed on the chip 1200 through the same manufacturing process. Therefore, even when the number of circuits needed for the chip 1200 increases, there is no need to increase the number of steps in the manufacturing process; thus, the chip 1200 can be manufactured at low cost.

The motherboard 1203 provided with the PCB 1201 on which the chip 1200 including the GPU 1212 is mounted, the DRAMs 1221, and the flash memory 1222 can be referred to as a GPU module 1204.

The GPU module 1204 includes the chip 1200 using the SoC technology, and thus can have a small size. In addition, the GPU module 1204 is excellent in image processing, and thus is suitably used in a portable electronic device such as a smartphone, a tablet terminal, a laptop PC, or a portable (mobile) game machine. Furthermore, the product-sum operation circuit using the GPU 1212 can perform a method such as a deep neural network (DNN), a convolutional neural network (CNN), a recurrent neural network (RNN), an autoencoder, a deep Boltzmann machine (DBM), or a deep belief network (DBN); hence, the chip 1200 can be used as an AI chip or the GPU module 1204 can be used as an AI system module.

The structure described in this embodiment can be used in an appropriate combination with the structures described in the other embodiments and the like.

Embodiment 6

In this embodiment, application examples of the semiconductor device using the memory device described in the above embodiment will be described. The memory device described in the above embodiment can be used for a variety of removable memory devices such as memory cards (e.g., SD cards), USB memories, and SSDs (solid state drives). FIG. 50A to FIG. 50E schematically illustrate some structure examples of removable memory devices. The semiconductor device described in the above embodiment is processed into a packaged memory chip and used in a variety of storage devices and removable memories, for example.

Figure 50A:
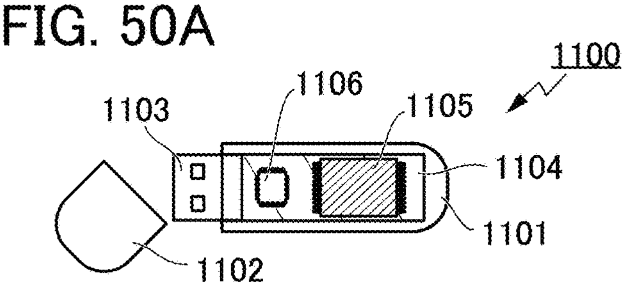
FIG. 50A to FIG. 50E illustrate examples of memory devices.

FIG. 50A is a schematic diagram of a USB memory. A USB memory 1100 includes a housing 1101, a cap 1102, a USB connector 1103, and a substrate 1104. The substrate 1104 is held in the housing 1101. The substrate 1104 is provided with a memory chip 1105 and a controller chip 1106, for example. The memory device or the semiconductor device described in the above embodiment can be incorporated in the memory chip 1105 or the like.

Figure 50B:
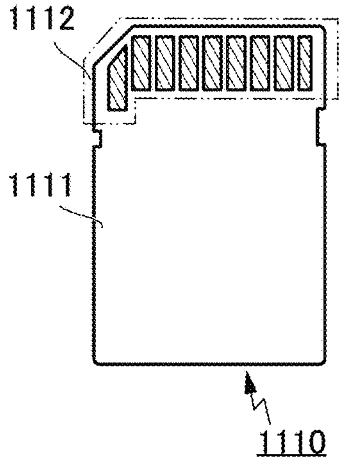
Figure 50C:
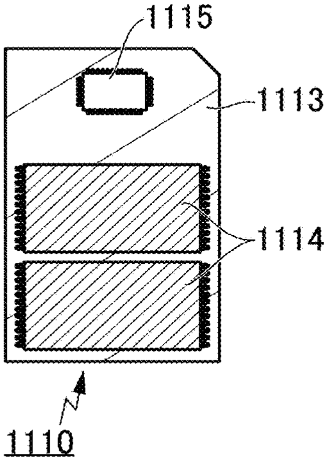

FIG. 50B is a schematic external diagram of an SD card, and FIG. 50C is a schematic diagram of the internal structure of the SD card. An SD card 1110 includes a housing 1111, a connector 1112, and a substrate 1113. The substrate 1113 is held in the housing 1111. The substrate 1113 is provided with a memory chip 1114 and a controller chip 1115, for example. When the memory chip 1114 is also provided on the back side of the substrate 1113, the capacity of the SD card 1110 can be increased. In addition, a wireless chip with a radio communication function may be provided on the substrate 1113. In that case, data can be read from and written to the memory chip 1114 through radio communication between a host device and the SD card 1110. The memory device or the semiconductor device described in the above embodiment can be incorporated in the memory chip 1114 or the like.

Figure 50D:
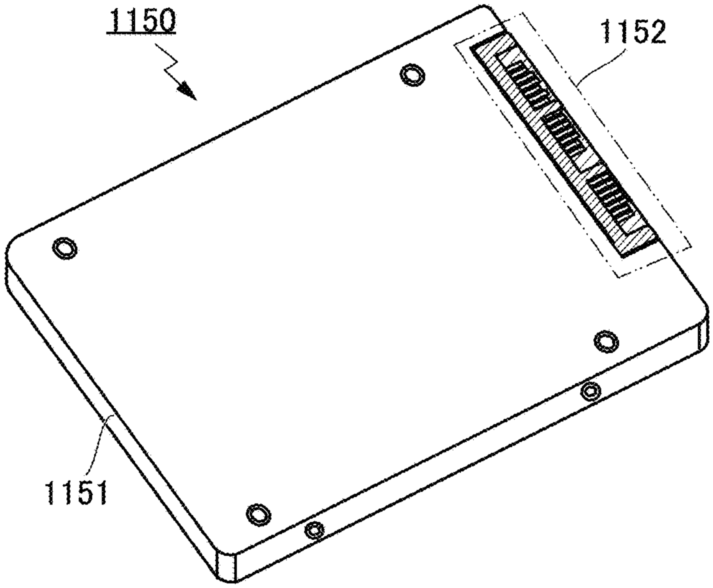
Figure 50E:
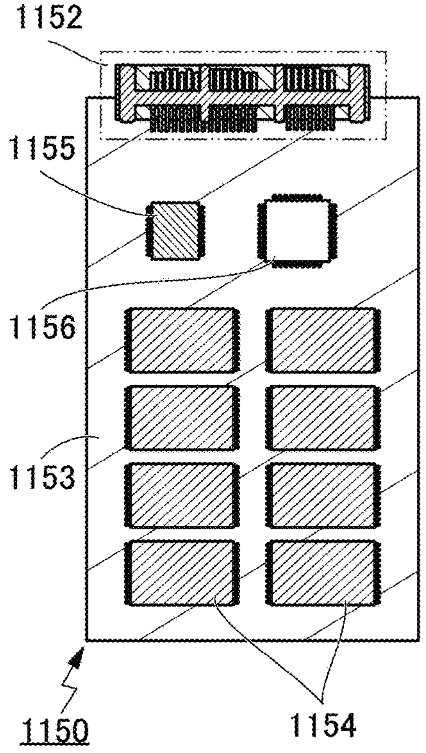

FIG. 50D is a schematic external diagram of an SSD, and FIG. 50E is a schematic diagram of the internal structure of the SSD. An SSD 1150 includes a housing 1151, a connector 1152, and a substrate 1153. The substrate 1153 is held in the housing 1151. The substrate 1153 is provided with a memory chip 1154, a memory chip 1155, and a controller chip 1156, for example. The memory chip 1155 is a work memory of the controller chip 1156, and a DOSRAM chip can be used, for example. When the memory chip 1154 is also provided on the back side of the substrate 1153, the capacity of the SSD 1150 can be increased. The memory device or the semiconductor device described in the above embodiment can be incorporated in the memory chip 1154 or the like.

This embodiment can be implemented in an appropriate combination with the structures described in the other embodiments and the like.

Embodiment 7

FIG. 51A to FIG. 51G illustrate specific examples of electronic devices each provided with the memory device or the semiconductor device of one embodiment of the present invention.

<Electronic Device and System>

The memory device or the semiconductor device of one embodiment of the present invention can be mounted on a variety of electronic devices. Examples of electronic devices include an information terminal, a computer, a smartphone, an e-book reader, a television device, digital signage, a large game machine such as a pachinko machine, a digital camera, a digital video camera, a digital photo frame, a mobile phone, a portable game machine, a video recording/reproducing device, a navigation system, and an audio reproducing device. Here, the computer refers not only to a tablet computer, a notebook computer, and a desktop computer, but also to a large computer such as a server system.

The electronic device of one embodiment of the present invention may include an antenna. When a signal is received by the antenna, a video, data, or the like can be displayed on a display portion. When the electronic device includes an antenna and a secondary battery, the antenna may be used for contactless power transmission.

The electronic device of one embodiment of the present invention may include a sensor (a sensor having a function of measuring force, displacement, position, speed, acceleration, angular velocity, rotational frequency, distance, light, liquid, magnetism, temperature, a chemical substance, sound, time, hardness, an electric field, current, voltage, power, radioactive rays, flow rate, humidity, a gradient, oscillation, odor, or infrared rays).

The electronic device of one embodiment of the present invention can have a variety of functions. For example, the electronic device can have a function of displaying a variety of data (e.g., a still image, a moving image, and a text image) on the display portion, a touch panel function, a function of displaying a calendar, date, time, and the like, a function of executing a variety of software (programs), a wireless communication function, and a function of reading out a program or data stored in a recording medium.

[Information Terminal]

With the memory device or the semiconductor device of one embodiment of the present invention, a memory device for storing a microcontroller program can be configured. Thus, according to one embodiment of the present invention, a microcontroller chip can be downsized.

Figure 51A:
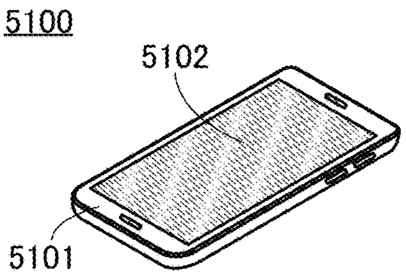
FIG. 51A to FIG. 51G illustrate examples of electronic devices.

FIG. 51A illustrates a mobile phone (smartphone), which is a type of information terminal. An information terminal 5100 includes a housing 5101 and a display portion 5102. As input interfaces, a touch panel is provided in the display portion 5102, and a button is provided in the housing 5101. The use of a downsized microcontroller of one embodiment of the present invention allows effective use of a limited space in the mobile phone. The memory device of one embodiment of the present invention may be used for storage of the mobile phone. This results in an increase in the storage capacity per unit area of the storage.

Figure 51B:
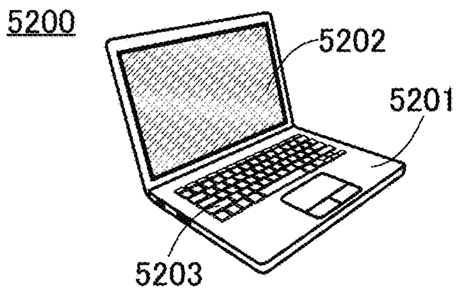

FIG. 51B illustrates a notebook information terminal 5200. The notebook information terminal 5200 includes a main body 5201 of the information terminal, a display portion 5202, and a keyboard 5203. The use of a downsized microcontroller of one embodiment of the present invention allows effective use of a limited space in the notebook information terminal. The memory device of one embodiment of the present invention may be used for storage of the notebook information terminal. This results in an increase in the storage capacity per unit area of the storage.

Note that although FIG. 51A and FIG. 51B illustrate a smartphone and a notebook information terminal, respectively, as examples of the electronic device in the above description, an information terminal other than a smartphone and a notebook information terminal can be used. Examples of information terminals other than a smartphone and a notebook information terminal include a PDA (Personal Digital Assistant), a desktop information terminal, and a workstation.

[Game Machines]

Figure 51C:
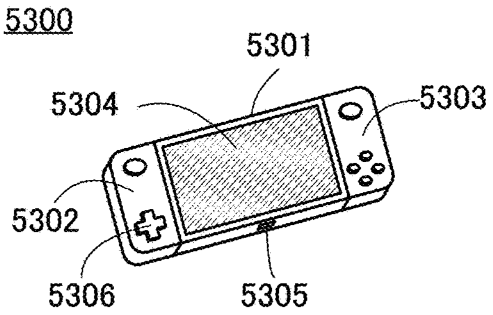

FIG. 51C illustrates a portable game machine 5300 as an example of a game machine. The portable game machine 5300 includes a housing 5301, a housing 5302, a housing 5303, a display portion 5304, a connection portion 5305, an operation key 5306, and the like. The housing 5302 and the housing 5303 can be detached from the housing 5301. When the connection portion 5305 provided in the housing 5301 is attached to another housing (not illustrated), an image to be output to the display portion 5304 can be output to another video device (not illustrated). In that case, the housing 5302 and the housing 5303 can each function as an operating unit. Thus, a plurality of players can play a game at the same time. The memory device, the semiconductor device, or the like of one embodiment of the present invention can be incorporated into a chip provided on a substrate in the housing 5301, the housing 5302 and the housing 5303, for example.

Figure 51D:
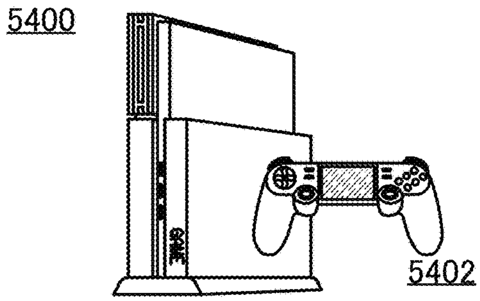

FIG. 51D illustrates a stationary game machine 5400 as an example of a game machine. A controller 5402 is connected to the stationary game machine 5400 through wired or wireless connection.

The use of a downsized microcontroller of one embodiment of the present invention for the game machine such as the portable game machine 5300 or the stationary game machine 5400 allows effective use of a limited space in the game machine. The memory device, the semiconductor device, or the like of one embodiment of the present invention may be used for storage of the portable game machine. This results in an increase in the storage capacity per unit area of the storage.

Although the portable game machine and the stationary game machine are illustrated as examples of game machines in FIG. 51C and FIG. 51D, the game machine using the microcontroller of one embodiment of the present invention is not limited thereto. Examples of game machines using the microcontroller of one embodiment of the present invention include an arcade game machine installed in entertainment facilities (a game center, an amusement park, or the like) and a throwing machine for batting practice installed in sports facilities.

[Large Computer]

The memory device, the semiconductor device, or the like of one embodiment of the present invention can be used in a large computer.

Figure 51E:
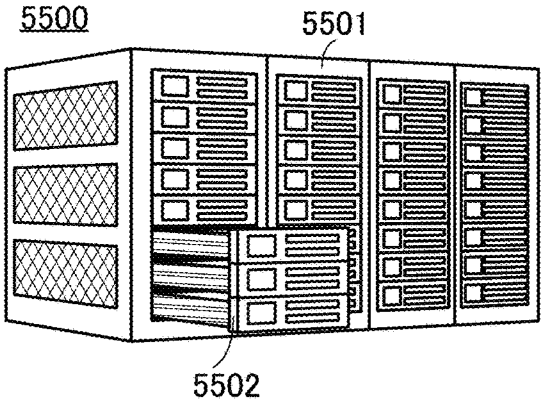
Figure 51F:
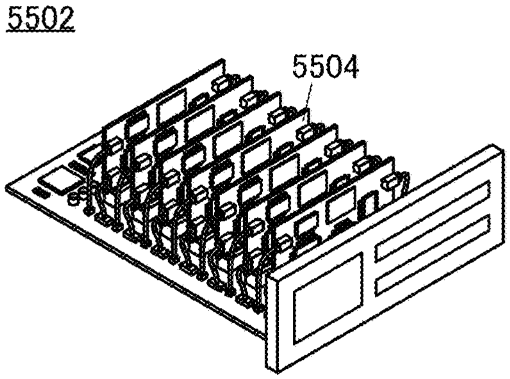

FIG. 51E illustrates a supercomputer 5500 as an example of a large computer. FIG. 51F illustrates a rack-mount computer 5502 included in the supercomputer 5500.

The supercomputer 5500 includes a rack 5501 and a plurality of rack-mount computers 5502. The plurality of computers 5502 are stored in the rack 5501. The computers 5502 are provided with a plurality of substrates 5504, and a microcontroller of one embodiment of the present invention can be mounted on the substrates. The use of a downsized microcontroller of one embodiment of the present invention allows effective use of a limited space in the large computer. The memory device, the semiconductor device, or the like of one embodiment of the present invention may be used for storage of the large computer. This results in an increase in the storage capacity per unit area of the storage.

Although the supercomputer is illustrated as an example of a large computer in FIG. 51E and FIG. 51F, a large computer using the microcontroller of one embodiment of the present invention is not limited thereto. Examples of a large computer using the microcontroller of one embodiment of the present invention include a computer that provides service (a server) and a large general-purpose computer (a mainframe).

[Household Appliance]

Figure 51G:
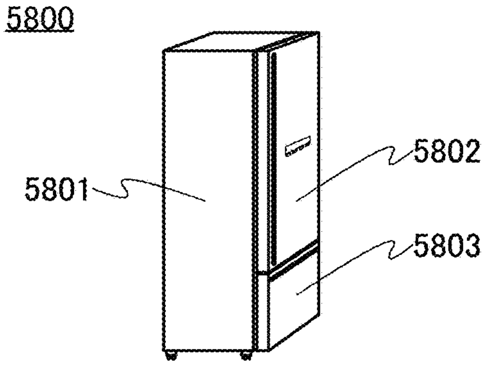

FIG. 51G illustrates an electric refrigerator-freezer 5800 as an example of a household appliance. The electric refrigerator-freezer 5800 includes a housing 5801, a refrigerator door 5802, a freezer door 5803, and the like.

The memory device, the semiconductor device, or the like of one embodiment of the present invention can also be used for the electric refrigerator-freezer 5800. For example, the use of a downsized microcontroller of one embodiment of the present invention for the electric refrigerator-freezer 5800 allows effective use of a limited space in the electric refrigerator-freezer.

Although the electric refrigerator-freezer is described as an example of a household appliance, other examples of a household appliance include a vacuum cleaner, a microwave oven, an electric oven, a rice cooker, a water heater, an IH cooker, a water server, a heating-cooling combination appliance such as an air conditioner, a washing machine, a drying machine, and an audio visual appliance.

The electronic devices, the functions of the electronic devices, their effects, and the like described in this embodiment can be combined as appropriate with the description of another electronic device.

This embodiment can be implemented in an appropriate combination with the structures described in the other embodiments and the like.

REFERENCE NUMERALS

100: memory device, 105: region, 110: memory cell array, 120: memory string, 121: substrate, 122: conductor, 123: insulator, 124: insulator, 125: semiconductor, 126: insulator, 127: semiconductor, 128: conductor, 129: insulator, 130: conductor, 131: insulator, 132: insulator, 133: insulator, 135: insulator, 136: conductor, 137: insulator, 138: insulator, 139: insulator, 140: mask, 141: opening, 150: insulator, 156: insulator, 161: conductor, 162: conductor, 163: conductor, 164: conductor, 165: conductor, 166: conductor, 171: conductor, 172: conductor, 173: conductor, 174: conductor, 175: conductor, 176: conductor, 181: insulator, 182: conductor, 183: conductor

The invention claimed is:

1. A method for manufacturing a memory device, comprising:

forming a first insulator over a substrate;

forming a first conductor over the first insulator;

forming a second insulator over the first conductor;

forming a third insulator over the second insulator;

forming a fourth insulator over the third insulator;

forming a first opening penetrating the first insulator, the first conductor, the second insulator, the third insulator, and the fourth insulator;

forming a second opening in the first conductor so as to extend the first opening in the first conductor;

forming, in the first opening and the second opening, a fifth insulator covering a side surface of the first insulator, a side surface of the first conductor, a side surface of the second insulator, a side surface of the third insulator, and a side surface of the fourth insulator;

forming a second conductor in contact with the fifth insulator so as to be embedded in the second opening;

processing the second conductor so as not to be positioned in the first opening;

forming a first oxide semiconductor including a projection portion in contact with the fifth insulator and the second conductor;

forming a sixth insulator in contact with the first oxide semiconductor;

forming a second oxide semiconductor in contact with the sixth insulator;

removing the third insulator; and forming a third conductor between the second insulator and the fourth insulator, wherein the first conductor comprises a region configured to function as a first electrode of a capacitor, wherein the second conductor comprises a first region configured to function as a gate electrode of a first transistor and a second region configured to function as a second electrode of the capacitor, wherein the third conductor comprises a region configured to function as a gate electrode of a second transistor, wherein the first oxide semiconductor comprises a region configured to function as a channel formation region of the second transistor, wherein the second oxide semiconductor comprises a region configured to function as a channel formation region of the first transistor, wherein the fifth insulator comprises a region configured to function as a gate insulator of the second transistor, wherein the sixth insulator comprises a region configured to function as a gate insulator of the first transistor, and wherein the fifth insulator is formed by performing, a plurality of times, a cycle comprising:

a first step of supplying a gas including silicon and an oxidizing gas into a chamber where the substrate is placed;

a second step of stopping the supply of the gas including silicon into the chamber; and a third step of generating plasma including the oxidizing gas in the chamber.

2. The method for manufacturing a memory device, according to claim 1, wherein the gas including silicon is $SiH_4$.

3. The method for manufacturing a memory device, according to claim 1, wherein the oxidizing gas is $N_2O$.

4. The method for manufacturing a memory device, according to claim 1, wherein He is supplied into the chamber in the first step.

5. The method for manufacturing a memory device, according to claim 1, wherein the first oxide semiconductor includes indium, an element M, and zinc, and wherein the element M is one or more selected from aluminum, gallium, yttrium, tin, and titanium.

6. The method for manufacturing a memory device, according to claim 1, wherein the first oxide semiconductor has crystallinity.

7. The method for manufacturing a memory device, according to claim 1, wherein the first oxide semiconductor includes a region where a c-axis is aligned with a direction normal to a side surface of the third conductor, in the first opening.

8. The method for manufacturing a memory device, according to claim 1, wherein the fifth insulator includes a region with a nitrogen concentration of higher than or equal to $3\times10^{19}$ atoms/cm$^3$ and lower than or equal to $1\times10^{21}$ atoms/cm$^3$.

9. The method for manufacturing a memory device, according to claim 1, wherein the fifth insulator includes a region with a carbon concentration of higher than or equal to $1\times10^{18}$ atoms/cm$^3$ and lower than or equal to $5\times10^{20}$ atoms/cm$^3$.

10. A method for manufacturing a memory device, comprising:

forming a first insulator over a substrate;

forming a first conductor over the first insulator;

forming a second insulator over the first conductor;

forming a third insulator over the second insulator;
forming a fourth insulator over the third insulator;
forming an opening penetrating the first insulator, the first conductor, the second insulator, the third insulator, and the fourth insulator;
forming a depressed portion of the first conductor so as to extend the opening in the first conductor;
forming, in the opening and the depressed portion of the first conductor, a fifth insulator covering a side surface of the first insulator, a side surface of the first conductor, a side surface of the second insulator, a side surface of the third insulator, and a side surface of the fourth insulator;
forming a second conductor between the first insulator and the second insulator so as not to be positioned in the opening;
forming a first oxide semiconductor including a projection portion in contact with the fifth insulator and the second conductor;
forming a sixth insulator in contact with the first oxide semiconductor;
forming a second oxide semiconductor in contact with the sixth insulator;
removing the third insulator; and
forming a third conductor between the second insulator and the fourth insulator,
wherein the first conductor comprises a region configured to function as a first electrode of a capacitor,
wherein the second conductor comprises a first region configured to function as a gate electrode of a first transistor and a second region configured to function as a second electrode of the capacitor,
wherein the third conductor comprises a region configured to function as a gate electrode of a second transistor,
wherein the first oxide semiconductor comprises a region configured to function as a channel formation region of the second transistor,
wherein the second oxide semiconductor comprises a region configured to function as a channel formation region of the first transistor,
wherein the fifth insulator comprises a region configured to function as a gate insulator of the second transistor,
wherein the sixth insulator comprises a region configured to function as a gate insulator of the first transistor, and
wherein the fifth insulator is formed by performing, a plurality of times, a cycle comprising:
a first step of supplying a gas including silicon and an oxidizing gas into a chamber where the substrate is placed;
a second step of stopping the supply of the gas including silicon into the chamber; and
a third step of generating plasma including the oxidizing gas in the chamber.

11. The method for manufacturing a memory device, according to claim 10, wherein the first oxide semiconductor has crystallinity.

12. The method for manufacturing a memory device, according to claim 10, wherein the first oxide semiconductor includes a region where a c-axis is aligned with a direction normal to a side surface of at least one of the first conductor and the third conductor, in the opening.

13. The method for manufacturing a memory device, according to claim 10, wherein the fifth insulator includes a region with a nitrogen concentration of higher than or equal to $3\times10^{19}$ atoms/cm$^3$ and lower than or equal to $1\times10^{21}$ atoms/cm$^3$.

14. The method for manufacturing a memory device, according to claim 10, wherein the fifth insulator includes a region with a carbon concentration of higher than or equal to $1\times10^{18}$ atoms/cm$^3$ and lower than or equal to $5\times10^{20}$ atoms/cm$^3$.

15. The method for manufacturing a memory device, according to claim 10, wherein the gas including silicon is $SiH_4$.

16. The method for manufacturing a memory device, according to claim 10, wherein the oxidizing gas is $N_2O$.

17. The method for manufacturing a memory device, according to claim 10, wherein He is supplied into the chamber in the first step.

18. The method for manufacturing a memory device, according to claim 10,
wherein the first oxide semiconductor includes indium, an element M, and zinc, and
wherein the element M is one or more selected from aluminum, gallium, yttrium, tin, and titanium.

19. A method for manufacturing a memory device, comprising:
forming a first insulator over a substrate;
forming a first conductor over the first insulator;
forming a second insulator over the first conductor;
forming a third insulator over the second insulator;
forming an opening penetrating the first insulator, the first conductor, the second insulator, and the third insulator;
forming a depressed portion of the first conductor so as to extend the opening in the first conductor;
forming, in the opening and the depressed portion of the first conductor, a fourth insulator covering a side surface of the first insulator, a side surface of the first conductor, a side surface of the second insulator, and a side surface of the third insulator;
forming a second conductor between the first insulator and the second insulator so as not to be positioned in the opening;
forming a first oxide semiconductor including a projection portion in contact with the fourth insulator and the second conductor;
forming a fifth insulator in contact with the first oxide semiconductor;
forming a second oxide semiconductor in contact with the fifth insulator; and
forming a third conductor between the second insulator and the third insulator,
wherein the first conductor comprises a region configured to function as a first electrode of a capacitor,
wherein the second conductor comprises a first region configured to function as a gate electrode of a first transistor and a second region configured to function as a second electrode of the capacitor,
wherein the third conductor comprises a region configured to function as a gate electrode of a second transistor,
wherein the first oxide semiconductor comprises a region configured to function as a channel formation region of the second transistor,
wherein the second oxide semiconductor comprises a region configured to function as a channel formation region of the first transistor,
wherein the fourth insulator comprises a region configured to function as a gate insulator of the second transistor,
wherein the fifth insulator comprises a region configured to function as a gate insulator of the first transistor, and wherein the formation of the fourth insulator comprises:

a first step of supplying a gas including silicon and an oxidizing gas into a chamber where the substrate is placed;

a second step of stopping the supply of the gas including silicon into the chamber; and a third step of generating plasma including the oxidizing gas in the chamber.

* * * * *